US009252793B2

United States Patent
Tsutsumi et al.

(10) Patent No.: US 9,252,793 B2
(45) Date of Patent: Feb. 2, 2016

(54) SEMICONDUCTOR DEVICE

(75) Inventors: Toshiaki Tsutsumi, Kanagawa (JP);
Yoshihiro Funato, Kanagawa (JP);
Tomonori Okudaira, Kanagawa (JP);
Tadato Yamagata, Kanagawa (JP);
Akihisa Uchida, Kanagawa (JP);
Takeshi Terasaki, Hitachinaka (JP);
Tomohisa Suzuki, Kasama (JP);
Yoshiharu Kanegae, Hitachinaka (JP)

(73) Assignee: Renesas Electronics Corporation, Tokyo (JP)

( * ) Notice: Subject to any disclaimer, the term of this patent is extended or adjusted under 35 U.S.C. 154(b) by 137 days.

(21) Appl. No.: 13/990,030

(22) PCT Filed: Nov. 29, 2010

(86) PCT No.: PCT/JP2010/071264
§ 371 (c)(1),
(2), (4) Date: Aug. 13, 2013

(87) PCT Pub. No.: WO2012/073307
PCT Pub. Date: Jun. 7, 2012

(65) Prior Publication Data
US 2013/0314165 A1    Nov. 28, 2013

(51) Int. Cl.
*H03L 7/24* (2006.01)
*H01L 23/522* (2006.01)
(Continued)

(52) U.S. Cl.
CPC .............. *H03L 7/24* (2013.01); *H01L 23/5228* (2013.01); *H01L 27/0629* (2013.01);
(Continued)

(58) Field of Classification Search
CPC .... H03L 7/24; H01L 28/5228; H01L 27/0629
USPC .............................. 331/34; 327/101, 102, 113
See application file for complete search history.

(56) References Cited

U.S. PATENT DOCUMENTS

| 4,423,434 A | 12/1983 | Komatsu |
| 5,994,758 A | 11/1999 | Hayashi |

(Continued)

FOREIGN PATENT DOCUMENTS

| JP | 54-34787 | 3/1979 |
| JP | 56-88350 A | 7/1981 |

(Continued)

OTHER PUBLICATIONS

Office Action in Japanese Patent Application No. 2012-546590, Aug. 27, 2013.

(Continued)

*Primary Examiner* — Jeffrey Shin
(74) *Attorney, Agent, or Firm* — Miles & Stockbridge P.C.

(57) ABSTRACT

A semiconductor device is formed by sealing, with a resin, a semiconductor chip (CP1) having an oscillation circuit utilizing a reference resistor. The oscillation circuit generates a reference current by utilizing the reference resistor, a voltage is generated in accordance with this reference current and an oscillation frequency of the oscillation unit, and the oscillation unit oscillates at a frequency in accordance with the generated voltage. The reference resistor is formed of a plurality of resistors, which extend in a first (Y) direction orthogonal to a first side, inside a first region (RG1, RG2, RG3, and RG4) surrounded by the first side (S1, S2, S3, and S4) of a main surface of the semiconductor chip (CP1), a first line (42, 43, 44, and 45) connecting between one end of the first side and the center (CT1) of the main surface of the semiconductor chip, and a second line (42, 43, 44, and 45) connecting between the other end of the first side and the center of the main surface of the semiconductor chip.

16 Claims, 40 Drawing Sheets

(51) Int. Cl.
  *H01L 27/06* (2006.01)
  *H01L 23/31* (2006.01)
  *H01L 23/00* (2006.01)

(52) U.S. Cl.
  CPC ............ *H01L 23/3107* (2013.01); *H01L 24/05* (2013.01); *H01L 24/32* (2013.01); *H01L 24/45* (2013.01); *H01L 24/48* (2013.01); *H01L 24/49* (2013.01); *H01L 2224/05554* (2013.01); *H01L 2224/32245* (2013.01); *H01L 2224/45144* (2013.01); *H01L 2224/45147* (2013.01); *H01L 2224/48247* (2013.01); *H01L 2224/49171* (2013.01); *H01L 2224/73265* (2013.01); *H01L 2924/01015* (2013.01); *H01L 2924/07802* (2013.01)

(56) References Cited

U.S. PATENT DOCUMENTS

| | | | |
|---|---|---|---|
| 6,725,436 B2 * | 4/2004 | Koike et al. | 338/308 |
| 7,053,751 B2 * | 5/2006 | Itoh | 338/333 |
| 7,332,944 B2 * | 2/2008 | Fujita et al. | 327/113 |
| 7,449,783 B2 * | 11/2008 | Beach et al. | 257/774 |
| 2002/0066912 A1 | 6/2002 | Tsuchiya | |

FOREIGN PATENT DOCUMENTS

| | | |
|---|---|---|
| JP | 57-139955 A | 8/1982 |
| JP | 60-79766 A | 5/1985 |
| JP | S62-032637 | 2/1987 |
| JP | S63-067765 | 3/1988 |
| JP | 5-145412 A | 6/1993 |
| JP | 6-97368 A | 4/1994 |
| JP | H10-189875 | 7/1998 |
| JP | H11-017113 | 1/1999 |
| JP | 2002-083932 | 3/2002 |
| JP | 2007-13119 A | 1/2007 |
| JP | 2010-10168 A | 1/2010 |

OTHER PUBLICATIONS

English translation of Office Action issued Dec. 17, 2013, in Japanese Application No. 2012-546590.
English translation of Office Action issued Feb. 24, 2015, in Japanese Application No. 2014-053554.

* cited by examiner

FIG. 36

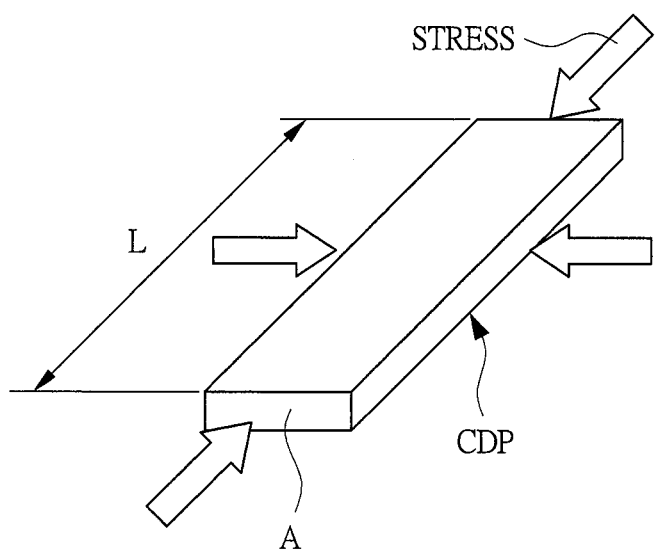

$$\underbrace{\frac{\Delta R}{R}}_{\substack{\text{RESISTANCE}\\\text{VARIATION}}} = \underbrace{\frac{\Delta L}{L}}_{\substack{\text{CONDUCTOR-}\\\text{LENGTH}\\\text{VARIATION}}} - \underbrace{\frac{\Delta A}{A}}_{\substack{\text{CROSS-}\\\text{SECTIONAL}\\\text{AREA}\\\text{VARIATION}}} + \underbrace{\frac{\Delta \rho}{\rho}}_{\substack{\text{RESISTIVITY}\\\text{VARIATION}}} \cdots (\text{EXPRESSION 1})$$

R : RESISTANCE VALUE
L : CONDUCTOR LENGTH
A : CONDUCTOR CROSS-SECTIONAL AREA
$\rho$ : RESISTIVITY

SEMICONDUCTOR DEVICE

CROSS-REFERENCE TO RELATED APPLICATIONS

The present application is a U.S. national stage entry of International Application No. PCT/JP2010/071264, filed Nov. 29, 2010.

TECHNICAL FIELD

The present invention relates to a semiconductor device, and, more particularly, the present invention relates to a semiconductor device having an oscillation circuit.

BACKGROUND ART

In various semiconductor devices, an oscillation circuit is used in some cases.

Japanese Patent Application Laid-Open Publication No. 2007-13119 (Patent Document 1) and Japanese Patent Application Laid-Open Publication No. 2010-10168 (Patent Document 2) describe techniques relating to a semiconductor device having an oscillation circuit.

PRIOR ART DOCUMENTS

Patent Documents

Patent Document 1: Japanese Patent Application Laid-Open Publication No. 2007-13119
Patent Document 2: Japanese Patent Application Laid-Open Publication No. 2010-10168

DISCLOSURE OF THE INVENTION

Problems to be Solved by the Invention

In order to downsize a whole semiconductor device system which requires an oscillation circuit, it is effective to embed the oscillation circuit inside a semiconductor chip. Also, inside a semiconductor chip in which other various circuits than an oscillation circuit are embedded, by embedding the oscillation circuit therein as well, the semiconductor device system can be further downsized.

However, according to studies of the present inventors, the following has been found out.

The present inventors have studied about an oscillation circuit utilizing a reference resistor in order to improve a performance of the oscillation circuit. More specifically, the inventors have studied about an oscillation circuit configured so as to generate a reference current by utilizing the reference resistor, generate a voltage in accordance with this reference current and an oscillation frequency of an oscillation unit, and oscillate the oscillation unit at a frequency in accordance with the generated voltage. By configuring such an oscillation circuit so as to generate the voltage in accordance with the reference current and the oscillation frequency, input the generated voltage into the oscillation unit, and oscillate the oscillation unit at a frequency in accordance with that, the oscillation frequency can be stabilized. However, if a resistance value of the reference resistor is varied due to any factors, the oscillation frequency is varied, and therefore, it is desired to eliminate the variation factors of the resistance value of the reference resistor as much as possible.

Accordingly, the present inventors have studied about the variation factors of the resistance value of the reference resistor, and have newly found out as follows.

The semiconductor chip in which the oscillation circuit is embedded is sealed with a resin material to be packaged. Due to the resin sealing of the semiconductor chip, stress is adversely caused in the semiconductor chip, and therefore, the resistance value of the reference resistor embedded in the semiconductor chip is varied by the stress. Even if the variation in the resistance value due to the stress caused by the resin sealing is variation at a level that does not cause problems in a general resistor element, the variation is adversely the variation factor of the oscillation frequency in the reference resistor of the oscillation circuit as described above. That is, when the resistance value of the reference resistor embedded in the semiconductor chip is varied by the stress caused by the resin sealing of the semiconductor chip, variation of the oscillation frequency of the oscillation circuit is caused, and this leads to reduction of the performance of the semiconductor device provided with the oscillation circuit.

A preferred aim of the present invention is to provide a technique capable of improving a performance of a semiconductor device.

The above and other preferred aims and novel characteristics of the present invention will be apparent from the description of the present specification and the accompanying drawings.

Means for Solving the Problems

The typical ones of the inventions disclosed in the present application will be briefly described as follows.

A semiconductor device according to a typical embodiment is a semiconductor device provided with a semiconductor chip sealed with a resin, and the semiconductor chip has an oscillation circuit. The oscillation circuit has: a voltage-current converting unit which converts a voltage into a current by utilizing a reference resistor; a voltage generating unit which generates a voltage in accordance with an input current from the voltage-current converting unit and an oscillation frequency of an oscillation unit; and the oscillation unit which oscillates at a frequency in accordance with an input voltage from the voltage generating unit. In the voltage-current converting unit, a reference current is generated by applying a reference voltage to the reference resistor, and a current in accordance with the reference current is inputted to the voltage generating unit as the input current. And, in a main surface of the semiconductor chip, the reference resistor is formed of a plurality of resistors inside a first region surrounded by a first side of the main surface of the semiconductor chip, a first line connecting between one end of the first side and a center of the main surface of the semiconductor chip, and a second line connecting between the other end of the first side and the center of the main surface of the semiconductor chip, the plurality of resistors extending in a first direction orthogonal to the first side.

Effects of the Invention

The effects obtained by typical means of the present invention disclosed in the present application will be briefly described below.

According to a typical embodiment, a performance of a semiconductor device can be improved.

BRIEF DESCRIPTIONS OF THE DRAWINGS

FIG. 36 is an explanatory diagram of change of a resistance value of a conductor pattern by a stress;

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, numerical values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that members having the same function are denoted by the same reference symbols throughout all drawings for describing the embodiments, and the repetitive description thereof will be omitted. In addition, the description of the same or similar portions is not repeated in principle unless particularly required in the following embodiments.

Further, in some drawings used in the embodiments, hatching is omitted in some cases even in a cross-sectional view so as to make the drawings easy to see. Still further, hatching is used in some cases even in a plan view so as to make the drawings easy to see.

First Embodiment

Circuit Configuration of Semiconductor Device

Figure 1:
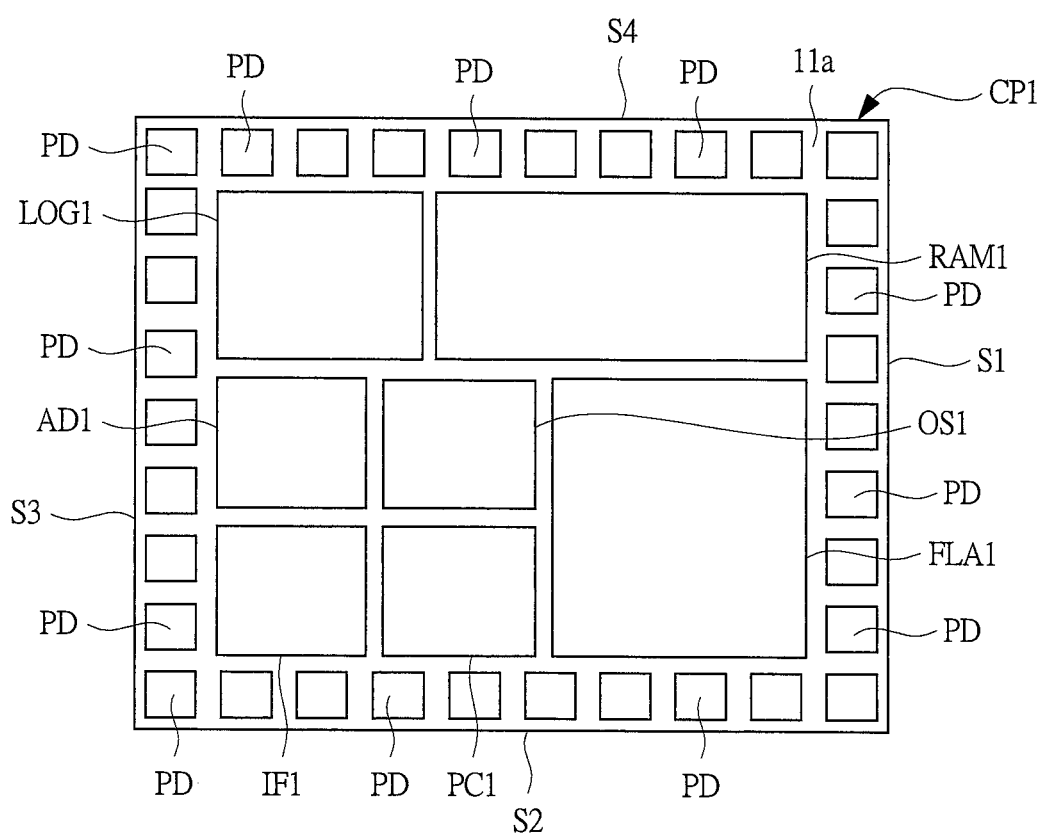
FIG. 1 is a plan layout view of a semiconductor chip configuring a semiconductor device of an embodiment of the present invention.

FIG. 1 is a plan layout view of a semiconductor chip (semiconductor device) CP1 which configures a semiconductor device of an embodiment of the present invention, and illustrates an example of a layout of circuit blocks or others formed on the semiconductor chip CP1.

The semiconductor chip CP1, which configures the semiconductor device of the present embodiment, is a semiconductor chip in which an oscillation circuit is formed (embedded). Moreover, other circuits than the oscillation circuit are also formed (embedded) in the semiconductor chip CP1.

As specifically explained, the semiconductor chip CP1 has a rectangular planar shape, and has an oscillation circuit region OS1 in which the oscillation circuit (corresponding to an oscillation circuit OS described later) is formed as illustrated in FIG. 1. Further, the semiconductor chip CP1 has a region in which a circuit other than the oscillation circuit is formed. For example, the semiconductor chip CP1 has: a RAM region RAM1 in which a RAM (Random Access Memory) is formed; a logic circuit region LOG1 in which a logic circuit is formed; and a flash memory region FLA1 in which a flash memory (non-volatile memory) is formed. Further, the semiconductor chip CP1 has: an AD/DA region AD1 in which an AD/DA converter (alternate current-direct current/direct current-alternate current converter) is formed; an I/F circuit region IF1 in which an I/F circuit is formed; and a power-supply circuit region PC1 in which a power-supply circuit is formed. Moreover, in a peripheral portion (outer peripheral portion) of a surface of the semiconductor device CP1, a plurality of pad electrodes PD are formed (arranged, aligned) along four sides (sides S1, S2, S3, and S4) of the surface of the semiconductor device CP1. The pad electrodes PD are electrically connected to (respective circuits of) the oscillation circuit region OS1, the RAM region RAM1, the logic circuit region LOG1, the flash memory region FLA1, the AD/DA region AD1, the I/F circuit region IF1, the power-supply circuit region PC1, and others via internal wiring layers of the semiconductor device CP1.

The semiconductor chip CP1 of the present embodiment is a semiconductor chip having an oscillation circuit, and it is essential to have the oscillation circuit. However, the other circuit than the oscillation circuit can be changed if needed.

<Configuration of Oscillation Circuit>

Figure 2:
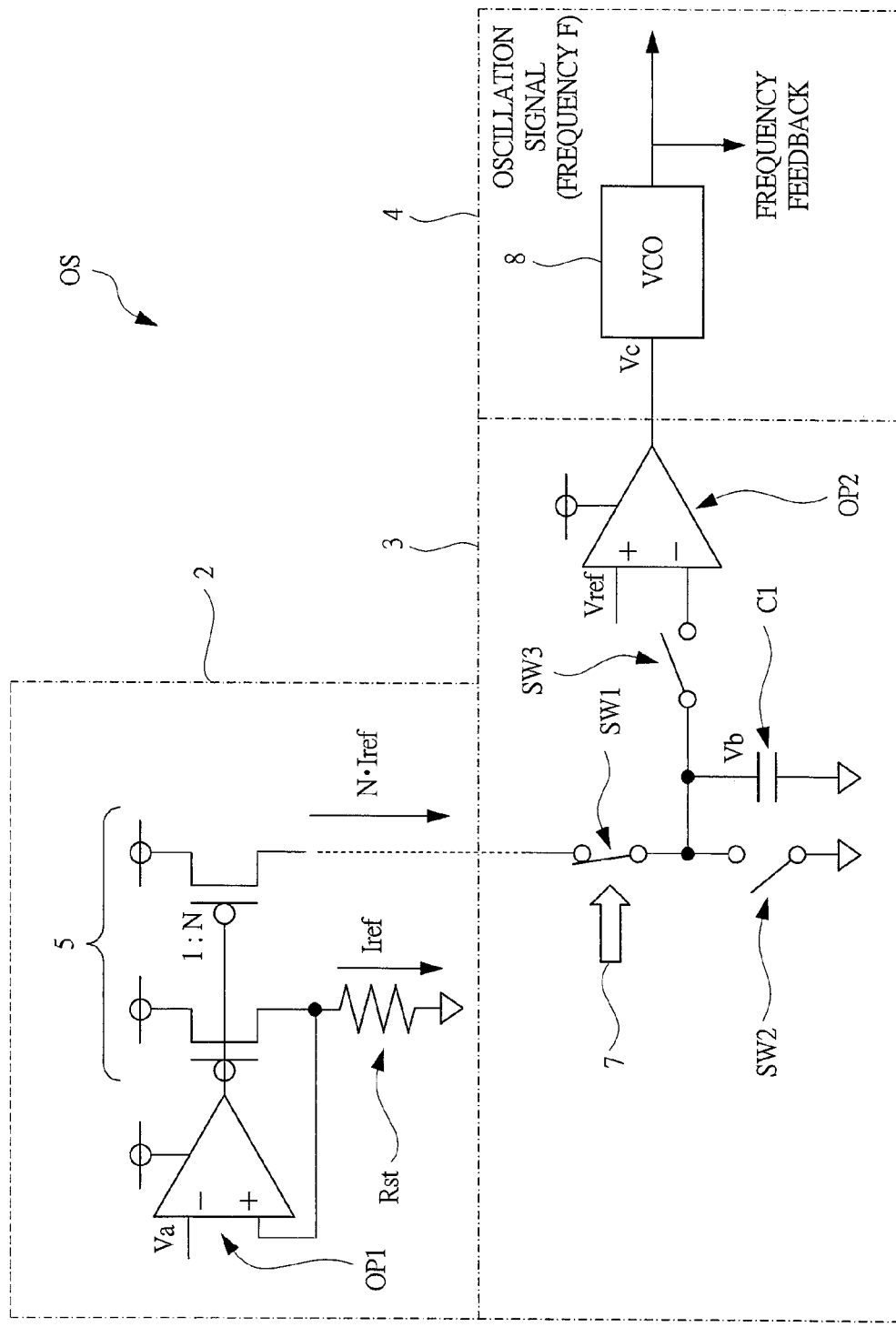
FIG. 2 is a circuit diagram illustrating an oscillation circuit included in the semiconductor chip of the embodiment of the present invention.
Figure 3:
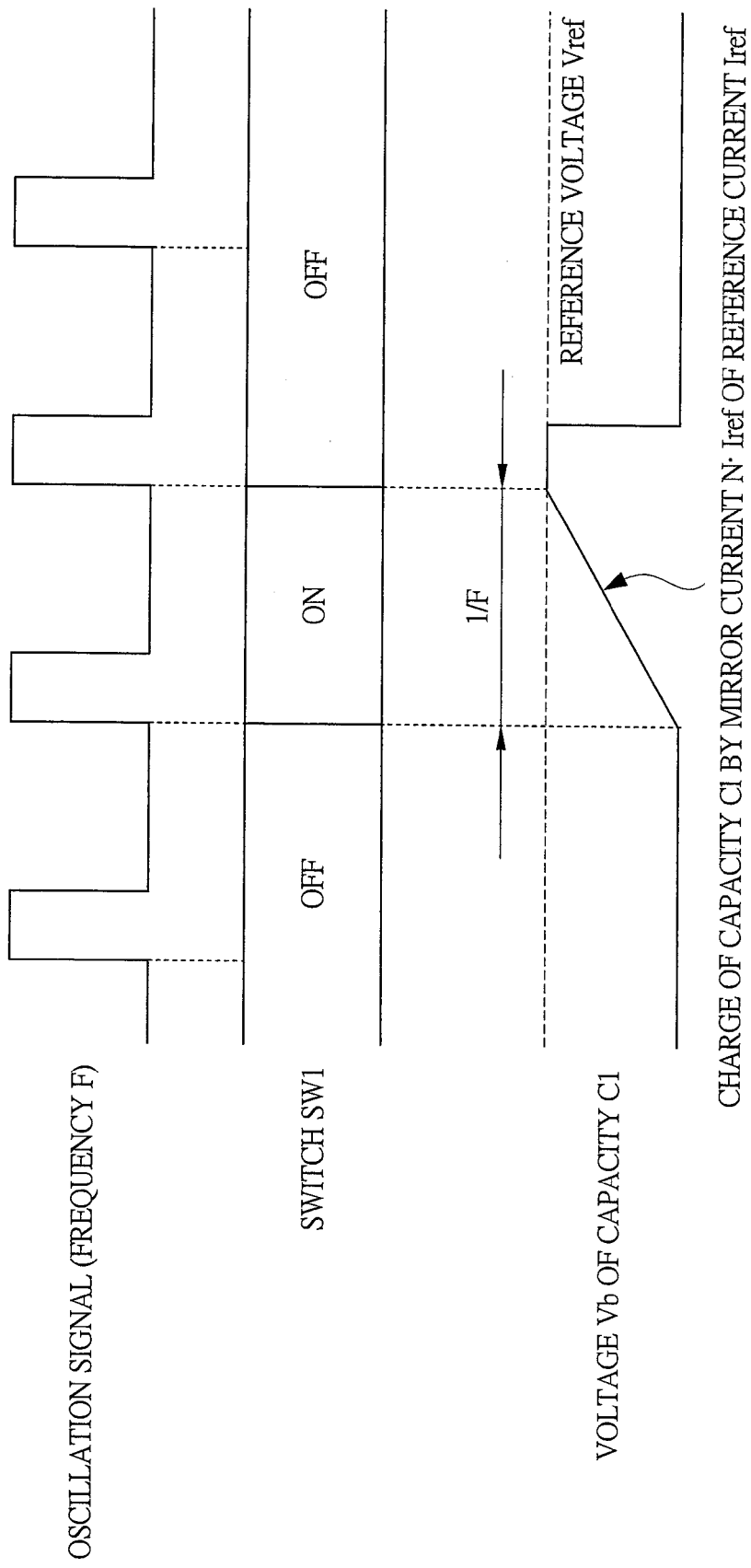
FIG. 3 is an explanatory diagram schematically illustrating a relation among an oscillation of an oscillation unit in an oscillation circuit, ON/OFF switching of a switch, and a voltage of a capacitor.

FIG. 2 is a circuit diagram illustrating the oscillation circuit OS included in the semiconductor chip CP1 of the present embodiment. FIG. 3 is an explanatory diagram schematically illustrating a relation among an oscillation signal (frequency F) of an oscillation unit 4, ON/OFF switching of a switch SW1, and a voltage (charge voltage) Vb of a capacitor C1.

The oscillation circuit OS illustrated in FIG. 2 has a voltage-current converting unit 2, a voltage generating unit 3, and an oscillation unit 4. This oscillation circuit OS is formed (embedded) inside the above-described semiconductor chip CP1.

The voltage-current converting unit (voltage-current converting circuit unit) 2 is a circuit (circuit unit) which converts a voltage (input voltage, reference voltage) into a current (output current, reference current) by utilizing a reference resistor Rst. More specifically, when a reference voltage Va is inputted to an operational amplifier OP1 of the voltage-current converting unit 2, the reference voltage Va is applied to the reference resistor Rst so as to generate a reference current Iref (here, a relation of "Iref=Va/R1" is established, and note that R1 is a resistance value of the reference resistor Rst), and the reference current Iref is amplified to N times the current by a current mirror circuit 5 configured of a plurality of transistors so as to become a current (mirror current) N·Iref, and is outputted from the voltage-current converting unit 2. Here, the current N·Iref corresponds to the current as much as N times the reference current Iref. Also, the reference resistor Rst can be regarded as a resistor which converts the voltage (the reference voltage Va here) into the current (the reference current Iref here) in the voltage-current converting unit 2.

The voltage generating unit 3 is a circuit (circuit unit) which generates a voltage in accordance with an input current (the current N·Iref here) from the voltage-current converting unit 2 and an oscillation frequency of the oscillation unit 4. More specifically, the current N·Iref outputted from the voltage-current converting unit 2 is inputted to the switch SW1 of the voltage generating unit 3. The switch SW1 is connected to the capacitor C1, a switch SW2, and a switch SW3. By a switch control signal 7 for controlling the switch SW1, the switch SW1 is turned ON (is conducted) during only 1/F period of time in accordance with the oscillation frequency F of the oscillation unit 4. The capacitor C1 has been discharged (a charge voltage of the capacitor C1 in the discharged state is 0 V) by turning ON the switch SW2 immediately before turning ON the switch SW1, and then, the switch SW1 is turned ON in a state that the switch SW2 is OFF, so that the charge of the capacitor C1 is started by the current N·Iref which flows into the capacitor C1 via the switch SW1. That is, when the switch SW1 is turned ON during the 1/F period of time, the capacitor C1 is charged by the inputted current N·Iref. In the charging by the current N·Iref during only the 1/F period of time, the voltage (charge voltage) of the capacitor C1 becomes a voltage (charge voltage) Vb. After the charging of the capacitor C1 by the current N·Iref during only the 1/F period of time, the switch SW1 is turned OFF, and then, the switch SW3 is turned ON at this time. By the tuning ON of the switch SW3, the voltage (charge voltage) Vb of the capacitor C1 is inputted to an operational amplifier OP2. A reference voltage Vref is also inputted to the operational amplifier OP2, and a voltage Vc obtained by amplifying a voltage difference (differential) between the inputted voltage Vb and the reference voltage Vref is outputted.

The oscillation unit 4 is an oscillation unit (oscillation circuit unit) which oscillates at a frequency in accordance with an input voltage (a voltage Vc here) from the voltage generating unit 3. More specifically, the voltage Vc outputted from (the operational amplifier OP2 of) the voltage generating unit 3 is inputted to a VCO (Voltage controlled Oscillator) 8, and the VCO 8 outputs (that is, oscillates) an oscillation signal at a frequency (oscillation frequency) F in accordance with the input voltage (the voltage Vc here). The VCO 8 is an oscillator which controls the oscillation frequency by the voltage, and the frequency F of the oscillation signal outputted by the VCO is also changed in accordance with change of the voltage Vc inputted to the VCO.

The oscillation unit 4 outputs the oscillation signal (an oscillation signal with the frequency F), and besides, outputs a frequency feedback signal. The frequency feedback signal is converted into the switch control signal 7 via a control circuit (not illustrated), and this switch control signal 7 controls the switch SW1 of the voltage generating unit 3. More specifically, when the oscillation frequency of the oscillation unit 4 (the frequency of the oscillation signal outputted by the oscillation unit 4) is F, the switch SW1 is controlled so that the period of time during the turning ON of the switch SW1 is 1/F.

In a stable state that the frequency F (of the VCO 8) of the oscillation unit 4 is stable, the period of time during the turning ON of the switch SW1 of the voltage generating unit 3 is 1/F, and therefore, the capacitor C1 is charged by the current N·Iref during only the period of time 1/F so that the voltage (charge voltage) of the capacitor C1 becomes the voltage Vb, and this voltage Vb is inputted to the operational amplifier OP2 of the voltage generating unit 3. The operational amplifier OP2 outputs the voltage Vc when the input voltage outputted to the operational amplifier OP2 is the voltage Vb, and the oscillation unit 4 receives the input voltage Vc outputted from the operational amplifier OP2 and outputs the oscillation signal with the frequency F. Therefore, in the stable state that the oscillation frequency F of (the VCO 8 of) the oscillation unit 4 is stable, (the VCO 8 of) the oscillation unit 4 is always controlled by the voltage Vc, and therefore, (the VCO 8) of the oscillation unit 4 can stably output the oscillation signal with the frequency F.

However, the oscillation frequency (of the VCO 8) of the oscillation unit 4 is varied due to any factor in some cases. That is, the oscillation frequency (of the VCO 8) of the oscillation unit 4 is increased to be larger or decreased to be smaller than the frequency F due to any factor in some cases.

It is assumed that the oscillation frequency of (the VCO 8) of the oscillation unit 4 is increased to be larger than the frequency F and to become F+ΔF (it is set here that the increase from the frequency F is ΔF). At this time, the frequency feedback signal outputted from the oscillation unit 4 is also changed, and the switch control signal 7 which controls the switch SW1 is also changed in accordance with the change, and therefore, the period of time during the turning ON of the switch SW1 of the voltage generating unit 3 by the switch control signal is expressed as 1/(F+ΔF), and the period of time is shorter than 1/F. Therefore, the capacitor C1 is charged by the current N·Iref during only the period of time of 1/(F+ΔF) shorter than 1/F, and therefore, the voltage (charge voltage) of the capacitor C1 becomes a voltage expressed as Vb−ΔVb smaller than the voltage Vb (it is set here that the decrease from the voltage Vb is −ΔVb). Therefore, when the switch SW3 is turned ON, the voltage (charge voltage) Vb−ΔVb of the capacitor C1 is inputted to the operational amplifier OP2, and the operational amplifier OP2 outputs a voltage expressed as Vc−ΔVc smaller than the voltage Vc (it is set here that the decrease from the voltage Vc is −ΔVc) in accordance with the fact that the input voltage is Vb−ΔVb smaller than Vb. Therefore, the voltage Vc−ΔVc smaller than the voltage Vc is inputted to (the VCO 8) of the oscillation unit 4, and therefore, the oscillation frequency (of the VCO 8) of the oscillation unit 4 is decreased. In this manner, the oscillation frequency (of the VCO 8) of the oscillation unit 4 is decreased from F+ΔF and returns to the frequency F.

Also, it is assumed that the oscillation frequency (of the VCO 8) of the oscillation unit 4 is decreased from the frequency F and becomes F−ΔF (it is set here that the decrease from the frequency F is −ΔF). At this time, the frequency feedback signal outputted from the oscillation unit 4 is also changed, and the switch control signal 7 which controls the switch SW1 is also changed in accordance with the change, and therefore, the period of time during the turning ON of the switch SW1 of the voltage generating unit 3 by the switch control signal is expressed as 1/(F−ΔF), and the period of time is longer than 1/F. Therefore, the capacitor C1 is charged by the current N·Iref during only the period of time 1/(F−ΔF) longer than 1/F, and therefore, the voltage (charge voltage) of the capacitor C1 becomes a voltage expressed as Vb+ΔVb larger than the voltage Vb (it is set here that the increase from the voltage Vb is ΔVb). Therefore, when the switch SW3 is turned ON, the voltage (charge voltage) Vb+ΔVb of the capacitor C1 is inputted to the operational amplifier OP2, and the operational amplifier OP2 outputs a voltage expressed as Vc+ΔVc larger than the voltage Vc (it is set here that the increase from the voltage Vc is ΔVc) in accordance with the fact that the input voltage is Vb+ΔVb larger than Vb. Therefore, the voltage Vc+ΔVc larger than the voltage Vc is inputted to (the VCO 8) of the oscillation unit 4, and therefore, the oscillation frequency (of the VCO 8) of the oscillation unit 4 is increased. In this manner, the oscillation frequency (of the VCO 8) of the oscillation unit 4 is increased from F−ΔF and returns to the frequency F.

If the oscillation frequency of the VCO 8 is always stable, always the same frequency may be oscillated by inputting a reference voltage (constant voltage) to the VCO 8. However, practically, there is a risk that the oscillation frequency of the VCO 8 is varied due to various factors. Therefore, in the present embodiment, a voltage is generated in the voltage generating unit 3 in accordance with the input current from the voltage-current converting unit 2 and the oscillation frequency of the oscillation unit 4, the generated voltage is inputted to the oscillation unit (oscillation circuit unit) 4, and the oscillation unit 4 oscillates at a frequency in accordance with the input. The voltage generated in the voltage generating unit 3 is controlled in accordance with the oscillation frequency of the oscillation unit 4, and the oscillation frequency of the oscillation unit 4 is controlled in accordance with the voltage generated in the voltage generating unit 3. Therefore, even when the oscillation frequency of the oscillation unit 4 is varied, the oscillation frequency of the oscillation unit 4 can be controlled by feeding back the variation, and therefore, the variation in the oscillation frequency of the oscillation unit 4 can be suppressed, so that the oscillation unit 4 can oscillate at a stable frequency. That is, the oscillation frequency F (of the VCO 8) of the oscillation unit 4 can be stabilized.

However, in the voltage-current converting unit (voltage-current converting circuit unit) 2, the reference current Iref is generated by applying the reference voltage Va to the reference resistor Rst, and the current (the current N·Iref here) in accordance with the reference current Iref is outputted from the voltage-current converting unit 2 and inputted to the voltage generating unit 3. In the voltage generating unit 3, the voltage is generated in accordance with the input current (the current N·Iref here) from the voltage-current converting unit 2 and the oscillation frequency of the oscillation unit 4. Therefore, if the resistance value of the reference resistor Rst in the voltage-current converting unit 2 is varied, the reference current Iref generated in the voltage-current converting unit 2 is varied, and the current (the current N·Iref here) outputted from the voltage-current converting unit 2 and inputted to the voltage generating unit 3 is also varied, and therefore, the voltage (the voltage Vc here) generated in the voltage generating unit 3 is also varied, and, eventually, the oscillation frequency of the oscillation unit 4 is adversely varied. That is, if the resistance value of the reference resistor Rst in the voltage-current converting unit 2 is varied, the variation causes the variation in the oscillation frequency of the oscillation unit 4. For example, if the resistance value of the reference resistor Rst is increased due to any factor, the reference current Iref is decreased, and therefore, the current (the current N·Iref here) outputted from the voltage-current converting unit 2 and inputted to the voltage generating unit 3 is also decreased, and the voltage (charge voltage) Vb of the capacitor C1 is also decreased, and therefore, the oscillation frequency of the oscillation unit 4 is decreased. Also, for example, if the resistance value of the reference resistor Rst is decreased due to any factor, the reference current Iref is increased, and therefore, the current (the current N·Iref here) outputted from the voltage-current converting unit 2 and inputted to the voltage generating unit 3 is also increased, and the voltage (charge voltage) Vb of the capacitor C1 is also increased, and therefore, the oscillation frequency of the oscillation unit 4 is increased.

Therefore, the oscillation frequency F is adversely varied by the variation in the resistance value of the reference resistor Rst due to any factor even if it is tried to stabilize the oscillation frequency F by generating the voltage (the voltage Vc here) in the voltage generating unit 3 in accordance with the input current from the voltage-current converting unit 2 and the oscillation frequency of the oscillation unit 4, inputting the generated voltage to the oscillation unit (oscillation circuit unit), and oscillating the oscillation unit 4 at the frequency in accordance with the input. Therefore, it is important to eliminate the variation factors of the resistance value of the reference resistor Rst as much as possible. Accordingly, various developments are made for the reference resistor Rst formed in the semiconductor chip CP1 in the present embodiment, and they will be described later in detail.

<About Overall Structure of Semiconductor Device>

Next, an overall configuration of a semiconductor device PKG of the present embodiment is explained. The semiconductor device PKG of the present embodiment is a semiconductor device (semiconductor package) provided with the semiconductor chip CP1 sealed with a resin. That is, the semiconductor device PKG of the present embodiment is a resin-sealed-type semiconductor device (semiconductor package) in which the above-described semiconductor chip CP1 is sealed with a resin. Hereinafter, a specific configuration of the semiconductor device PKG will be explained.

Figure 4:
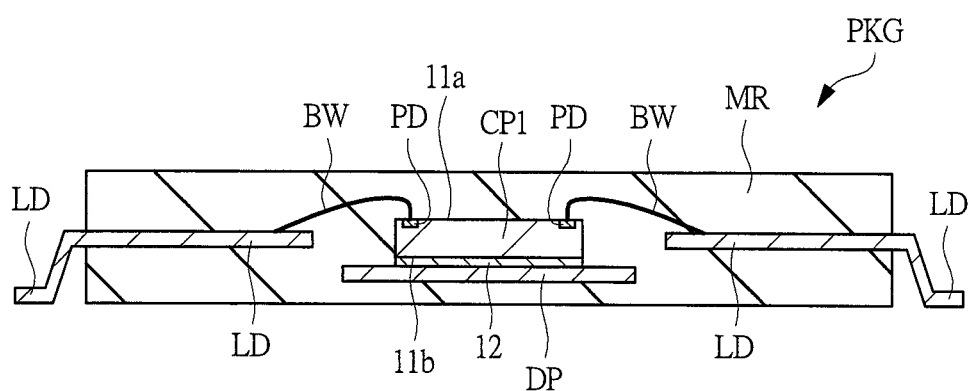
FIG. 4 is a cross-sectional view of a semiconductor device of an embodiment of the present invention.
Figure 5:
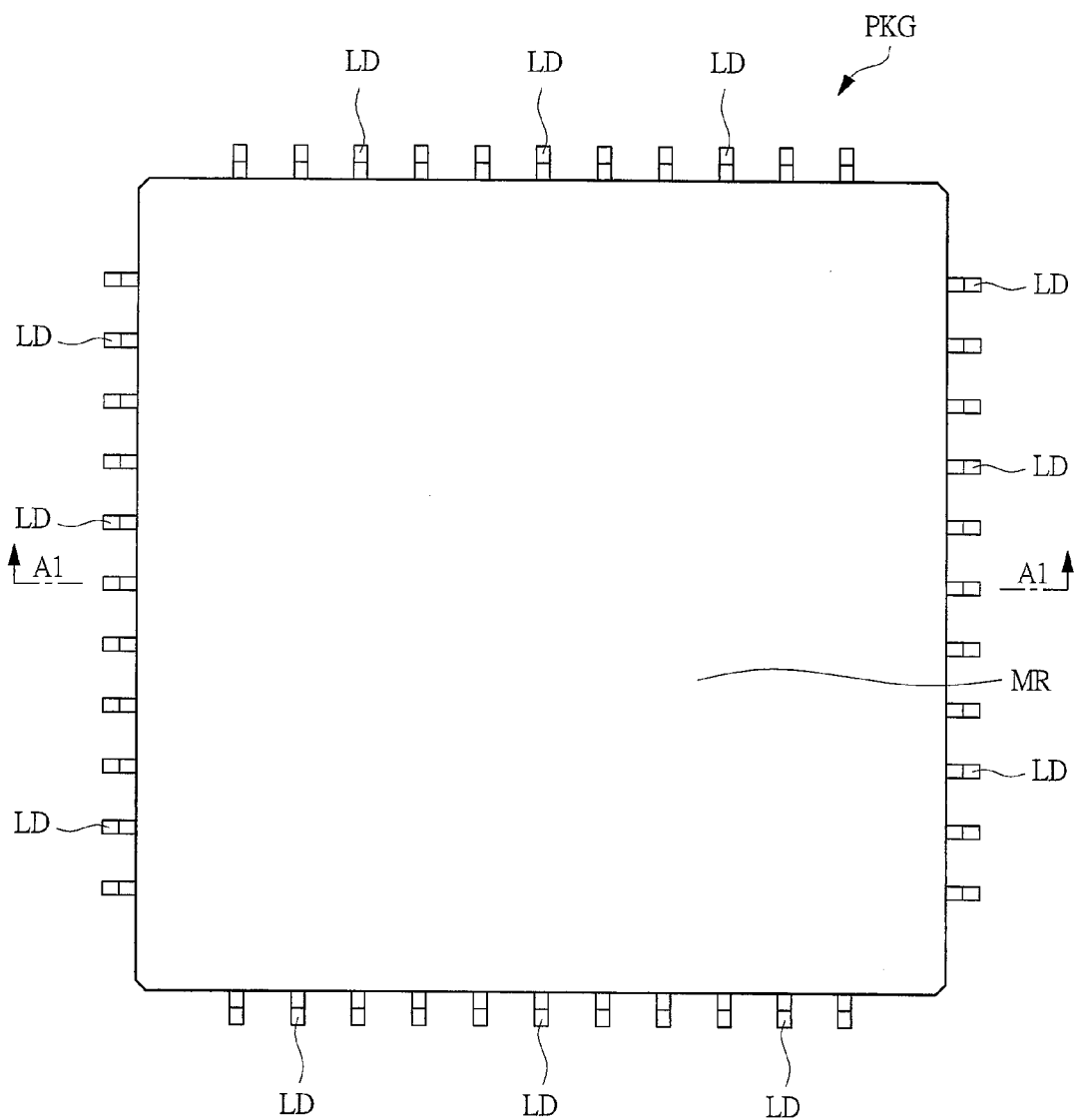
FIG. 5 is a top plan view of the semiconductor device of the embodiment of the present invention.
Figure 6:
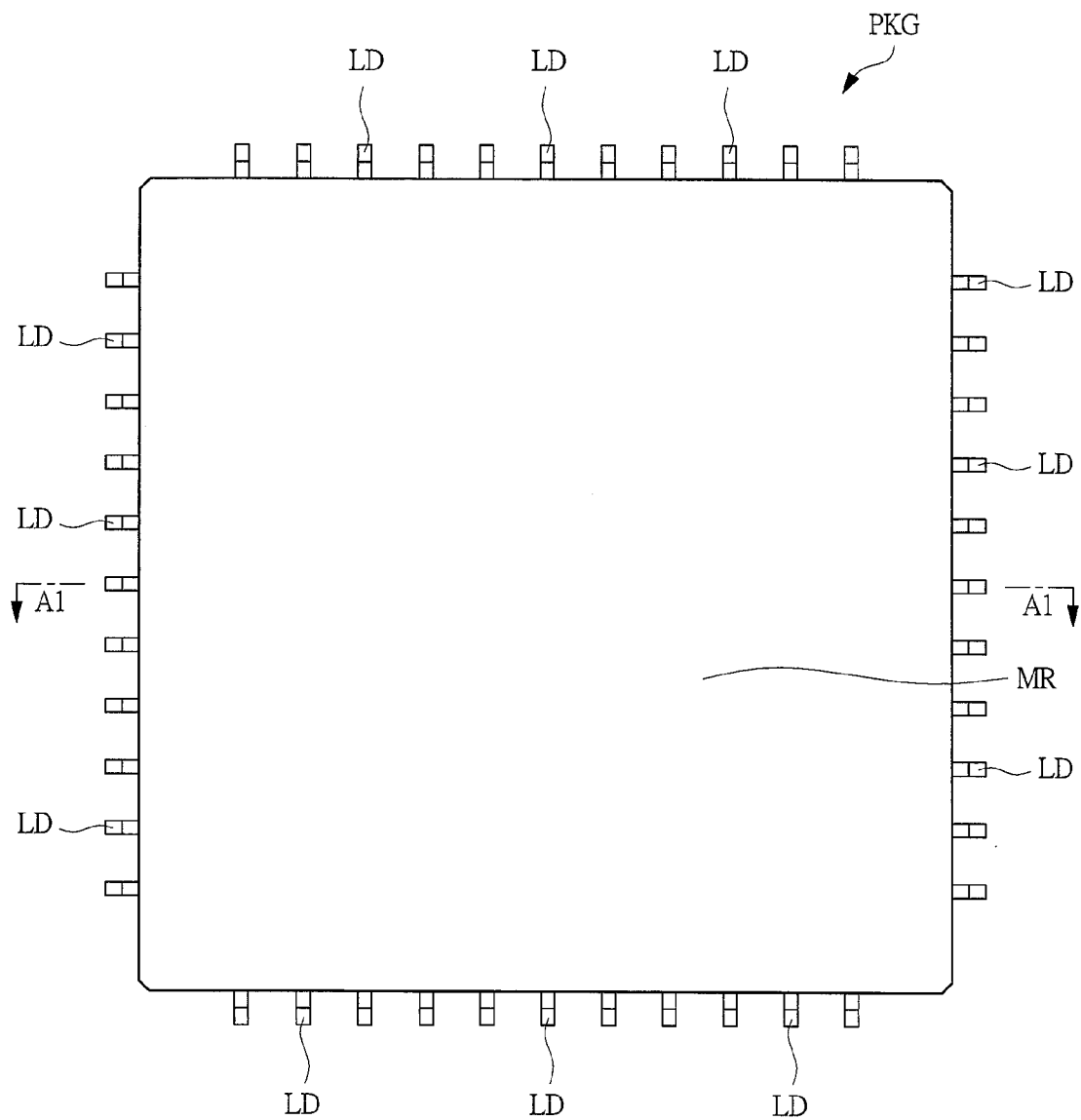
FIG. 6 is a bottom plan view of the semiconductor device of the embodiment of the present invention.
Figure 7:
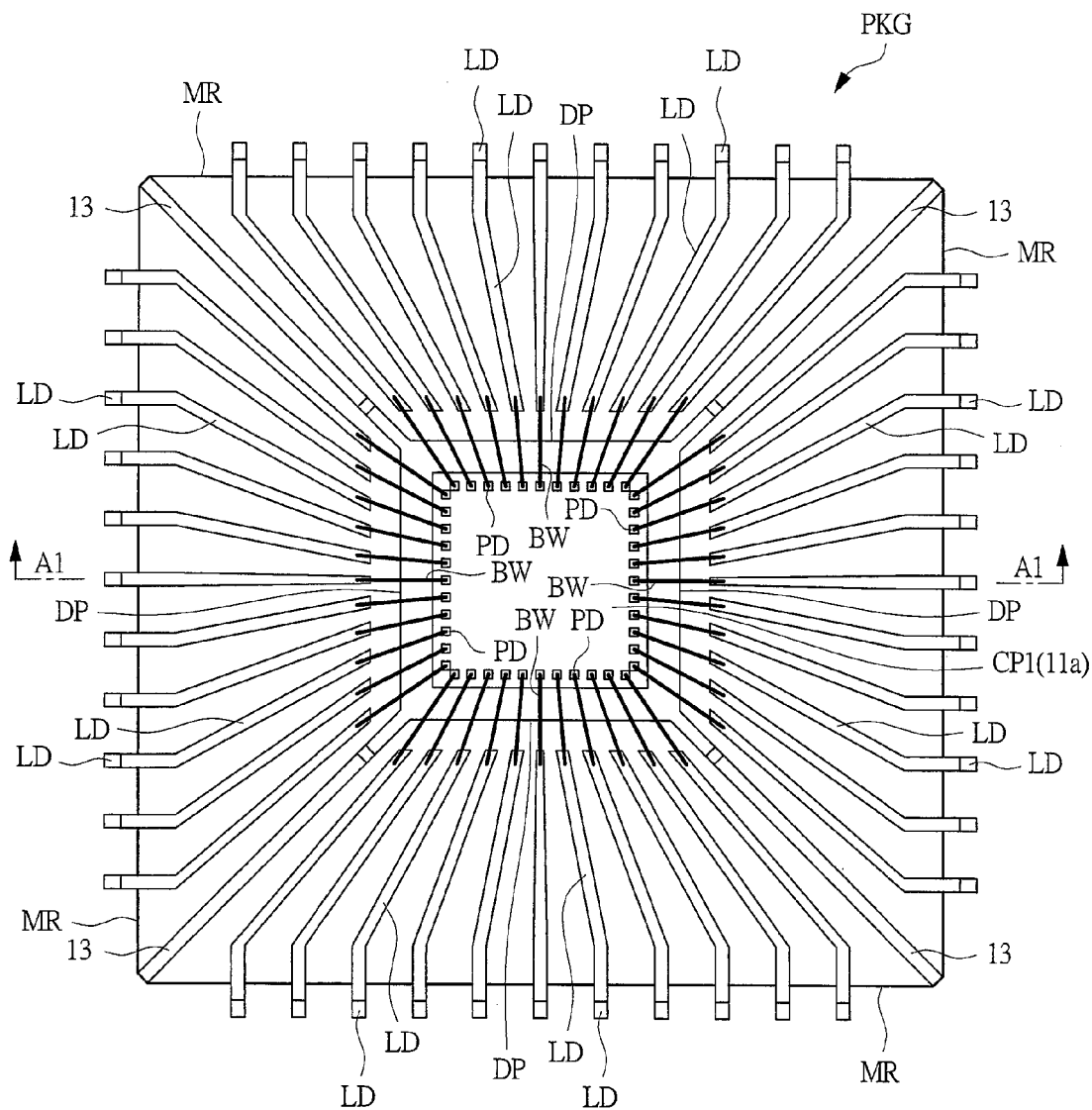
FIG. 7 is a plan perspective view of the semiconductor device of the embodiment of the present invention.

FIG. 4 is a cross-sectional view of the semiconductor device PKG of the present embodiment, FIG. 5 is a top view (plan view) of the semiconductor device PKG of the present embodiment, FIG. 6 is a bottom view (plan view) of the semiconductor device PKG of the present embodiment, and FIG. 7 is a plan perspective view (top view) of the semiconductor device PKG of the present embodiment. Note that FIG. 7 illustrates a plan perspective view on a top-surface side of the semiconductor device PKG in seeing through a sealing resin portion MR. Also, a cross-sectional surface of the semiconductor device PKG at a position of each line A1-A1 of FIGS. 5 to 7 almost corresponds to FIG. 4.

The semiconductor device PKG of the present embodiment illustrated in FIGS. 4 to 7 has: the semiconductor chip CP1; a die pad (chip mount portion) DP on which the semiconductor chip CP1 is supported or mounted; a plurality of leads LD each of which is made of an electrical conductor; a plurality of bonding wires BW which electrically connect between the plurality of leads LD and a plurality of pad electrodes PD on a surface of the semiconductor chip CP1, respectively; and the sealing resin portion MR for sealing them.

The sealing resin portion (sealing portion, sealing resin, sealing body) MR is made of, for example, a resin material such as a thermosetting resin material, and can also contain a filler or others. For example, the sealing portion MR can be formed by using, for example, an epoxy resin containing the filler. As the material of the sealing portion MR, not only the epoxy-based resin but also, for example, a biphenyl-based thermosetting resin to which a phenol-based hardening agent, silicone rubber, a filler, or others is added may be used in order to reduce stress or others. The semiconductor chip CP1, the leads LD, and the bonding wires BW are sealed by the sealing resin portion MR so as to be electrically and mechanically protected. A planar shape (outer shape) of the sealing resin portion MR intersecting with a thickness of the same is, for example, rectangular (quadrangular), and corners of this rectangle (planar rectangle) can be rounded.

A planar shape of the semiconductor chip CP1 intersecting with a thickness of the same is rectangular (quadrangular), and is manufactured by, for example, forming various semiconductor elements or semiconductor integrated circuits on a main surface of a semiconductor substrate (semiconductor wafer) made of single-crystal silicon or others, and then, separating the semiconductor substrate into semiconductor chips by dicing or others. The above-described oscillation circuit OS is embedded inside the semiconductor chip CP1.

The plurality of pad electrodes (bonding pads, electrodes, terminals) PD are formed on a main surface (surface, upper surface) 11a which is one main surface of the semiconductor chip CP1, and besides, is a main surface on a semiconductor-element formation side. Each pad electrode PD of the semiconductor chip CP1 is electrically connected to the semiconductor element or semiconductor integrated circuit formed inside or in a surface-layer portion of the semiconductor chip CP1. Note that, in the semiconductor chip CP1, a main surface on a side where the pad electrode PD is formed is referred to as a main surface 11a, and an opposite main surface to the main surface 11a on the side where the pad electrode PD is formed is referred to as a back surface 11b of the semiconductor chip CP1. The plurality of pad electrodes PD are arranged along periphery of the main surface 11a of the semiconductor chip CP1.

The semiconductor chip CP1 is mounted (arranged) on the upper surface of the die pad DP so that the main surface 11a of the semiconductor chip CP1 is directed upward, and the back surface 11b of the semiconductor chip CP1 is bonded (joined) onto the upper surface of the die pad DP through a bonding material (die bonding material, joining material) 12s as to be fixed thereto. As the bonding material 12, an electrically-conductive or insulating bonding material can be used if needed. Also, the semiconductor chip CP1 is sealed inside the sealing resin portion MR so as not to be exposed from the sealing resin portion MR.

Each of the leads (lead portions) LD is made of an electrical conductor, and is preferably made of a metal material such as copper (Cu) or a copper alloy. Each of the leads LD is formed of an inner lead portion which is a portion of the lead LD positioned inside the sealing resin portion MR, and an outer lead portion which is a portion of the lead LD positioned outside the sealing resin portion MR, and the outer lead portion is protruded from a side surface of the sealing resin portion MR toward the outside of the sealing resin portion MR. The plurality of leads LD are arranged in the periphery of the semiconductor chip CP1 so that one end portion of each of the leads LD (a tip portion of the inner lead portion) is opposed to the semiconductor chip CP1.

A space between the inner leads of the leads LD adjacent to each other is filled with the material configuring the sealing resin portion MR. Each of the pad electrodes PD on the main surface 11a of the semiconductor chip CP1 is electrically connected to the inner lead portion of each of the leads LD, respectively, via the bonding wire BW which is an electrically-conductive connecting member. That is, one end of both ends of each of the bonding wires BW is connected to each pad electrode PD of the semiconductor chip CP1, and the other end thereof is connected to the upper surface of the inner lead portion of each lead LD. The bonding wire BW is the electrically-conductive connecting member for electrically connecting between the pad electrode PD of the semiconductor chip CP1 and the lead 4, and is more specifically an electrically-conductive wire, and is preferably made of a metal thin wire such as a gold (Au) wire or a copper (Cu) wire. The bonding wires BW are sealed inside the sealing resin portion MR so as not to be exposed from the sealing resin portion MR.

The outer lead portion of each lead LD is subjected to a bending process so that a lower surface of the outer lead portion in the vicinity of the end portion thereof is positioned slightly lower than a lower surface of the sealing resin portion MR. The outer lead portion of the lead LD functions as an external-connection terminal portion (external terminal) of the semiconductor device CP1.

A plurality of suspending leads 13 are integrally formed with the die pad DP, and these suspending leads 13 are provided in order to retain the die pad DP in (a frame of) a lead frame for manufacturing the semiconductor device PKG when the semiconductor device PKG is manufactured.

Each suspending lead 13 is made of the same material as that of the die pad and is integrally formed with the die pad DP, has one end which is integrally formed with (coupled to, connected to) the die pad DP and which is extended toward outside of the die pad DP (in a direction of separating away from the die pad DP on a plane), and has an end opposite to the side coupled to the die pad DP which is extended inside the sealing resin portion MR so as to reach the side surface of the sealing resin portion MR (preferably, reach a corner of the planar rectangle of the sealing resin portion MR).

Also, the leads LD are separated from the die pad DP and the suspending leads 13 so as not to be integrally formed therewith. However, the semiconductor device PKG is easily manufactured if the semiconductor device PKG is manufactured by providing the leads LD, the die pad DP, and the suspending leads 13 on the same lead frame as each other.

Therefore, the leads LD, the die pad DP, and the suspending leads 13 are preferably made of the same material, so that the semiconductor device PKG can be manufactured by providing the leads LD, the die pad DP, and the suspending leads 13 on the same lead frame, and the semiconductor device PKG can be easily manufactured. From viewpoints of high thermal conductivity, high electrical conductivity, cost, and processability, the die pad DP, the leads LD, and the suspending leads 13 are preferably made of a metal material, and more preferably made of copper (Cu) or a metal material mainly containing copper (Cu) such as copper alloy.

The semiconductor device PKG can be manufactured as, for example, follows.

A lead frame (not illustrated) having the die pad DP and the plurality of leads LD is prepared. In this lead frame, each lead LD is integrally coupled to a frame of the lead frame, and the die pad DP is integrally coupled to the frame of the lead frame via the suspending leads 13. Then, the semiconductor chip CP1 is bonded onto the die pad DP of the lead frame through the bonding material 12 to be fixed thereto (in a die bonding step). Then, the plurality of pad electrodes PD of the semiconductor chip CP1 and the plurality of leads LD of the lead frame are electrically connected to each other via the plurality of bonding wires BW (in a wire bonding step). Then, the sealing resin portion MR which seals the semiconductor chip CP1, the die pad DP, the plurality of leads LD, and the plurality of bonding wires BW is formed (in a molding step or a resin sealing step). Then, after the leads LD are separated from the frame of the lead frame (at this time, apart of the suspending leads 13 protruded from the sealing resin portion MR is also cut), the outer lead portions of the leads LD protruded from the sealing resin portion MR are subjected to the bending process, so that the semiconductor device PKG can be manufactured.

Also, in the present embodiment, a case that the semiconductor device PKG is a semiconductor device (semiconductor package) of a QFP (Quad Flat Package) type has been explained. However, as long as it is a semiconductor device (semiconductor package) of a resin sealing type in which the semiconductor chip CP1 is sealed with a resin, the semiconductor device PKG can be a semiconductor device (semiconductor package) of another type. For example, the semiconductor device PKG can be that of a QFN (Quad Flat Non-leaded package) type, a SOP (Small Outline Package) type, or a DIP (Dual Inline Package) type, which is a semiconductor device (semiconductor package) manufactured by using a lead frame as similar to that of the QFP type. Also, the semiconductor device PKG can be a semiconductor device (semiconductor package) of a resin sealing type which is manufactured by using a wiring board. In this case, the type can be, for example, a BGA (Ball Grid Array) type or a LGA (Land Grid Array) type. In the cases of the BGA type and the LGA type, the semiconductor chip CP1 is die-bonded onto the wiring board first, and then, is sealed with a resin, and the semiconductor chip CP1 is covered with a sealing resin portion corresponding to the above-described sealing resin portion MR.

<About Structure of Semiconductor Chip>

Next, a structure of the semiconductor chip CP1 of the present embodiment will be specifically explained.

Figure 8:
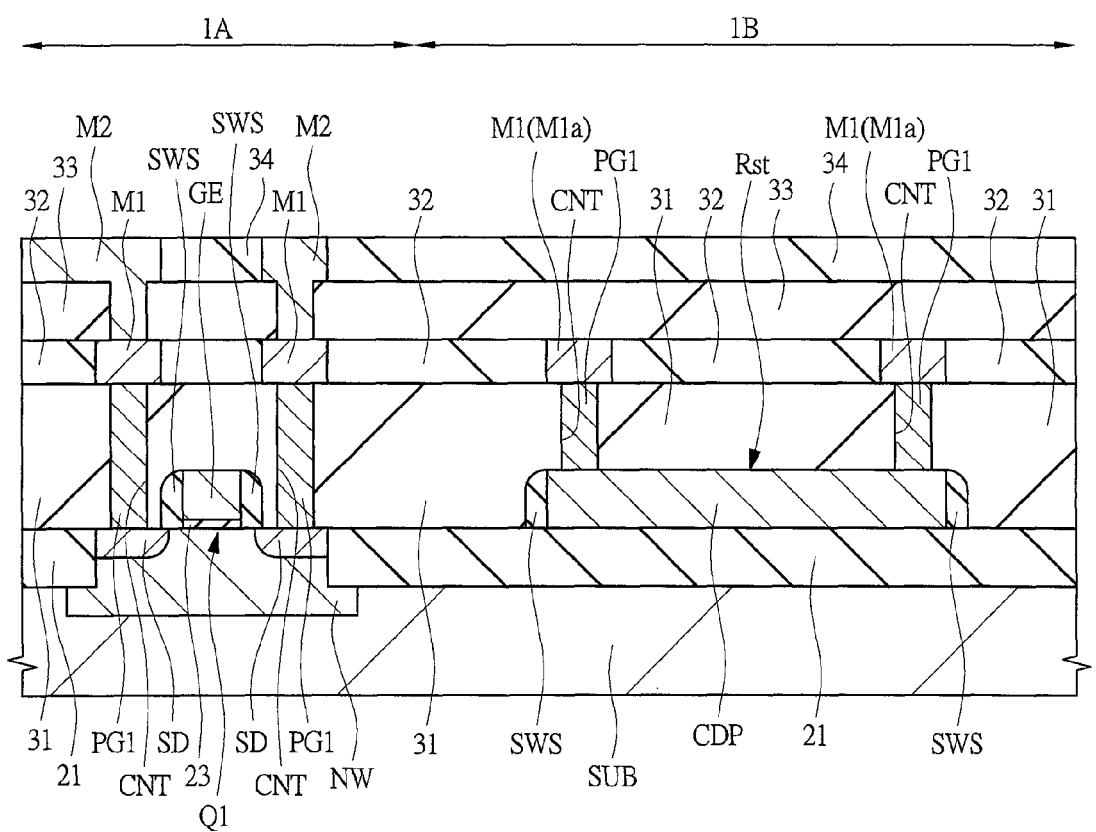
FIG. 8 is a cross-sectional view of a principal part of a semiconductor chip of an embodiment of the present invention.

FIG. 8 is a cross-sectional view of a principal part of the semiconductor chip CP1 of the present embodiment. The semiconductor chip CP1 of the present embodiment is a semiconductor device having a resistive element (reference resistor Rst1) and a MISFET (Metal Insulator Semiconductor Field Effect Transistor: MIS-type field-effect transistor) element.

As illustrated in FIG. 8, a semiconductor substrate SUB configuring the semiconductor chip CP1 of the present embodiment is made of, for example, p-type single-crystal silicon having a specific resistance of about 1 to 10 Ωcm.

The semiconductor substrate SUB has a MISFET formation region 1A which is a region where a MISFET (Metal Insulator Semiconductor Field Effect Transistor) is formed and a reference-resistor formation region 1B which is a region where the reference resistor Rst1 is formed. FIG. 8 illustrates a cross-sectional view of a principal part formed of the MISFET formation region 1A and the reference-resistor formation region 1B. In order to easily understand, FIG. 8 illustrates the MISFET formation region 1A and the reference-resistor formation region 1B so as to be adjacent to each other. However, a relation between actual positions of the MISFET formation region 1A and the reference-resistor formation region 1B in the semiconductor substrate SUB can be changed if needed. Further, FIG. 8 illustrates a region where a p-channel-type MISFET is formed as the MISFET formation region 1A. However, practically, not only the p-channel-type MISFET but also an n-channel-type MISFET are formed in the MISFET formation region 1A.

As illustrated in FIG. 8, element isolation regions 21 are formed in a main surface of the semiconductor substrate SUB. Each of the element isolation regions 21 is made of an insulator (an insulating film such as silicon oxide) buried in an element isolation trench (groove) 21a formed in the main surface of the semiconductor substrate SUB, and can be formed by an STI (Shallow Trench Isolation) method.

An n-type well (n-type semiconductor region) NW is formed from the main surface of the semiconductor substrate SUB down to a predetermined depth. The n-type well NW is formed in the MISFET formation region 1A in the semiconductor substrate SUB (which is an active region defined by the element isolations region 21). In the reference-resistor formation region 1B, the element isolation region 21 is entirely formed.

In the MISFET formation region 1A, a MISFET Q1 is formed on the main surface of the semiconductor substrate SUB. In the reference-resistor formation region 1B, the reference resistor (reference resistive element) Rst is formed on the main surface of the semiconductor substrate SUB.

A specific configuration of the MISFET Q1 formed in the MISFET formation region 1A will be explained.

In the MISFET formation region 1A, a gate electrode GE of the MISFET Q1 is formed on the n-type well NW via a gate insulating film 23. The gate insulating film 23 is an insulating film which functions as a gate insulating film of the MISFET Q1 formed in the MISFET formation region 1A. The gate electrode GE is formed of, for example, a polycrystalline silicon film (polysilicon film), to which an impurity is introduced so as to have a low resistivity. Sidewall spacers (sidewalls, side-wall insulating film, side-wall spacers) SWS formed of a silicon oxide film, a silicon nitride film, or a stacked film of them are formed on side walls of the gate electrode GE. Inside the n-type well NW, p-type semiconductor regions SD for source/drain of the MISFET Q1 are formed. The p-type semiconductor region SD for the source/drain of the MISFET Q1 can have a LDD (Lightly Doped Drain) structure.

Also, here, the case that the MISFET Q1 formed in the MISFET formation region 1A is the p-channel-type MISFET is described. However, the conductivity types of the respective regions can be opposite to the originals so that the MISFET Q1 formed in the MISFET formation region 1A is an n-channel-type MISFET. In the MISFET formation region 1A, both of the p-channel-type MISFET and the n-channel-type MISFET, that is, CMISFET (Complementary Metal Insulator Semiconductor Field Effect Transistor) can be formed.

Next, a specific configuration of the reference resistor Rst formed in the reference-resistor formation region 1B will be explained.

The reference resistor Rst is formed of an electrical-conductor pattern (conductor pattern, electrical-conductor film pattern, resistor) CDP which functions as a resistor, and the reference resistor Rst is formed of a plurality of electrical-conductor patterns (resistors) CDP described later.

While the electrical-conductor pattern CDP is a patterned electrical-conductor film, the electrical-conductor pattern CDP is a silicon film pattern (preferably, a polycrystalline silicon film pattern) in the present embodiment. That is, in the present embodiment, the electrical-conductor pattern CDP is preferably made of polycrystalline silicon (polysilicon), and has the resistivity adjusted by introducing an impurity thereto. In the reference-resistor formation region 1B, the electrical-conductor pattern CDP which is the silicon film pattern is formed on the element isolation region 2, and is electrically insulated from the semiconductor substrate SUB. Moreover, the sidewall spacers SWS are formed on side walls of the electrical-conductor pattern CDP which is the silicon film pattern. A shape of the electrical-conductor pattern CDP and others will be described later in detail.

A metal silicide layer (whose illustration is omitted) can be also formed on a part (a region connected with a bottom portion of a plug PG1 described later) of the surfaces (upper surfaces) of the p-type semiconductor region SD and the gate electrode GE in the MISFET formation region 1A and the surface (upper surface) of the electrical-conductor pattern CDP which is the silicon film pattern in the reference-resistor formation region 1B. In this manner, a diffusion resistance and a contact resistance can be reduced, and besides, a resistive element region of the electrical-conductor pattern CDP which is the silicon film pattern can be defined. This metal silicide layer can be formed by a salicide (Salicide: Self Aligned Silicide) process or others.

On the semiconductor substrate SUB, an insulating film (interlayer insulating film) 31 is formed so as to cover the gate electrode GE and the electrical-conductor pattern CDP. The insulating film 31 is formed of, for example, a stacked film of a silicon nitride film and a silicon oxide film thicker than the silicon nitride film (the silicon nitride film is on a lower layer side) or others, and an upper surface of the insulating film 31 is planarized so that heights of the MISFET formation region 1A and the reference-resistor formation region 1B are almost equal to each other.

Contact holes (opening portions, through holes, connecting holes) CNT are formed in the insulating film 31, and electrically-conductive plugs (connecting conductor portions, electrically-conductive plugs) PG1 are formed (buried) inside the contact holes CNT. Each of the plugs PG1 is formed of an electrically-conductive barrier film (such as a tantalum film, a tantalum nitride film, or a stacked film of them) which is formed on a bottom portion and side walls of the contact hole CNT and formed of a main electrical-conductor film which is formed of a tungsten (W) film or others and which is formed on the electrically-conductive barrier film so as to fill the inside of the contact hole CNT. However, in order to simplify drawings, FIG. 8 illustrates the electrical-conductor barrier film and the main electrical-conductor film as the plug PG1 without distinguishing them from each other. The contact hole CNT and the plug PG1 buried therein are formed on the p-type semiconductor region SD and the gate electrode GE in the MISFET formation region 1A, on the electrical-conductor pattern CDP in the reference-resistor formation region 1B, and others.

An insulating film (interlayer insulating film) 32 formed of, for example, a silicon oxide film or others is formed on the insulating film 31 in which the plug PG1 is buried, and a wiring (wiring layer, first wiring layer) M1 serving as a first-layer wiring is formed inside the wiring trench (opening portion) formed in the insulating film 32.

The wiring M1 is formed of an electrically-conductive barrier film (such as a tantalum film, a tantalum nitride film, or a stacked film of them) which is formed on a bottom portion and side walls of the wiring trench formed in the insulating film 32 and a copper main electrical-conductor film which is formed on the electrically-conductive barrier film so as to fill the inside of the wiring trench. However, in order to simplify drawings, FIG. 8 illustrates the electrical-conductor barrier film and the main electrical-conductor film as the wiring M1 without distinguishing them from each other. The wiring M1 is electrically connected to the p-type semiconductor region SD and the gate electrode GE in the MISFET formation region 1A and to the electrical-conductor pattern CDP in the reference-resistor formation region 1B via the plugs PG1.

While the wiring M1 is formed by a damascene technique (a single damascene technique here), it may be formed of a patterned electrically-conductor film (such as a tungsten wiring or an aluminum wiring) as another type.

On the insulating film 32 in which the wiring M1 is buried, an insulating film (interlayer insulating film) 33 and an insulating film (interlayer insulating film) 34 are formed in an order from a lower side. A wiring (second wiring layer) M2 serving as a second-layer wiring is formed by burying an electrical-conductor film inside the wiring trench formed in the insulating film 34 and in a via hole (VIA hole, via hole, through hole) formed in the insulating film 33 at the bottom portion of the wiring trench. That is, as the wiring M2, a wiring portion formed in the wiring trench of the insulating film 34 and a plug portion (connecting portion) formed in the via hole of the insulating film 33 are integrally formed with each other. And, as similar to the wiring M1, the wiring M2 is also formed of an electrically-conductive barrier film (such as a tantalum film, a tantalum nitride film, or a stacked film of them) which is formed on a bottom portion and side walls of the via hole and the wiring trench and formed of a copper main electrical-conductor film which is formed on the electrically-conductive barrier film so as to be buried inside the wiring trench and the via hole. However, in order to simplify the drawing, FIG. 8 illustrates the electrically-conductive barrier film and the main electrical-conductor film as the wiring M2 without distinguishing them from each other.

While the wiring M2 is formed by a damascene technique (a dual damascene technique here), the wiring M2 can be formed by the single damascene technique as another type. Also, the wiring M2 can be formed of a patterned electrical-conductor film (such as a tungsten wiring or an aluminum wiring).

An insulating film and a wiring (buried wiring) which are further upper layers are formed on the insulating films 33 and 34 in which the wiring M2 is buried. However, illustration and explanation thereof are omitted here. In the present embodiment and the following second to fourth embodiments, each wiring (including the wirings M1 and M2 and a wiring M3 described later) is a metal wiring made of a metal material.

<About Method of Manufacturing Semiconductor Chip>

Next, an example of steps of manufacturing the semiconductor chip CP1 of the present embodiment will be explained with reference to drawings. FIGS. 9 to 14 are cross-sectional views of principal parts in the steps of manufacturing the semiconductor chip CP1 of the present embodiment, and illustrate cross-sectional surfaces of the regions corresponding to above-described FIG. 8.

Figure 9:
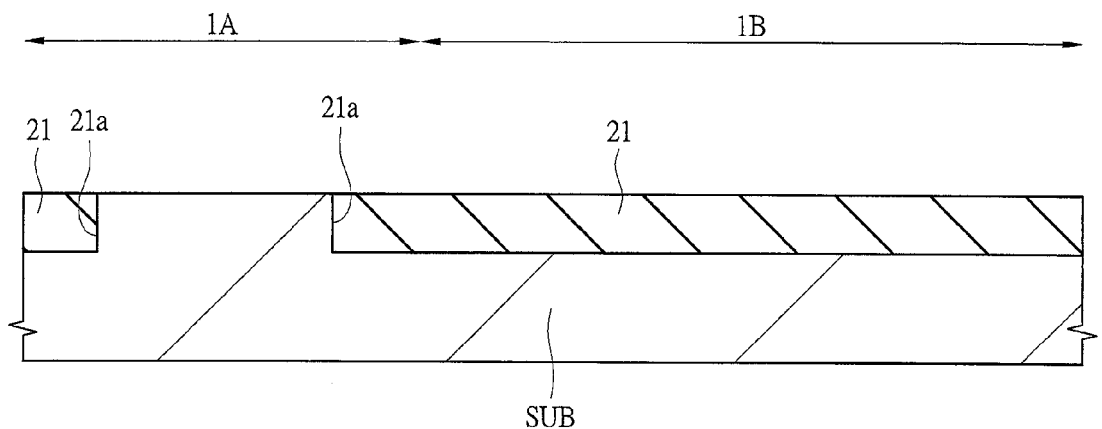
FIG. 9 is a cross-sectional view of a principal part in a step of manufacturing the semiconductor chip of the embodiment of the present invention.

First, as illustrated in FIG. 9, a semiconductor substrate (semiconductor wafer) SUB made of, for example, p-type single-crystal silicon having a specific resistance of about 1 to 10 Ωcm or others is prepared. As described above, the semiconductor substrate SUB in which the semiconductor chip CP1 of the present embodiment is formed has the MISFET formation region 1A which is the region where the MISFET Q1 is formed and the reference-resistor formation region 1B which is the region where the reference resistor Rst is to be formed. Then, the element isolation regions 21 each of which is made of an insulator (an insulator buried inside the trench) are formed on the main surface of the semiconductor substrate SUB by, for example, a STI (Shallow Trench Isolation) method or others.

That is, the element isolation trenches (grooves) 21a are formed in the main surface of the semiconductor substrate SUB by etching or others, and then, the insulating film made of silicon oxide (such as a silicon oxide film formed by HDP-CVD (High Density Plasma-CVD) or others is formed on the semiconductor substrate SUB so as to fill the element isolation trenches 21a. Then, by polishing this insulating film by using a CMP (Chemical Mechanical Polishing) method or others, an unnecessary insulating film outside the element isolation trenches 21a is removed, and besides, the insulating film is left inside the element isolation trenches 21a, so that the element isolation regions 21 formed of the insulating film (insulator) with which the element isolation trenches 21a are filled can be formed.

An active region of the semiconductor substrate SUB is defined by the element isolation regions 21. In the active region defined by the element isolation regions 21 in the MISFET formation region 1A, the MISFET Q1 is formed as described later. In the reference-resistor formation region 1B, the element isolation region 21 is entirely formed.

Figure 10:
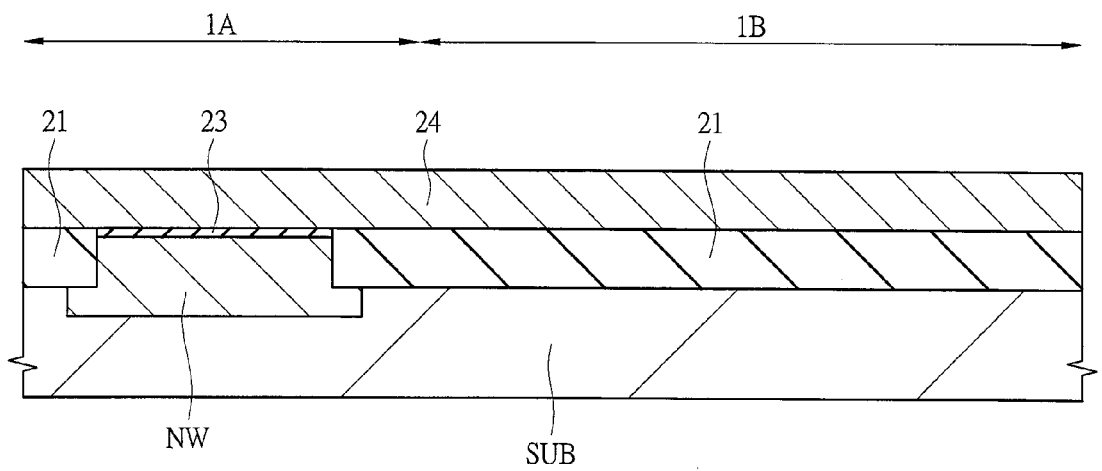
FIG. 10 is a cross-sectional view of a principal part in a step of manufacturing the semiconductor chip, continued from FIG. 9.

Next, as illustrated in FIG. 10, the n-type well (n-type semiconductor region) NW is formed from the main surface of the semiconductor substrate SUB down to a predetermined depth. The n-type well NW can be formed by, for example, ion implantation of an n-type impurity such as phosphorous (P) or arsenic (As) into the semiconductor substrate SUB, and the n-type well NW is formed in the MISFET formation region 1A.

Next, the surface of the semiconductor substrate SUB is cleaned (rinsed) by, for example, wet etching using hydrofluoric acid (HF) aqueous solution, and then, the insulating film 23 formed of, for example, a silicon oxide film is formed in the surface of the semiconductor substrate SUB (the surface of the n-type well NW in the MISFET formation region 1A). The insulating film 23 formed in the MISFET formation region 1A is an insulating film for the gate insulating film of the MISFET to be formed in the MISFET formation region 1A, and can be formed by using, for example, a thermal oxidation method.

Next, an electrically-conductive material film (electrical-conductor film, silicon film) such as a polycrystalline silicon film (doped polysilicon film) 24 is formed (deposited) on the entire surface of the main surface of the semiconductor substrate SUB (that is, on the region including portions on the insulating film 23 and the element isolation region 21). To this polycrystalline silicon film 24, an impurity is introduced during or after the film formation, so that a low-resistance semiconductor film (electrically-conductive material film) is formed. A thickness (deposited film thickness) of the polycrystalline silicon film 24 can be, for example, about 100 to 250 nm. Also, the polycrystalline silicon film 24 which is an amorphous silicon film during the film formation can be changed into a polycrystalline silicon film by thermal treatment after the film formation.

Figure 11:
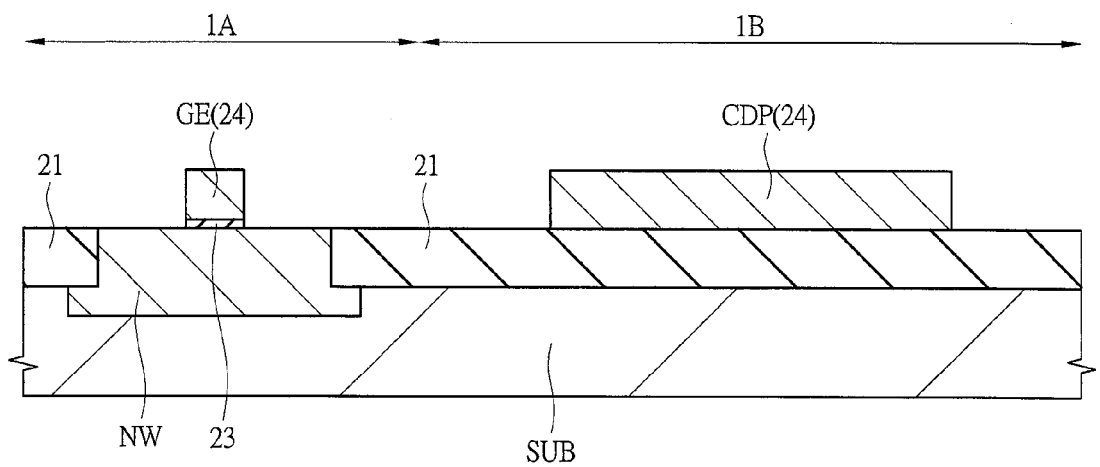
FIG. 11 is a cross-sectional view of a principal part in a step of manufacturing the semiconductor chip, continued from FIG. 10.

Next, as illustrated in FIG. 11, the gate electrode GE and the electrical-conductor pattern CDP for the reference resistor Rst are formed by patterning the polycrystalline silicon film 24 by using a photolithography method and a dry etching method. In the present embodiment, each of the gate electrode GE and the electrical-conductor pattern CDP is formed of the patterned polycrystalline silicon film 24.

Among them, the gate electrode GE is formed on the n-type well NW through the insulating film 23 in the MISFET formation region 1A. That is, the gate electrode GE is formed on the insulating film 23 on the surface of the n-type well NW in the MISFET formation region 1A. Also, the polycrystalline electrical-conductor pattern CDP is formed on the element isolation region 21 in the reference-resistor formation region 1B.

Figure 12:
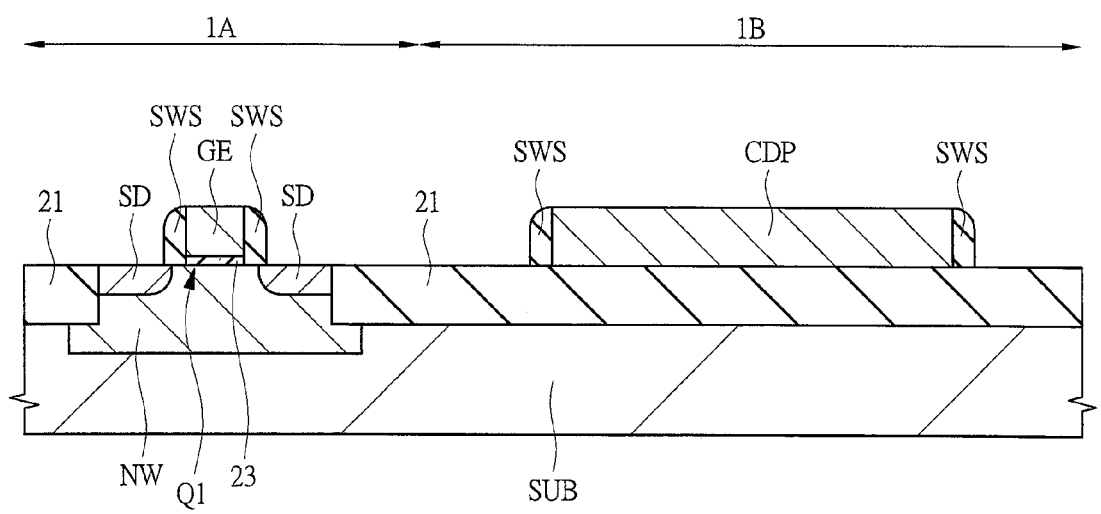
FIG. 12 is a cross-sectional view of a principal part in a step of manufacturing the semiconductor chip, continued from FIG. 11.

Next, as illustrated in FIG. 12, the sidewall spacers SWS are formed on the side walls of the gate electrode GE and on the side walls of the electrical-conductor pattern CDP. The sidewall spacers SWS can be formed by, for example, depositing a silicon oxide film (oxide silicon film), a silicon nitride film (nitride silicon film), or a stacked film of them, on the semiconductor substrate SUB, and anisotropically etching the silicon oxide film, the silicon nitride film, or the stacked film of them by, for example, a RIE (Reactive Ion Etching) method.

After the formation of the sidewall spacers SWS, the p-type semiconductor regions SD in the MISFET formation region 1A are formed by ion implantation or others. Moreover, in order to form the LDD structure, ion implantation can be performed also prior to the formation of the sidewall spacers SWS.

In this manner, the p-channel-type MISFET Q1 is formed in the MISFET formation region 1A as the field-effect transistor, so that the structure of FIG. 12 is obtained.

Next, a metal silicide layer (whose illustration is omitted) is formed by a salicide process on a part (a region where the bottom portion of the plug PG1 is to be connected later) of the surfaces (upper surfaces) of the p-type semiconductor region SD and the gate electrode GE in the MISFET formation region 1A and the surface (upper surface) of the electrical-conductor pattern CDP which is the silicon film pattern in the reference-resistor formation region 1B.

Figure 13:
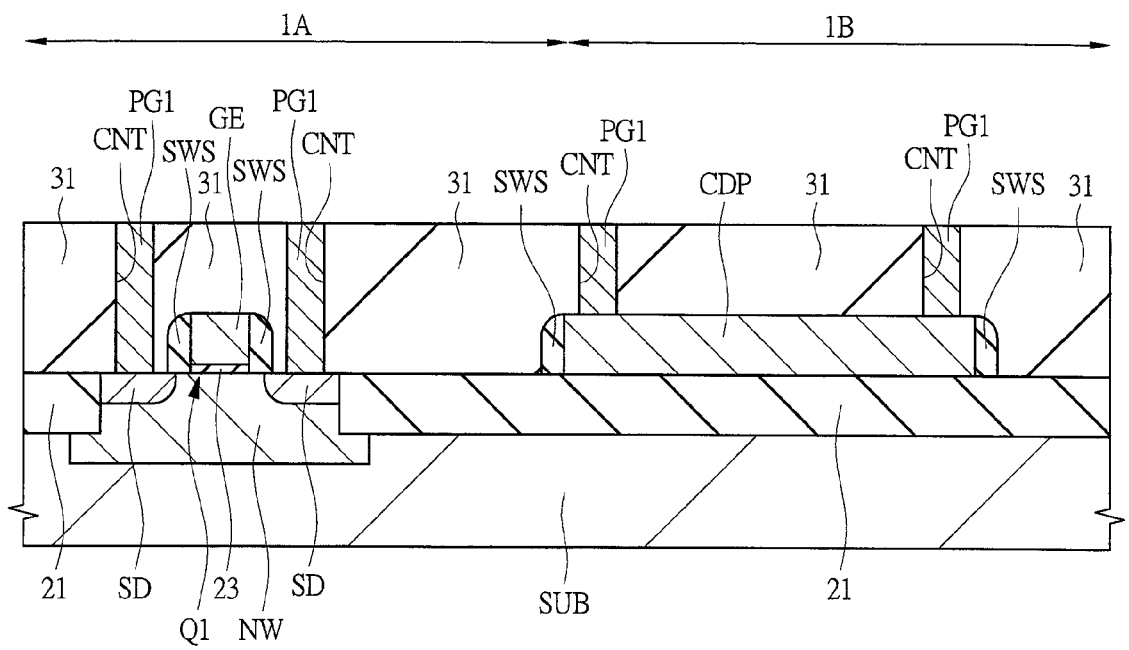
FIG. 13 is a cross-sectional view of a principal part in a step of manufacturing the semiconductor chip, continued from FIG. 12.

Next, as illustrated in FIG. 13, the insulating film 31 is formed on the semiconductor substrate SUB. That is, the insulating film 31 is formed on the semiconductor substrate SUB so as to cover the gate electrode GE and the electrical-conductor pattern CDP. The insulating film 31 is formed of, for example, a stacked film of a relatively-thin silicon nitride film and a relatively-thick silicon oxide film thereon or others. The insulating film 31 can be a single film of the silicon oxide film or others. The insulating film 31 can function as an interlayer insulating film. After the formation of the insulating film 31, an upper surface of the insulating film 31 is planarized by, for example, CMP treatment.

Next, the insulating film 31 is dry-etched by using a photolithography method using a photoresist film (not illustrated) formed on the insulating film 31 as an etching mask, so that the contact holes CNT are formed above the p-type semiconductor region SD, the gate electrode GE, the electrical-conductor pattern CDP, and others. From the bottom portion of the contact hole CNT, for example, apart of the p-type semiconductor region SD, the gate electrode GE, and the electrical-conductor pattern CDP is exposed.

Next, the plug PG1 is formed inside the contact hole CNT. In order to form the plug PG1, for example, an electrically-conductive barrier film (such as a tantalum film, a tantalum nitride film, or a stacked film of them) is formed on the insulating film 31 including the inside of the contact hole CNT, and then, a main electrical-conductor film formed of, for example, a tungsten (W) film or others is formed on the electrically-conductive barrier film so as to fill the contact hole CNT. Then, unnecessary main electrical-conductor film and electrically-conductive barrier film on the insulating film 31 are removed by, for example, a CMP method or an etch-back method, so that the plugs PG1 can be formed.

Figure 14:
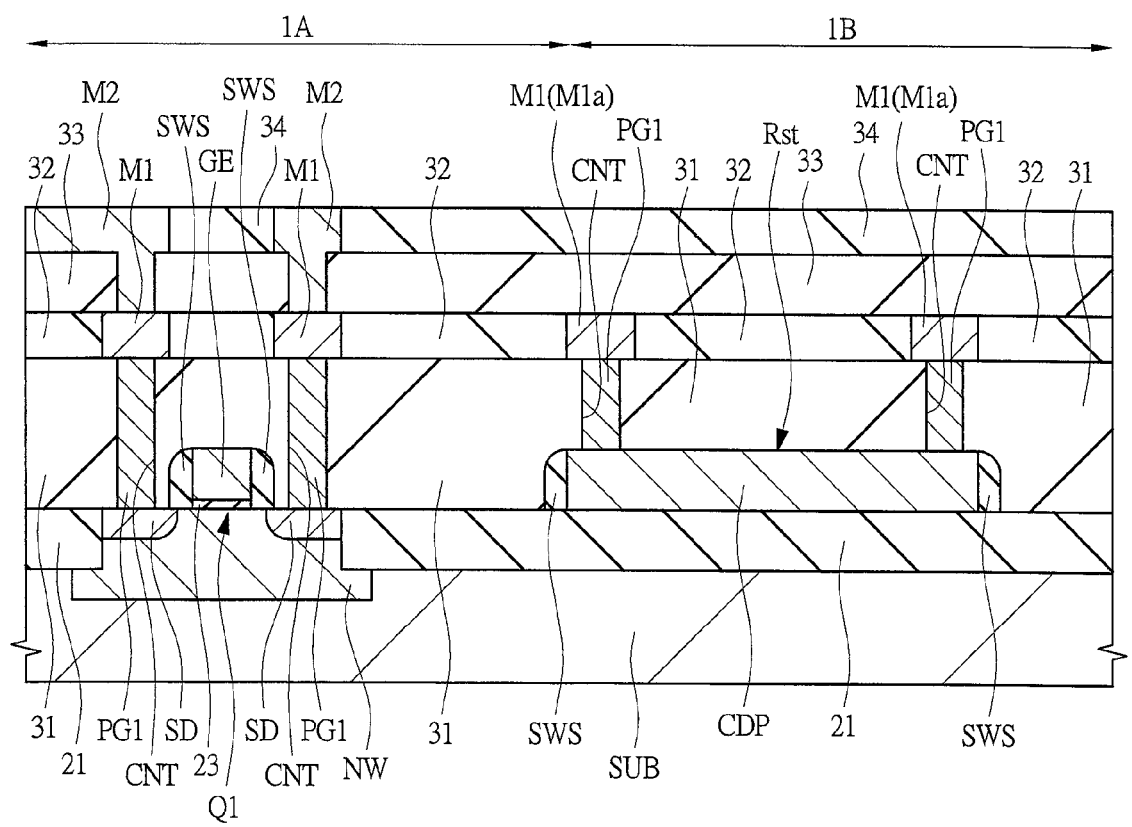
FIG. 14 is a cross-sectional view of a principal part in a step of manufacturing the semiconductor chip, continued from FIG. 13.

Next, as illustrated in FIG. 14, the insulating film 32 is formed on the insulating film 31 in which the plugs PG1 are buried, wiring trenches (opening portions) are formed in the insulating film 32, and the wiring M1 is formed inside the wiring trenches (opening portions) of the insulating film 32.

In order to form the wiring M1, for example, after the formation of the wiring trenches in the insulating film 32, the electrically-conductive barrier film (such as a tantalum film, a tantalum nitride film, or a stacked film of them) is formed on the insulating film 32 including the inside of the wiring trenches (opening portions) of the insulating film 32, and then, the main electrical-conductor film formed of a copper (Cu) film or others is formed on the electrically-conductive barrier film so as to fill the wiring trenches. Then, unnecessary main electrical-conductor film and electrically-conductive barrier film on the insulating film 32 are removed by a CMP method or others, so that the wiring M1 can be formed.

Next, the insulating film 33 and the insulating film 34 are formed in an order from a lower side on the insulating film 32 in which the wiring M1 is buried, the wiring trench of the insulating film 34 and the via hole of the insulating film 33 are formed, and the wiring M2 is formed inside the wiring trench of the insulating film 34 and the via hole of the insulating film 33.

In order to form the wiring M2, for example, after the formation of the wiring trench and the via hole in the insulating film 34 and the insulating film 33, an electrically-conductive barrier film (such as a tantalum film, a tantalum nitride film, or a stacked film of them) is formed on the insulating film 34 including the inside of the wiring trench and the via hole of the insulating films 34 and 33, and then, a main electrical-conductor film formed of a copper (Cu) film or others is formed on the electrically-conductive barrier film so as to fill the wiring trench and the via hole. Then, unnecessary main electrical-conductor film and electrically-conductive barrier film on the insulating film 34 are removed by a CMP method or others, so that the wiring M2 can be formed.

While an insulating film and wiring are similarly further formed on the insulating films 34 and 33 in which the wiring M2 is buried, illustration and explanation thereof will be omitted here.

<About Structure of Reference Resistor>

Next, a more specific structure (configuration) of the reference resistor Rst formed in the reference-resistor formation region 1B will be explained.

Figure 15:
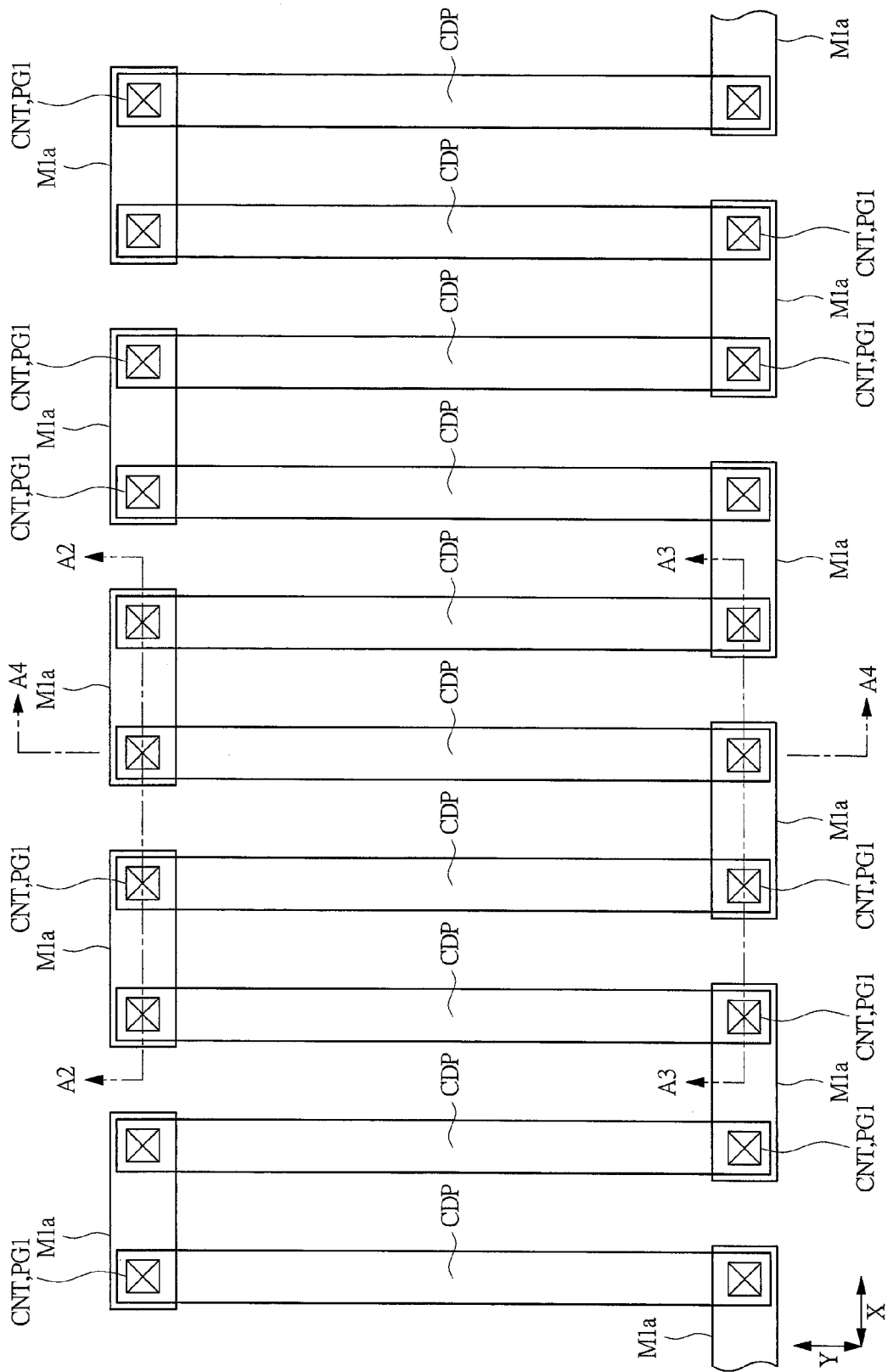
FIG. 15 is a plan view of a principal part of a semiconductor chip of an embodiment of the present invention.
Figure 16:
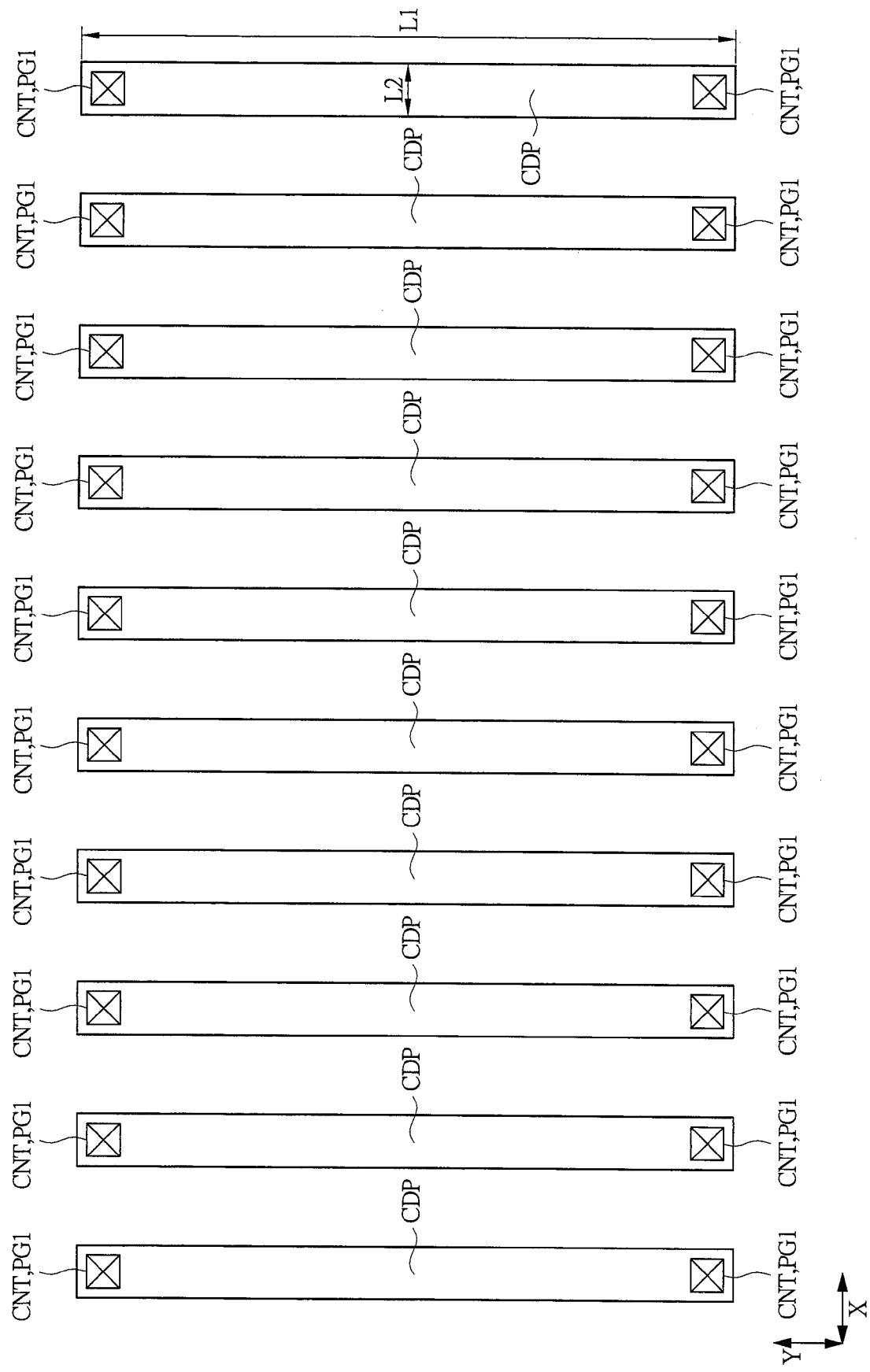
FIG. 16 is a plan view of a principal part of a semiconductor chip of the embodiment of the present invention.
Figure 17:
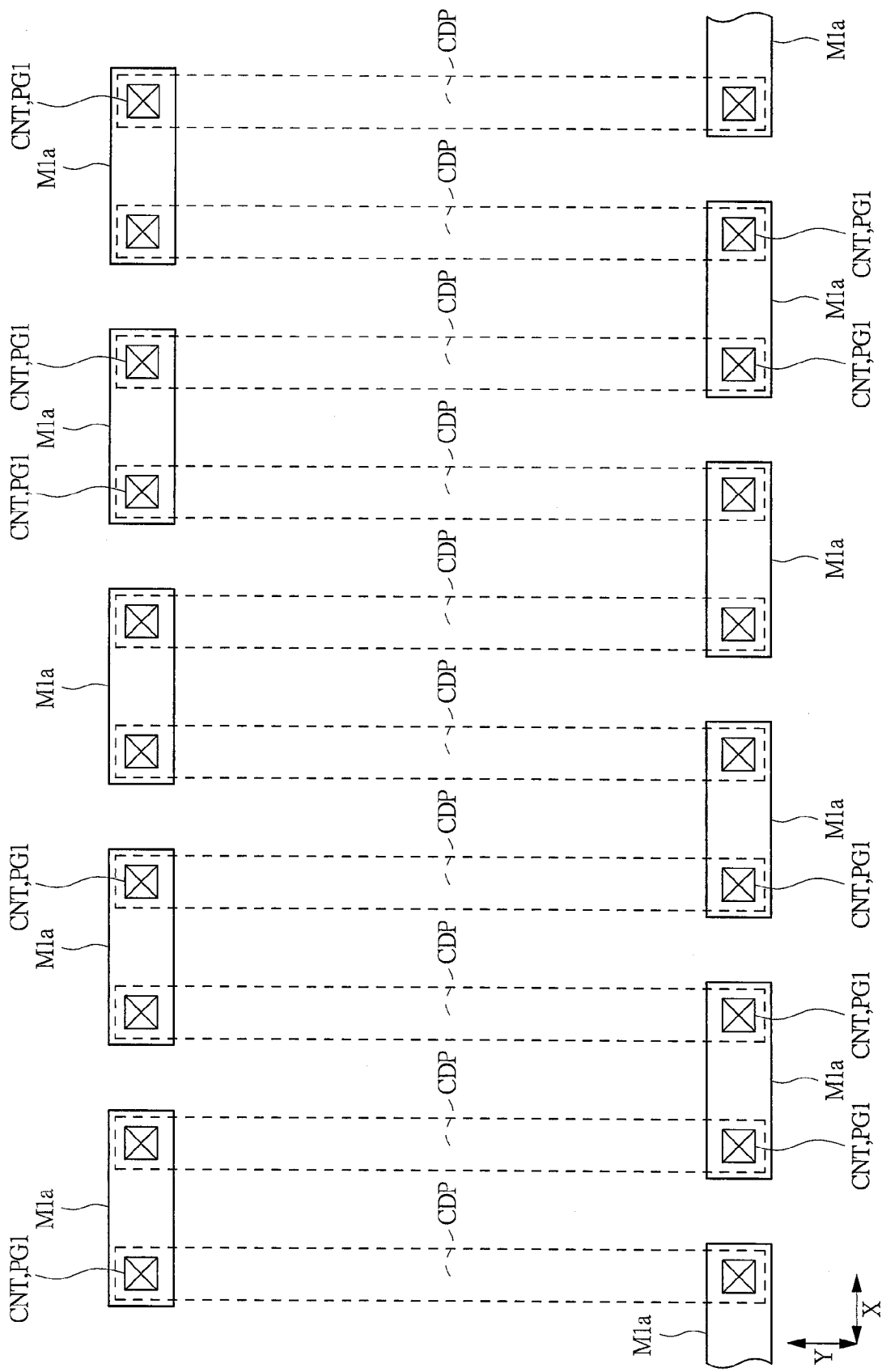
FIG. 17 is a plan view of a principal part of a semiconductor chip of the embodiment of the present invention.

FIGS. 15 to 17 are plan views of principal parts of the semiconductor chip CP1 of the present embodiment, and illustrate the same region as that of the above-described reference-resistor formation region 1B. Among FIGS. 15 to 17, while FIG. 15 illustrates a plan layout of the electrical-conductor pattern CDP, the contact hole CNT, the plug PG1, and the wiring M1, illustration of other configurations is omitted. While FIG. 16 illustrates a plan layout of the electrical-conductor pattern CDP, the contact hole CNT, and the plug PG1, illustration of other configurations is omitted. While FIG. 17 illustrates a plan layout of the electrical-conductor pattern CDP, the contact hole CNT, the plug PG1, and the wiring M1, illustration of other configurations is omitted although the electrical-conductor pattern CDP is illustrated by a dotted line. Note that the plug PG1 is buried inside the contact hole CNT, and therefore, the contact hole CNT and the plug PG1 are at the same position in plan view.

Figure 18:
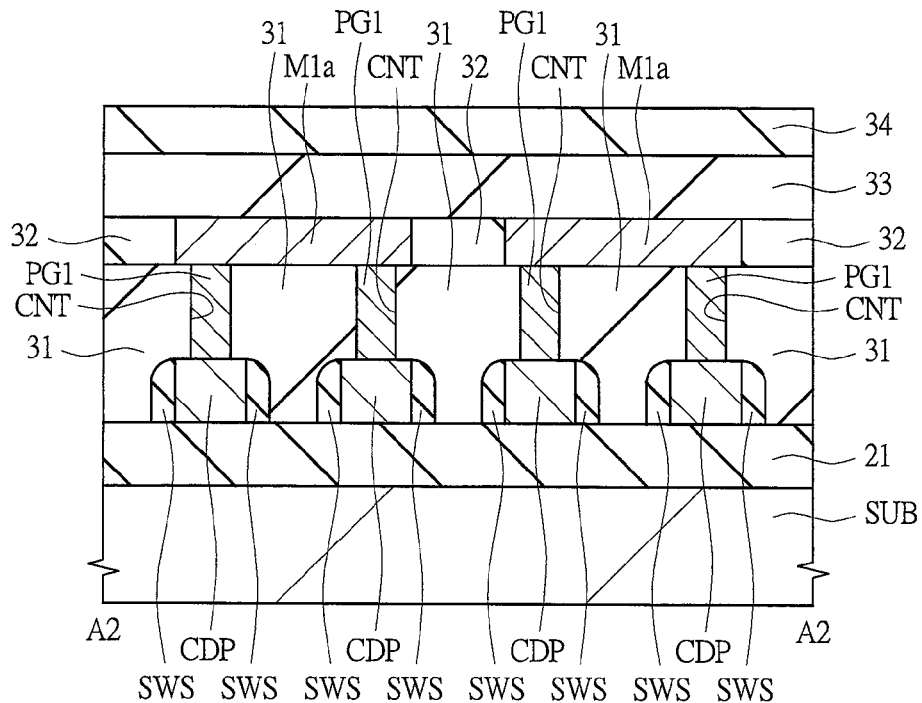
FIG. 18 is a cross-sectional view of a principal part of a semiconductor chip of the embodiment of the present invention.
Figure 19:
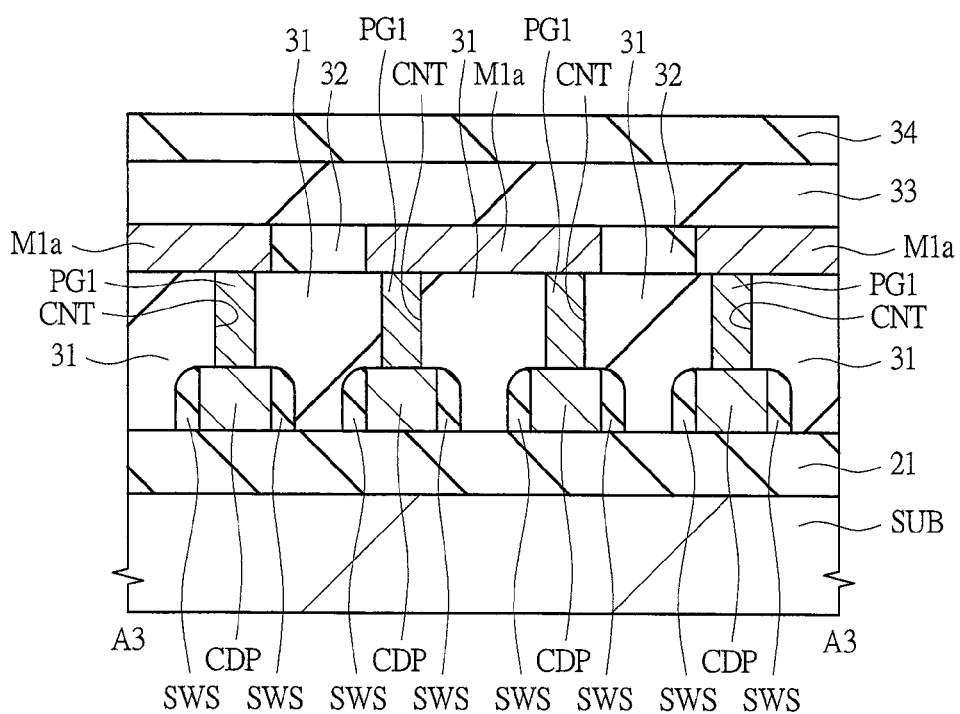
FIG. 19 is a cross-sectional view of a principal part of a semiconductor chip of the embodiment of the present invention.

Also, FIGS. 18 and 19 are cross-sectional views of principal parts of the semiconductor chip CP1 of the present embodiment, and illustrate the cross-sectional views of the above-described reference-resistor formation region 1B. Among FIGS. 18 and 19, FIG. 18 corresponds to a cross-sectional surface taken along a line A2-A2 of FIG. 15, and FIG. 19 corresponds to a cross-sectional surface taken along a line A3-A3 of FIG. 15. Note that the cross-sectional view of the reference-resistor formation region 1B illustrated in FIG. 8 described above is a cross-sectional view almost corresponding to a cross-sectional surface taken along a line A4-A4 of FIG. 15.

As illustrated in FIGS. 15 to 17 and others, in the reference-resistor formation region 1B, a plurality of (plurality of lines of) electrical-conductor patterns CDP extending in a Y direction are arranged at predetermined intervals (preferably, at equal intervals) in an X direction. Each of the plurality of electrical-conductor patterns CDP is an independent pattern. Here, the X direction and the Y direction are directions intersecting with each other, and preferably directions orthogonal to each other.

As illustrated in FIGS. 15 to 19, the above-described contact holes CNT are formed above both ends of each of the electrical-conductor patterns CDP extending in the Y direction, and the plug PG1 buried in the contact hole CNT is electrically connected to the wiring M1a of the above-described wiring M1. That is, the end portion of each of the electrical-conductor patterns CDP is electrically connected to the wiring M1a via the electrically-conductive plug PG1 filling the contact hole CNT. The wiring M1a is a wiring for connecting the plurality of electrical-conductor patterns CDP which are extending in the Y direction and arranged in the X direction in series to each other, and extends in the X direction so as to bridge between the end portions of the two electrical-conductor patterns CDP adjacent to each other in the X direction.

The electrical-conductor pattern CDP is preferably a linear pattern in which a Y-direction dimension L1 of the electrical-conductor pattern CDP (illustrated in FIG. 16) is larger than an X-direction dimension L2 of the electrical-conductor pattern CDP (illustrated in FIG. 16) (that is, a relation of "L1>L2"). The Y-direction dimension L1 of the electrical-conductor pattern CDP is more preferably 10 times the X-direction dimension L2 of the electrical-conductor pattern CDP or larger (that is, a relation of "L1≥L2×10").

The plurality of electrical-conductor patterns CDP extending in the Y direction are connected in series to each other via the plug PG1 and the wiring M1a buried in the contact hole CNT1. The connection relation will be specifically explained as follows.

In FIGS. 15 to 17, ten electrical-conductor patterns CDP are illustrated. It is assumed that, in an order from a right side of the drawing, the patterns are referred to as a first electrical-conductor pattern CDP, a second electrical-conductor pattern CDP, a third electrical-conductor pattern CDP, . . . , and a tenth electrical-conductor pattern CDP.

An end portion (an upper end portion in FIG. 16) of the first electrical-conductor pattern CDP and an end portion (an upper end portion in FIG. 16) of the second electrical-conductor pattern CDP adjacent to the end portion of the first electrical-conductor pattern in the X direction are electrically connected to each other via the plugs PG1 buried in the contact holes CNT (the contact holes CNT formed on the end portions) and the wiring M1a. The other end portion (a lower end portion in FIG. 16) of the second electrical-conductor pattern CDP and an end portion (a lower end portion in FIG. 16) of the third electrical-conductor pattern CDP adjacent to the other end portion of the second electrical-conductor pattern in the X direction are electrically connected to each other via the plugs PG1 buried in the contact holes CNT (the contact holes CNT formed on the end portions) and the wiring M1a. The other end portion (an upper end portion in FIG. 16) of the third electrical-conductor pattern CDP and an end portion (an upper end portion in FIG. 16) of the fourth electrical-conductor pattern CDP adjacent to the other end portion of the third electrical-conductor pattern in the X direction are electrically connected to each other via the plugs PG1 buried in the contact holes CNT (the contact holes CNT formed on the end portions) and the wiring M1a. The other end portion (a lower end portion in FIG. 16) of the fourth electrical-conductor pattern CDP and an end portion (a lower end portion in FIG. 16) of the fifth electrical-conductor pattern CDP adjacent to the other end portion of the fourth electrical-conductor pattern in the X direction are electrically connected to each other via the plugs PG1 buried in the contact holes CNT (the contact holes CNT formed on the end portions) and the wiring M1a. A similar connection relation is repeated to reach the tenth electrical-conductor pattern CDP, and the similar connection relation is further repeated for eleventh and subsequent electrical-conductor patterns CDP although illustrations thereof are omitted.

In this manner, the reference resistor Rst is formed by connecting the plurality of electrical-conductor patterns CDP extending in the Y direction in series to each other via the plugs PG1 buried in the contact holes CNT and the wirings M1a. That is, the reference resistor Rst is formed by connecting the plurality of independent electrical-conductor patterns CDP in series to each other via the plugs PG1 buried in the contact holes CNT and the wiring (wiring layer) M1 (specifically, the wirings M1a).

Each of the plurality of electrical-conductor patterns CDP configuring the reference resistor Rst can be regarded as a resistor, and the reference resistor Rst is formed by connecting the plurality of electrical-conductor patterns CDP each serving as the resistor. An extending direction of the resistor can be regarded as the Y direction which is the same as the extending direction of the electrical-conductor pattern CDP. Therefore, the formation of the reference resistor Rst by connecting (more specifically, connecting in series) the plurality of electrical-conductor patterns CDP extending in the Y direction to each other corresponds to the formation of the reference resistor Rst by connecting (more specifically, connecting in series) the plurality of resistors (the resistors corresponding to the electrical-conductor patterns CDP) extending in the Y-direction to each other.

Also, the reference resistor Rst is formed by connecting the plurality of electrical-conductor patterns CDP (that is, the plurality of resistors) to each other, and it is preferred to form the reference resistor Rst by connecting all of the electrical-conductor patterns CDP (resistors) in series to each other. However, the reference resistor Rst can be formed by connecting a part of the electrical-conductor patterns CDP (resistors) in parallel to the other while mainly employing the series connection. However, if the reference resistor Rst is formed by connecting all of the plurality of electrical-conductor patterns CDP (that is, the plurality of resistors) for forming the reference resistor Rst in series to each other, the number of the electrical-conductor patterns CDP can be reduced, and an area required for the arrangement of the reference resistor Rst can be reduced, and therefore, an area of the semiconductor chip CP1 can be reduced. The reduction of the area of the semiconductor chip CP1 results in downsizing of the semiconductor device (corresponding to the semiconductor device PKG) in which the semiconductor chip CP1 is sealed with the resin.

<About Arrangement of Reference Resistor in Semiconductor Chip>

Figure 20:
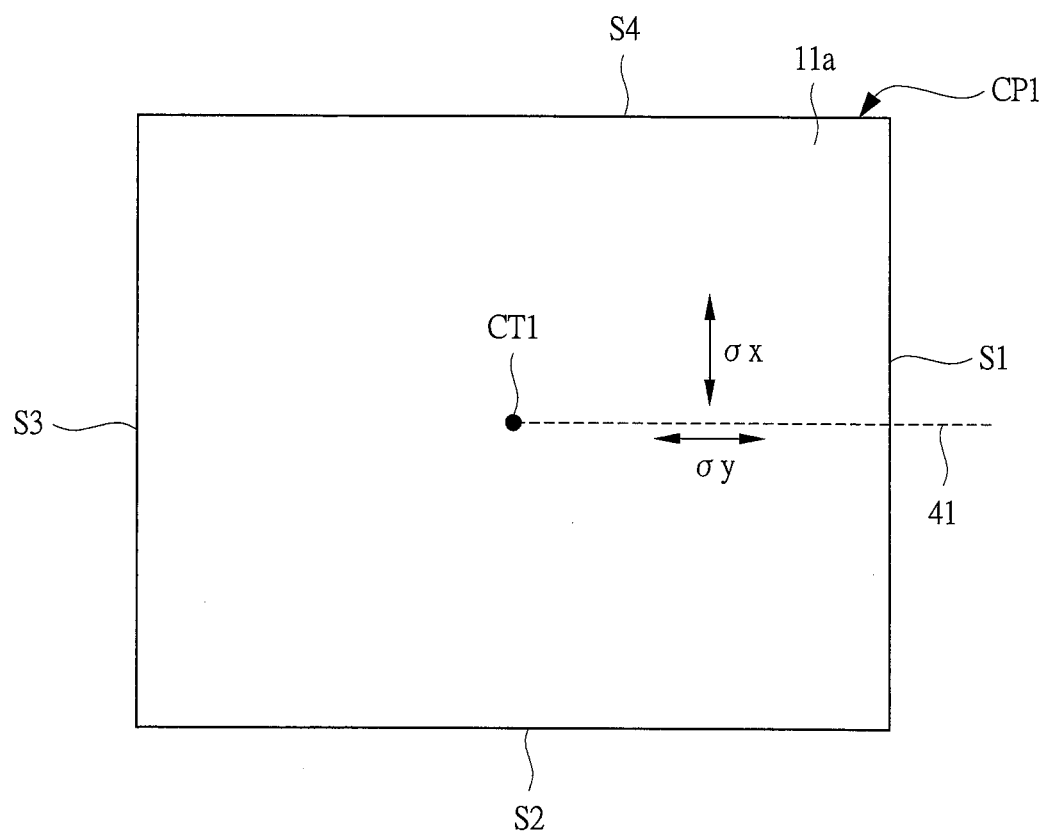
FIG. 20 is a plan view of a semiconductor chip of the embodiment of the present invention.

FIG. 20 is a plan view (top view) of the semiconductor chip CP1, and illustrates the main surface 11a side of the semiconductor chip CP1. As illustrated in FIG. 1 described above, note that the plurality of pad electrodes PD are arranged (aligned) along the four sides (sides S1, S2, S3, and S4) in the periphery of the main surface 11a of the semiconductor chip CP1. However, illustration of the pad electrodes PD is omitted in FIG. 20.

A planar shape of the semiconductor chip CP1 is a quadrangular shape, and is preferably a rectangular shape (including a square shape). It is assumed that the four sides configuring the quadrangular (rectangular) planar shape of the semiconductor chip CP1 are referred to as the sides S1, S2, S3, and S4. The side S1 and the side S3 are opposed to each other, and the side S2 and the side S4 are opposed to each other (more specifically, the side S1 and the side S3 are parallel to each other, and the side S2 and the side S4 are parallel to each other). Also, the side S1 intersects with (more specifically, is orthogonal to) the sides S2 and S4, the side S2 intersects with (more specifically, is orthogonal to) the sides S1 and S3, the side S3 intersects with (more specifically, is orthogonal to) the sides S2 and S4, and the side S4 intersects with (more specifically, is orthogonal to) the sides S1 and S3. Therefore, the four sides of the main surface 11a of the semiconductor chip CP1 correspond to the sides S1, S2, S3, and S4, respectively.

The above-described reference resistor Rst is formed inside the semiconductor chip CP1, and it is important to eliminate the variation factors of the resistance value of the reference resistor Rst as much as possible as described above. However, in the semiconductor device (semiconductor package) PKG of the resin sealed type in which the semiconductor chip CP1 is sealed with the resin, stress is caused in the semiconductor chip CP1 due to the sealing of the semiconductor chip CP1 with the resin.

More specifically, in the semiconductor device PKG of the resin sealed type in which the semiconductor chip CP1 is sealed with the resin, a thermal expansion coefficient of a molding resin (corresponding to the above-described sealing resin portion MR) which seals the semiconductor chip CP1 is larger than a thermal expansion coefficient of the semiconductor substrate (corresponding to the above-described semiconductor substrate SUB) configuring the semiconductor chip CP1. For example, while a thermal expansion coefficient of the single-crystal silicon substrate (corresponding to the above-described semiconductor substrate SUB) is about 3.5 ppm/° C., a thermal expansion coefficient of the molding resin (corresponding to the above-described sealing resin portion MR) is about 8 to 15 ppm/° C. In the molding step (resin sealing step) in the manufacturing of the semiconductor device PKG, the resin material is injected into a cavity of a mold for forming the sealing resin portion MR (at this time, the semiconductor chip CP1 is arranged inside the cavity), and then, the injected resin material is hardened, so that the sealing resin portion MR is formed. A temperature of the resin material in the injection into the cavity of the mold and the hardening is high as, for example, about 150 to 200° C., and is lowered (cooled) down to a room temperature after hardening of the resin material (after the formation of the sealing resin portion MR). A shrink amount of the sealing resin portion MR in this cooling is larger than a shrink amount of the semiconductor chip CP1 (due to a difference in the thermal expansion coefficient between the sealing resin portion MR and the semiconductor chip CP1), and therefore, stress (more particularly, compression stress) is applied to the semiconductor chip CP1. Therefore, in the semiconductor device (semiconductor package) PKG of the resin sealing type in which the semiconductor chip CP1 is sealed with the resin, the stress is caused in the semiconductor chip CP1 due to the sealing of the semiconductor chip CP1 with the resin.

When the stress is applied to the semiconductor chip CP1, there is a possibility that the resistance value of the reference resistor Rst embedded in the semiconductor chip CP1 is varied due to the stress. This is because, when the electrical-conductor patterns CDP configuring the reference resistor Rst are deformed by the stress, the resistance value is varied due to the deformation.

Accordingly, the present inventors have studied about reduction of influence on the electrical-conductor patterns CDP configuring the reference resistor Rst due to the stress as much as possible even when the stress is caused in the semiconductor chip CP1.

Figure 21:
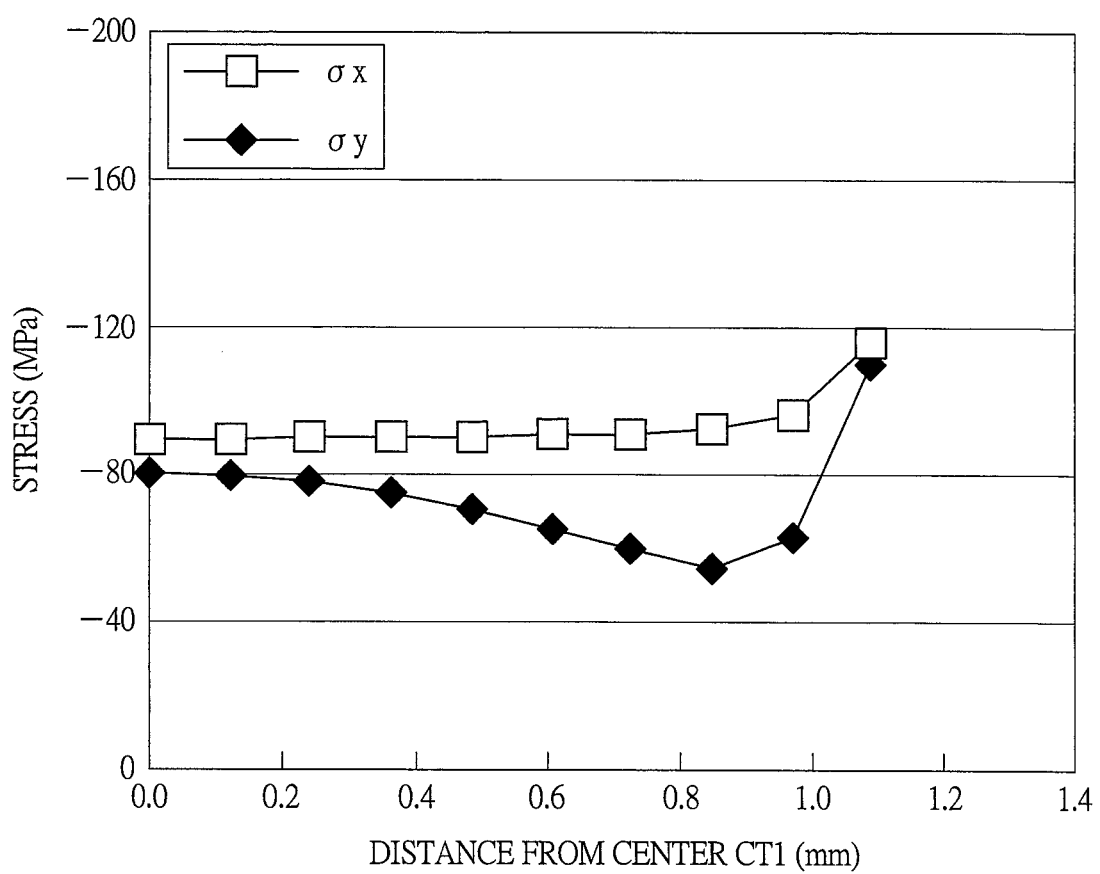
FIG. 21 is a graph illustrating simulated results of a stress caused in the semiconductor chip.

FIG. 21 is a graph illustrating a simulation result of the stress caused in the semiconductor chip CP1. Note that the graph of FIG. 21 illustrates the stress at a position along a dotted line 41 of FIG. 20, a horizontal axis of the graph of FIG. 21 corresponds to a distance from a center CT1 of the main surface 11a of the semiconductor chip CP1 at the position along the dotted line 41 thereof, and a vertical axis of the graph of FIG. 21 corresponds to the stress caused at the position along the dotted line 41 thereof. Here, the dotted line 41 corresponds to a line connecting the center CT1 of the main surface 11a of the semiconductor chip CP1 and a center (middle) of the side S1. Also, in the graph of FIG. 21, $\sigma x$ denoted by a square mark corresponds to the stress in a direction parallel to the side S1 (also a direction parallel to the main surface 11a of the semiconductor chip CP1), and $\sigma y$ denoted by a diamond mark corresponds to the stress in a direction perpendicular to the side S1 (but a direction parallel to the main surface 11a of the semiconductor chip CP1).

As seen from the graph of FIG. 21, in the stress at the position along the dotted line 41 of FIG. 20, the stress $\sigma y$ in the direction perpendicular to the side S1 is smaller than the stress $\sigma x$ in the direction parallel to the side S1 (that is, a relation of "$|\sigma x|>|\sigma y|$"). The stress caused in the semiconductor chip CP1 is the compression stress (the stress value is a minus (negative) value). In the present embodiment and the following second to fourth embodiments, "a small stress" means "a small absolute value of the stress".

Figure 22:
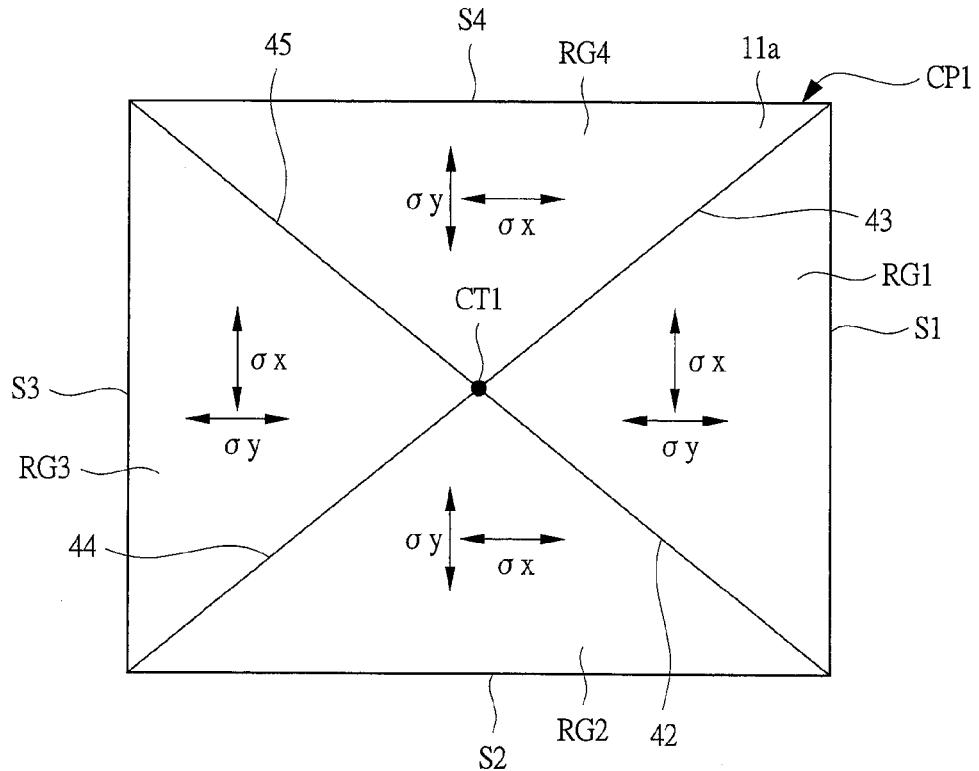
FIG. 22 is a plan view of a semiconductor chip of the embodiment of the present invention.

As similar to FIG. 20, FIG. 22 is a plan view (top view) of the semiconductor chip CP1, and illustrates the main surface 11a side of the semiconductor chip CP1 so that the main surface 11a of the semiconductor chip CP1 is virtually divided into four regions RG1, RG2, RG3, and RG4.

In FIG. 22, a line 42 is a line connecting between one end of the side S1 (corresponding to a corner formed by the side S1 and the side S2) and the center CT1 of the main surface 11a of the semiconductor chip CP1, and a line 43 is a line connecting between the other end of the side S1 (corresponding to a corner formed by the side S1 and the side S4) and the center CT1 of the main surface 11a of the semiconductor chip CP1. Also, a line 44 is a line connecting between one end of the side S3 (corresponding to a corner formed by the side S2 and the side S3) and the center CT1 of the main surface 11a of the semiconductor chip CP1, and a line 45 is a line connecting between the other end of the side S3 (corresponding to a corner formed by the side S3 and the side S4) and the center CT1 of the main surface 11a of the semiconductor chip CP1. Note that the line 42 can be also regarded as a line connecting between the one end of the side S2 (corresponding to the corner formed by the side S1 and the side S2) and the center CT1 of the main surface 11a of the semiconductor chip CP1, and the line 44 can be also regarded as a line connecting between the other end of the side S2 (corresponding to the corner formed by the side S2 and the side S3) and the center CT1 of the main surface 11a of the semiconductor chip CP1. Also, the line 43 can be also regarded as the line connecting between the one end of the side S4 (corresponding to the corner formed by the side S1 and the side S4) and the center CT1 of the main surface 11a of the semiconductor chip CP1, and the line 45 can be also regarded as the line connecting between the other end of the side S4 (corresponding to the corner formed by the side S3 and the side S4) and the center CT1 of the main surface 11a of the semiconductor chip CP1.

And, the region RG1 is a region (planar region) surrounded by the side S1, the line 42, and the line 43, the region RG2 is a region (planar region) surrounded by the side S2, the line 42, and the line 44, the region RG3 is a region (planar region) surrounded by the side S3, the line 44, and the line 45, and the region RG4 is a region (planar region) surrounded by the side S4, the line 43, and the line 45. Since these four regions RG1, RG2, RG3, and RG4 are regions obtained by virtually dividing the main surface 11a of the semiconductor chip CP1, boundaries are actually not formed among the regions RG1, RG2, RG3, and RG4, respectively.

Further, in another viewpoint, the main surface 11a of the semiconductor chip CP1 is divided into the four regions RG1, RG2, RG3, and RG4 by the lines 42, 43, 44, and 45 connecting between the four corners of the main surface 11a of the semiconductor chip CP1 (the four corners of the rectangular main surface 11a) and the center CT1 of the main surface 11a, respectively. Among the regions RG1, RG2, RG3, and RG4, the region RG1 is a region in contact with the side S1, the region RG2 is a region in contact with the side S2, the region RG3 is a region in contact with the side S3, and the region RG4 is a region in contact with the side S4.

A tendency of the stress in the graph of FIG. 21 is applied to each of the regions RG1, RG2, RG3, and RG4, and the stress in each of the regions RG1, RG2, RG3, and RG4 is as follows. That is, in the region RG1, the stress σy in the direction perpendicular to the side S1 is smaller than the stress σx in the direction parallel to the side S1 (that is, the relation of "|σx|>|σy|"). Also, in the region RG2, the stress σy in the direction perpendicular to the side S2 is smaller than the stress σx in the direction parallel to the side S2 (that is, the relation of "|σx|>|σy|"). Further, in the region RG3, the stress σy in the direction perpendicular to the side S3 is smaller than the stress σx in the direction parallel to the side S3 (that is, the relation of "|σx|>|σy|"). Still further, in the region RG4, the stress σy in the direction perpendicular to the side S4 is smaller than the stress σx in the direction parallel to the side S4 (that is, the relation of "|σx|>|σy|").

In consideration of such stress distribution, in the present embodiment, a developed arrangement of the reference resistor Rst embedded in the semiconductor chip CP1 is made as follows. As similar to FIG. 21, FIG. 23 is a plan view (top view) of the semiconductor chip CP1, and illustrates the main surface 11a side of the semiconductor chip CP1 so that the main surface 11a of the semiconductor chip CP1 is virtually divided into four regions RG1, RG2, RG3, and RG4.

Figure 23:
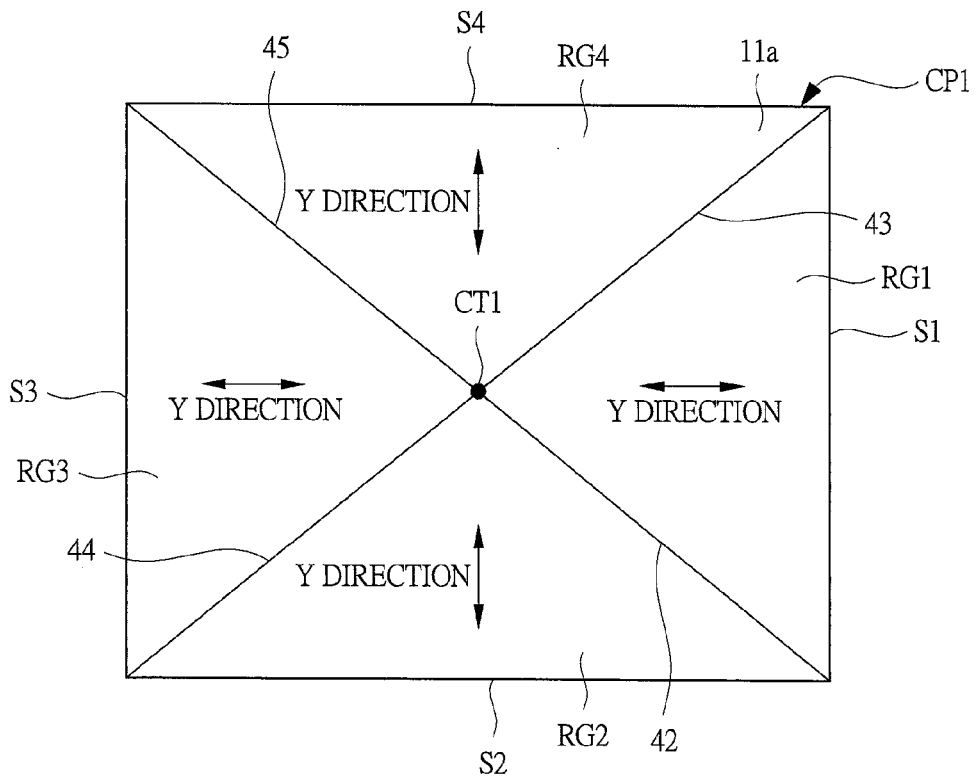
FIG. 23 is a plan view of a semiconductor chip of the embodiment of the present invention.

As illustrated also in FIG. 23, in the semiconductor chip CP1, if the reference resistor Rst is formed (arranged) in the region RG1, the above-described Y direction which is the extending direction of the above-described electrical-conductor patterns CDP configuring the reference resistor Rst is set to the direction perpendicular to the side S1. Also, in the semiconductor chip CP1, if the reference resistor Rst is formed (arranged) in the region RG2, the above-described Y direction which is the extending direction of the above-described electrical-conductor patterns CDP configuring the reference resistor Rst is set to the direction perpendicular to the side S2. In the semiconductor chip CP1, if the reference resistor Rst is formed (arranged) in the region RG3, the above-described Y direction which is the extending direction of the above-described electrical-conductor patterns CDP configuring the reference resistor Rst is set to the direction perpendicular to the side S3. In the semiconductor chip CP1, if the reference resistor Rst is formed (arranged) in the region RG4, the above-described Y direction which is the extending direction of the above-described electrical-conductor patterns CDP configuring the reference resistor Rst is set to the direction perpendicular to the side S4. A reason of such setting is as follows.

In order to prevent the influence on the electrical conductor patterns CDP configuring the reference resistor Rst due to the stress, it is effective to set the extending direction of these electrical-conductor patterns CDP (the above-described Y direction here) to the direction of the small stress. This is because the electrical conductor patterns CDP in acting the stress are stretched/shrunk in the extending direction (corresponding to the Y direction) easier than a cross-sectional direction (corresponding to a direction perpendicular to the extending direction (corresponding to the Y direction)). That is, in acting the stress having the same magnitude in the cross-sectional direction and the extending direction of the electrical-conductor patterns CDP, while the electrical-conductor patterns CDP are difficult to stretch/shrink in the cross-sectional direction, they are easy to stretch/shrink in the extending direction. In the region RG1, as described above, the stress σy in the direction perpendicular to the side S1 is smaller than the stress σx in the direction parallel to the side S1 (that is, the relation of "|σx|>|σy|"). Therefore, by setting the above-described Y direction which is the extending direction of the above-described electrical-conductor patterns CDP configuring the reference resistor Rst to the direction perpendicular to the side S1 (corresponding to the direction of the small stress), the influence of the stress on the electrical-conductor patterns CDP (which is the deformation of the electrical-conductor patterns CDP) can be reduced. On the other hand, as different from the present embodiment, in the region RG1, if the above-described Y direction which is the extending direction of the above-described electrical-conductor patterns CDP configuring the reference resistor Rst is set to the direction parallel to the side S1 (corresponding to a direction of a large stress), the influence of the stress on the electrical-conductor patterns CDP (which is the deformation of the electrical-conductor patterns CDP) is increased, and therefore, the resistance value of the reference resistor Rst is easy to be varied. As described above, if the reference resistor Rst is formed (arranged) in the region RG1 in the semiconductor chip CP1, the above-described Y direction which is the extending direction of the above-described electrical-conductor patterns CDP configuring the reference resistor Rst is set to the direction perpendicular to the side S1 (corresponding to the direction of the small stress), so that the influence of the stress on the electrical-conductor patterns CDP can be reduced, and therefore, the variation in the resistance value of the reference resistor Rst due to the stress can be suppressed or prevented.

The regions R2, R3, and R4 can be considered as similar to the region RG1. That is, in the semiconductor chip CP1, if the reference resistor Rst is formed (arranged) in the region RG2, the above-described Y direction which is the extending direction of the above-described electrical-conductor patterns CDP configuring the reference resistor Rst is set to the direction perpendicular to the side S2 (corresponding to the direction of the small stress), so that the influence of the stress on the electrical-conductor patterns CDP can be reduced, and therefore, the variation in the resistance value of the reference resistor Rst due to the stress can be suppressed or prevented. Further, in the semiconductor chip CP1, if the reference resistor Rst is formed (arranged) in the region RG3, the above-described Y direction which is the extending direction of the above-described electrical-conductor patterns CDP configuring the reference resistor Rst is set to the direction perpendicular to the side S3 (corresponding to the direction of the small stress), so that the influence of the stress on the electrical-conductor patterns CDP can be reduced, and therefore, the variation in the resistance value of the reference resistor Rst due to the stress can be suppressed or prevented. Still further, in the semiconductor chip CP1, if the reference resistor Rst is formed (arranged) in the region RG4, the above-described Y direction which is the extending direction of the above-described electrical-conductor patterns CDP configuring the reference resistor Rst is set to the direction perpendicular to the side S4 (corresponding to the direction of the small stress), so that the influence of the stress on the electrical-conductor patterns CDP can be reduced, and therefore, the variation in the resistance value of the reference resistor Rst due to the stress can be suppressed or prevented.

Note that the Y direction and the above-described X direction are orthogonal to each other as described above. Therefore, if the Y direction is set to a direction orthogonal to the side S1, the above-described X direction is the direction parallel to the side S1. If the Y direction is set to a direction orthogonal to the side S2, the above-described X direction is the direction parallel to the side S2. If the Y direction is set to a direction orthogonal to the side S3, the above-described X direction is the direction parallel to the side S3. If the Y direction is set to a direction orthogonal to the side S4, the above-described X direction is the direction parallel to the side S4.

Also, when the semiconductor chip CP1 is designed, the designing is made so that the arrangement position of the reference resistor Rst in the semiconductor chip CP1 and the extending direction (corresponding to the above-described Y direction) of the electrical-conductor patterns CDP (resistors) configuring the reference resistor Rst are associated with each other as described above.

In this manner, the reference resistor Rst is formed inside the semiconductor chip CP1 by developing the relation between the arrangement position of the reference resistor Rst and the extending direction (corresponding to the above-described Y direction) of the electrical-conductor patterns CDP (resistors) configuring the reference resistor Rst as described above, so that the influence of the stress on the electrical-conductor patterns CDP can be reduced, and therefore, the variation in the resistance value of the reference resistor Rst due to the stress can be suppressed or prevented. In this manner, the performance of the semiconductor device (corresponding to the above-described semiconductor device PKG) in which the semiconductor chip CP1 having the oscillation circuit is sealed with the resin can be improved. This is also similar to the following second to fourth embodiments.

As seen from the graph of FIG. 21 described above, the stress is larger in the outer periphery of the main surface 11a of the semiconductor chip CP1 than a region other than the outer periphery thereof. That is, in the main surface 11a of the semiconductor chip CP1, the stress is particularly large in the outer periphery. In order to suppress or prevent the variation in the resistance value of the reference resistor Rst due to the stress, it is desired to arrange the reference resistor Rst so as to avoid a position at which the stress is large. Therefore, it is preferred to form (arrange) the reference resistor Rst at a position which is 0.1 mm or farther away from the respective sides S1, S2, S3, and S4. That is, if the reference resistor Rst is formed (arranged) in the region RG1, it is preferred to form (arrange) the reference resistor Rst at a position which is 0.1 mm or farther away from the side S1. Also, if the reference resistor Rst is formed (arranged) in the region RG2, it is preferred to form (arrange) the reference resistor Rst at a position which is 0.1 mm or farther away from the side S2. Further, if the reference resistor Rst is formed (arranged) in the region RG3, it is preferred to form (arrange) the reference resistor Rst at a position which is 0.1 mm or farther away from the side S3. Still further, if the reference resistor Rst is formed (arranged) in the region RG4, it is preferred to form (arrange) the reference resistor Rst at a position which is 0.1 mm or farther away from the side S4.

Figure 24:
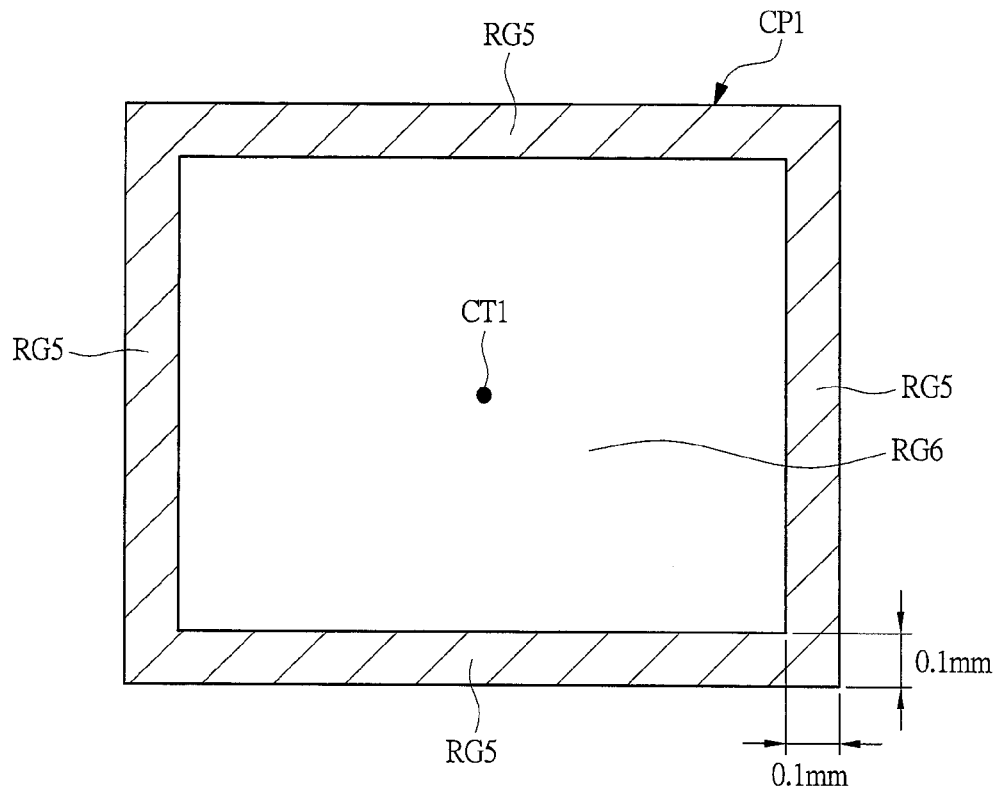
FIG. 24 is a plan view of a semiconductor chip of the embodiment of the present invention.

As similar to FIGS. 21 and 23 described above, FIG. 24 is a plan view (top view) of the semiconductor chip CP1, and illustrates the main surface 11a side of the semiconductor chip CP1 so that hatching is added to a region RG5 which is within 0.1 mm away from the respective sides S1, S2, S3, and S4 in order to easily see the drawing although it is the plan view. In FIG. 24, a region RG6 without the hatching corresponds to a region RG6 which is 0.1 mm or farther away from the respective sides S1, S2, S3, and S4. These two regions RG5 and RG6 are virtually-divided regions, and a boundary is not actually formed between the regions RG5 and RG6.

As described above, it is preferred to form (arrange) the reference resistor Rst at the position which is 0.1 mm or farther away from the respective sides S1, S2, S3, and S4, and this formation corresponds to formation (arrangement) of the reference resistor Rst in not the region RG5 but the region RG6. In the semiconductor chip CP1, the stress particularly tends to cause in the region RG5, and therefore, the reference resistor Rst is formed (arranged) in the region RG6 having the relatively smaller stress than that of the region RG5 although the reference resistor Rst is not formed (arranged) in the region RG5, so that the variation in the resistance value of the reference resistor Rst due to the stress can be accurately suppressed or prevented. In this manner, the performance of the semiconductor device (corresponding to the above-described semiconductor device PKG) in which the semiconductor chip CP1 having the oscillation circuit is sealed with the resin can be accurately improved. This is also similar to the following second to fourth embodiments.

Also, as illustrated in the graph of FIG. 21 described above, in the stress at the position along the dotted line 41 in FIG. 20, the stresses in both of the stress σx in the direction parallel to the side S1 and the stress σy in the direction perpendicular to the side S1 are large in the outer periphery of the main surface 11a of the semiconductor chip CP1 (corresponding to the above-described region RG5). On the other hand, when the region other than the outer periphery of the main surface 11a of the semiconductor chip CP1 (corresponding to the above-described region RG6) is focused, in the stress at the position along the dotted line 41 in FIG. 20, the stress σx in the direction parallel to the side S1 is almost constant as long as inside the above-described region RG6. However, the stress σy in the direction perpendicular to the side S1 is smaller as away farther from the center CT1.

Although influence due to the stress σx in the direction parallel to the side S1 can be suppressed or prevented by setting the above-described Y direction which is the extending direction of the electrical-conductor patterns CDP configuring the reference resistor Rst to the direction perpendicular to the side S1 as described above, influence due to the stress σy in the direction perpendicular to the side S1 is caused even in this case. Therefore, in order to reduce the influence due to the stress σy in the direction perpendicular to the side S1 as much as possible, it is effective to form (arrange) the reference resistor Rst in a region where the stress σy in the direction perpendicular to the side S1 is small as much as possible.

Figure 25:
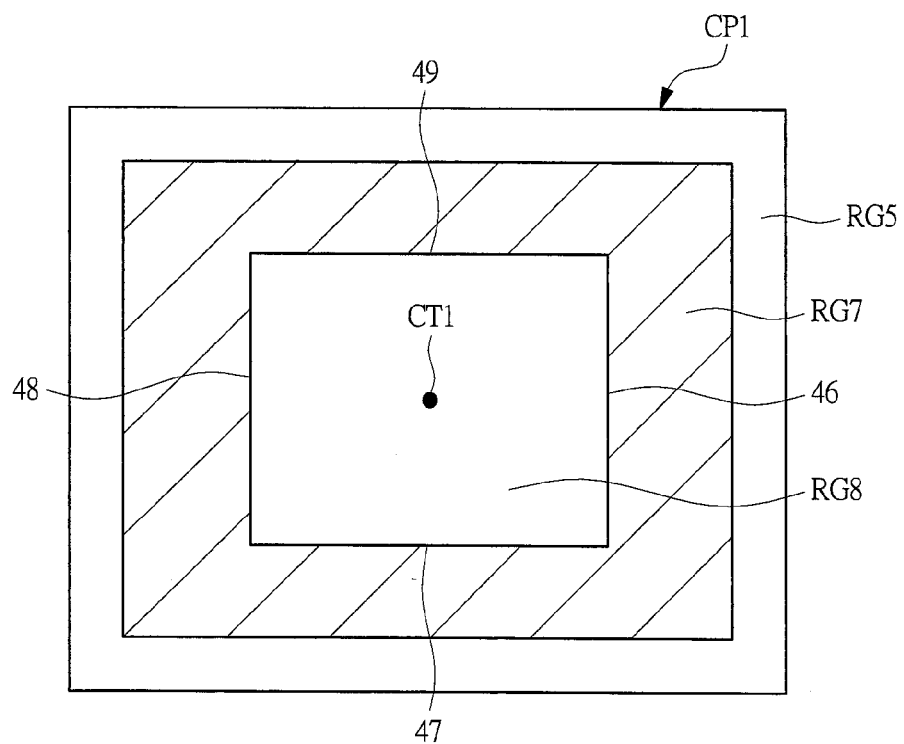
FIG. 25 is a plan view of a semiconductor chip of the embodiment of the present invention.

Accordingly, it is further preferred to form (arrange) the reference resistor Rst in a region RG7 illustrated in FIG. 25. As similar to FIGS. 21, 23, and 24 described above, FIG. 25 is a plan view (top view) of the semiconductor chip CP1, and illustrates the main surface 11a side of the semiconductor chip CP1 so that hatching is added to the region RG7 in order to easily see the drawing even if it is the plan view. The region RG7 is a virtually-divided region, and a boundary is not actually formed between the region RG7 and other regions.

Here, the region RG7 is a region of the above-described region RG6, which is on a closer side to the side S1 than a line 46 connecting between the center of the above-described line 42 and the center of the above-described line 43, on a closer side to the side S2 than a line 47 connecting between the center of the above-described line 42 and the center of the above-described line 44, on a closer side to the side S3 than a line 48 connecting between the center of the above-described line 44 and the center of the above-described line 45, and on a closer side to the side S4 than a line 49 connecting between the center of the above-described line 43 and the center of the above-described line 45. A region obtained by adding a region RG8 surrounded by the lines 46, 47, 48, and 49 to the region RG7 corresponds to the above-described region RG6.

Therefore, if the reference resistor Rst is formed (arranged) in the region RG1, the formation (arrangement) of the reference resistor Rst in the region RG7 corresponds to formation (arrangement) of the reference resistor Rst at a position of the region RG1 which is 0.1 mm or farther away from the side S1, and besides, on a closer side to the side S1 than the line 46 connecting between the center of the above-described line 42 and the center of the above-described line 43. Also, if the reference resistor Rst is formed (arranged) in the region RG2, the formation (arrangement) of the reference resistor Rst in the region RG7 corresponds to formation (arrangement) of the reference resistor Rst at a position of the region RG2 which is 0.1 mm or farther away from the side S2, and besides, on a closer side to the side S2 than the line 47 connecting between the center of the above-described line 42 and the center of the above-described line 44. Further, if the reference resistor Rst is formed (arranged) in the region RG3, the formation (arrangement) of the reference resistor Rst in the region RG7 corresponds to formation (arrangement) of the reference resistor Rst at a position of the region RG3 which is 0.1 mm or farther away from the side S3, and besides, on a closer side to the side S3 than the line 48 connecting between the center of the above-described line 44 and the center of the above-described line 45. Still further, if the reference resistor Rst is formed (arranged) in the region RG4, the formation (arrangement) of the reference resistor Rst in the region RG7 corresponds to formation (arrangement) of the reference resistor Rst at a position of the region RG4 which is 0.1 mm or farther away from the side S4, and besides, on a closer side to the side S4 than the line 49 connecting between the center of the above-described line 43 and the center of the above-described line 45.

While the stress σx is almost the same (constant) in the region RG7 and the region RG8, the stress σy is smaller in the region RG7 than the region RG8. Therefore, the reference resistor Rst is formed (arranged) in the region RG7 having the stress σy smaller than that of the region RG8 although the reference resistor Rst is not formed (arranged) in the region RG8 having the stress σy larger than that of the region RG7, so that the stress σy which acts on the above-described electrical-conductor patterns CDP configuring the reference resistor Rst can be reduced, and therefore, the variation in the resistance value of the reference resistor Rst due to the stress can be further accurately suppressed or prevented. In this manner, the performance of the semiconductor device (corresponding to the above-described semiconductor device PKG) in which the semiconductor chip CP1 having the oscillation circuit is sealed with the resin can be further accurately improved. This is also similar to the following second to fourth embodiments.

Modification Example

Next, a first modification example of the present first embodiment will be explained.

Figure 26:
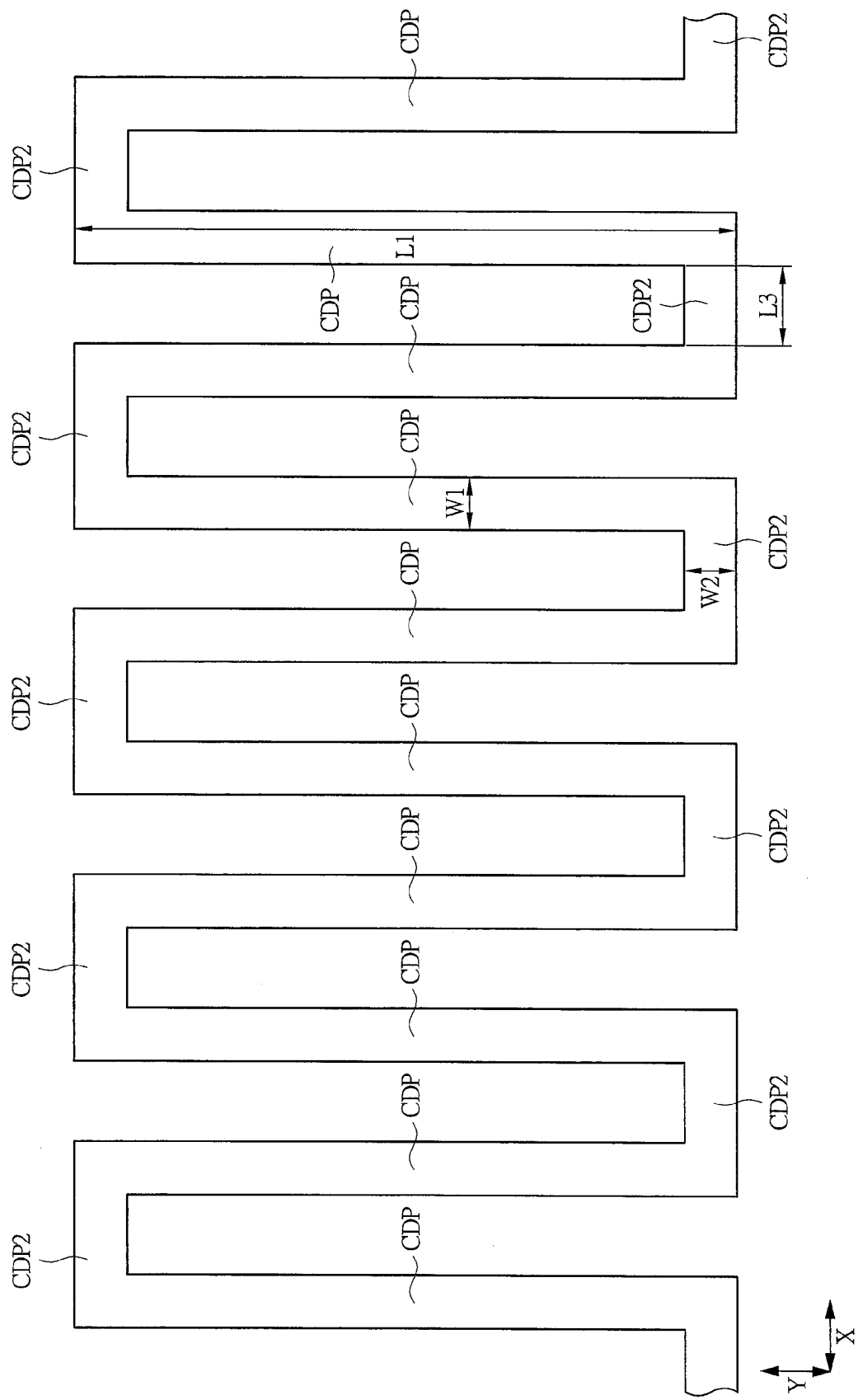
FIG. 26 is a plan view of a principal part of a first modification example of the semiconductor chip of the embodiment of the present invention.

FIG. 26 is a plan view of a principal part of a semiconductor device (semiconductor chip CP1) of the first modification example of the present embodiment, corresponds to FIG. 15 described above, and illustrates the same region as those of FIGS. 15 to 17 described above (the region corresponding to the above-described reference-resistor formation region 1B).

The cases of FIGS. 15 to 19 described above and the case of FIG. 26 (the first modification example) are different from each other in the following point.

That is, in the cases of FIGS. 15 to 19 described above, the plurality of electrical-conductor patterns CDP extending in the Y direction are aligned at the predetermined intervals in the X direction, the electrical-conductor patterns CDP adjacent to each other in the X direction are the independent patterns (isolated patterns) separated from each other, and the electrical-conductor patterns CDP adjacent to each other in the X direction are electrically connected to each other by the wiring M1a. On the other hand, in the case of FIG. 26 (the first modification example), while the plurality of electrical-conductor patterns CDP extending in the Y direction are aligned at predetermined intervals in the X direction, the electrical-conductor patterns CDP adjacent to each other in the X direction are not independent patterns (isolated patterns) separated from each other. And, the electrical-conductor patterns CDP adjacent to each other in the X direction are electrically connected to each other so as to be continued in series to each other by a connecting portion CDP2 which is integrally formed with the electrical-conductor patterns CDP (in the same layer as that of the electrical-conductor patterns CDP).

The case of FIG. 26 (the first modification example) is explained in more detail as follows.

In FIG. 26, ten electrical-conductor patterns CDP are illustrated. It is assumed that, in an order from a right side of the drawing, the patterns are referred to as a first electrical-conductor pattern CDP, a second electrical-conductor pattern CDP, a third electrical-conductor pattern CDP, ..., and a tenth electrical-conductor pattern CDP.

An end portion (an upper end portion in FIG. 26) of the first electrical-conductor pattern CDP and an end portion (an upper end portion in FIG. 26) of the second electrical-conductor pattern CDP adjacent to the end portion of the first electrical-conductor pattern in the X direction are electrically connected so as to be continued to each other by a connecting portion CDP2 integrally formed with the first and second electrical-conductor patterns CDP. The other end portion (a lower end portion in FIG. 26) of the second electrical-conductor pattern CDP and an end portion (a lower end portion in FIG. 26) of the third electrical-conductor pattern CDP adjacent to the other end portion of the second electrical-conductor pattern in the X direction are electrically connected so as to be continued to each other by a connecting portion CDP2 integrally formed with the second and third electrical-conductor patterns CDP. The other end portion (an upper end portion in FIG. 26) of the third electrical-conductor pattern CDP and an end portion (an upper end portion in FIG. 26) of the fourth electrical-conductor pattern CDP adjacent to the other end portion of the third electrical-conductor pattern in the X direction are electrically connected so as to be continued to each other by a connecting portion CDP2 integrally formed with the third and fourth electrical-conductor patterns CDP. The other end portion (a lower end portion in FIG. 26) of the fourth electrical-conductor pattern CDP and an end portion (a lower end portion in FIG. 26) of the fifth electrical-conductor pattern CDP adjacent to the other end portion of the fourth electrical-conductor pattern in the X direction are electrically connected so as to be continued to each other by a connecting portion CDP2 integrally formed with the fourth and fifth electrical-conductor patterns CDP. A similar connection relation is repeated to reach the tenth electrical-conductor pattern CDP, and the similar connection relation is further repeated for eleventh and subsequent electrical-conductor patterns CDP although illustrations thereof are omitted. The connecting portions CDP2 are electrical-conductor patterns formed in the same layer and the same step as those of the electrical-conductor patterns CDP, and extend in the X direction. That is, in an order of the electrical-conductor pattern CDP extending in the Y direction, the connecting portion CDP2 extending in the X direction, the electrical-conductor CDP extending in the Y direction, the connecting portion CDP2 extending in the X direction, and . . . , they are sequentially continued to form the reference resistor Rst. Since the connecting portions CDP2 are integrally formed with the electrical-conductor patterns CDP, the connecting portions are made of the same material (more specifically, the above-described polycrystalline silicon film 24) as that of the electrical-conductor patterns CDP.

That is, the cases of FIGS. 15 to 19 described above and the case of FIG. 26 (the first modification example) are common to each other in that the plurality of electrical-conductor patterns CDP extending in the Y direction are aligned at the predetermined intervals in the X direction so as to be connected (more specifically, connected in series) to each other to form the reference resistor Rst. However, in the cases of FIGS. 15 to 19 described above, the electrical-conductor patterns CDP extending in the Y direction are connected (electrically connected) to each other by the wiring M1a which is the electrical-conductor patterns in a different layer from that of the electrical-conductor patterns CDP. On the other hand, in the case of FIG. 26 (the first modification example), the electrical-conductor patterns CDP extending in the Y direction are connected (electrically connected) to each other by the connecting portion CDP2 which is the electrical-conductor pattern in the same layer as that of the electrical-conductor patterns CDP. Both of them (the cases of FIGS. 15 to 19 and the case of FIG. 26) are different from each other in this point.

As described above, by setting the Y direction which is the extending direction of the electrical-conductor patterns CDP to not the direction of the large stress (the direction of the stress σx) but the direction of the small stress (the direction of the stress σy), the variation in the resistance value of the reference resistor Rst due to the stress can be suppressed or prevented. This is because the resistance value of the reference resistor Rst is mainly defined by the plurality of electrical-conductor patterns CDP extending in the Y direction, and a resistance component of the above-described wiring M1a or the above-descried connecting portion CDP2 for connecting between the plurality of electrical-conductor patterns CDP extending in the Y direction is sufficiently smaller than the resistance value of the electrical-conductor patterns CDP extending in the Y direction. For example, if the resistance value of the connecting portion CDP2 extending in the X direction is larger than the resistance value of the electrical-conductor pattern CDP extending in the Y direction, the resistance value of the connecting portion CDP2 extending in the X direction is varied due to the influence of the stress σx, and therefore, it is concerned that the variation in the resistance value of the reference resistor Rst cannot be suppressed.

Therefore, it is preferred that the resistance value of the above-described wiring M1a or the above-described connecting portion CDP2 is sufficiently smaller than the resistance value of the electrical-conductor pattern CDP extending in the Y direction. From this point of view, it is preferred that the resistance (resistance value) of the above-described wiring M1a or the above-described connecting portion CDP2 for connecting between the electrical-conductor patterns CDP adjacent to each other in the X direction is equal to or less than one-tenth the resistance (resistance value) of the electrical-conductor pattern CDP. That is, the resistance (resistance value) of one wiring M1a or one connecting portion CDP2 described above for connecting the two electrical-conductor patterns CDP is preferably equal to or less than one-tenth the resistance (resistance value) of one electrical-conductor pattern CDP. In this manner, even if the resistance value of the wiring M1a or the connecting portion CDP2 extending in the X direction is varied due to the influence of the stress σx, the resistance value of the reference resistor Rst is difficult to be affected, and therefore, the variation in the resistance value of the reference resistor Rst due to the stress can be further accurately suppressed or prevented. This is also similar to the following second to fourth embodiments. However, in the second and third embodiments described below, a wiring M2a described below corresponds to the wiring M1a described above.

In the case of FIG. 26 (the first modification example), an X-direction dimension L3 of the connecting portion CDP2 (illustrated in FIG. 26) is set to be equal to or less than one-tenth the Y-direction dimension L1 of the electrical-conductor pattern CDP (illustrated in FIG. 26) (that is, a relation of "L3≤L1/10"), so that the resistance of the connecting portion CDP2 for connecting between the electrical-conductor patterns CDP adjacent to each other in the X direction can be equal to or less than one-tenth the resistance of the electrical-conductor pattern CDP. Further, the width (wiring width, Y-direction dimension) W2 of the connecting portion CDP2 is set to be larger (thicker) than the width (wiring width, X-direction dimension) W1 of the electrical-conductor pattern CDP (that is, a relation of "W2>W1"), so that the influence of the connecting portion CDP2 can be further reduced. On the other hand, in the cases of FIGS. 15 to 19 described above, the resistivity of the wiring M1a is smaller than the resistivity of the electrical-conductor pattern CDP, and therefore, the resistance of the wiring M1a for connecting the electrical-conductor patterns CDP adjacent to each other in the X direction can be easily equal to or less than one-tenth the resistance of the electrical-conductor pattern CDP.

Also in the case of FIG. 26 (the first modification example), the same effects as those of the cases of FIGS. 15 to 19 described above can be basically obtained. However, the following respective unique effects to the case of FIG. 26 (the first modification example) and the cases of FIGS. 15 to 19 described above can be obtained.

That is, the cases of FIGS. 15 to 19 described above, the plurality of electrical-conductor patterns CDP extending in the Y direction are connected to each other by the wiring M1a, and therefore, the resistance value of the wiring M1a extending in the X direction can be easily smaller than the resistance value of the electrical-conductor pattern CDP. Therefore, the resistance component of the wiring M1a which occupies in the reference resistor Rst can be easily reduced, and therefore, it is more advantageous to suppress or prevent the variation in the resistance value of the reference resistor Rst due to the stress.

On the other hand, in the case of FIG. 26 (the first modification example), the plurality of electrical-conductor patterns CDP extending in the Y direction are connected to each other by the connecting portion CDP2 which is in the same layer as that of the electrical-conductor patterns CDP, and therefore, the wiring M1 other than the wiring M1a can easily pass above the electrical-conductor patterns CDP. Therefore, a degree of freedom of wiring design can be improved.

The cases of FIGS. 15 to 19 described above and the case of FIG. 26 (the first modification example) can be combined with each other, and this combination is explained as a second modification example of the present embodiment.

Figure 27:
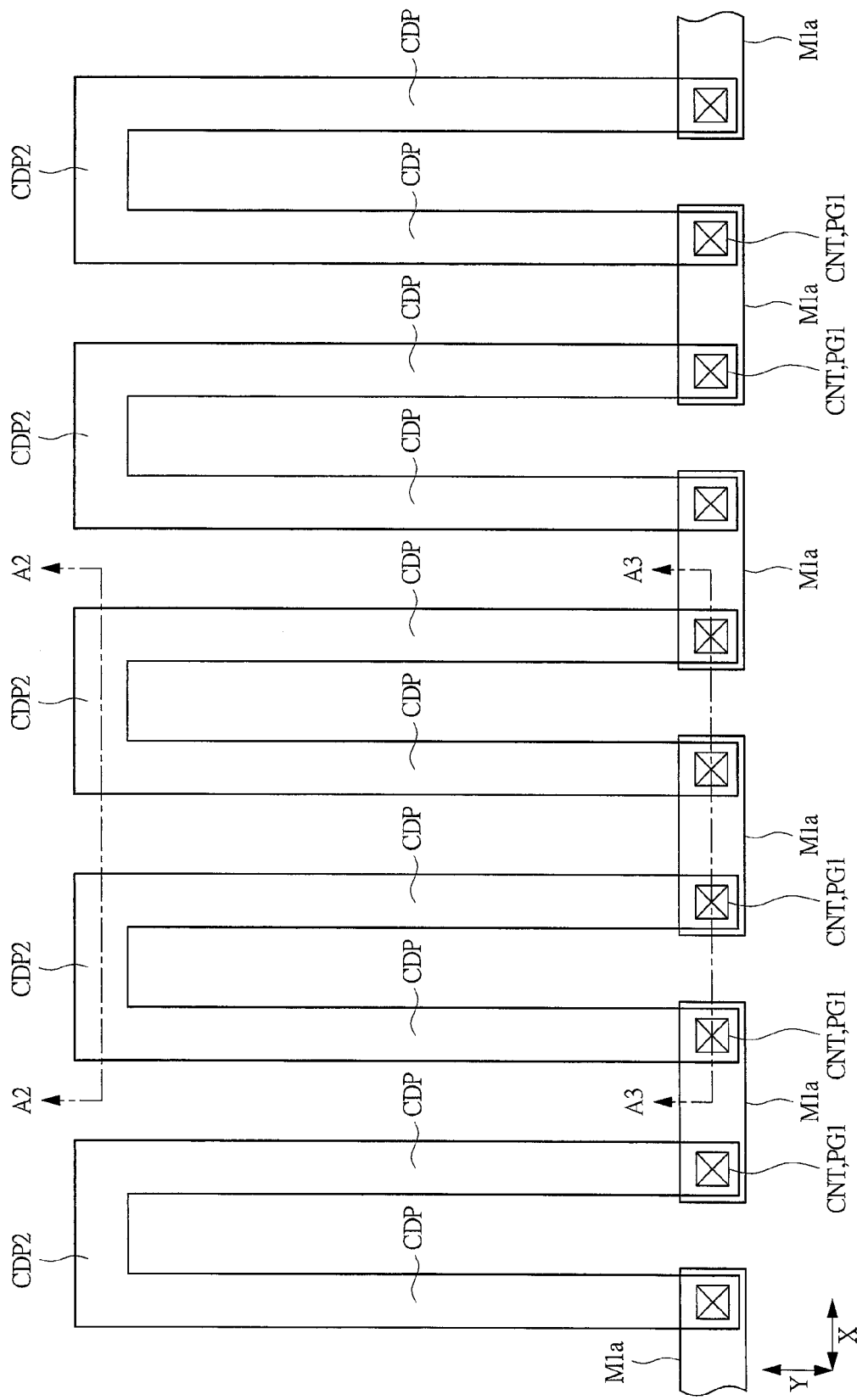
FIG. 27 is a plan view of a principal part of a second modification example of the semiconductor chip of the embodiment of the present invention.
Figure 28:
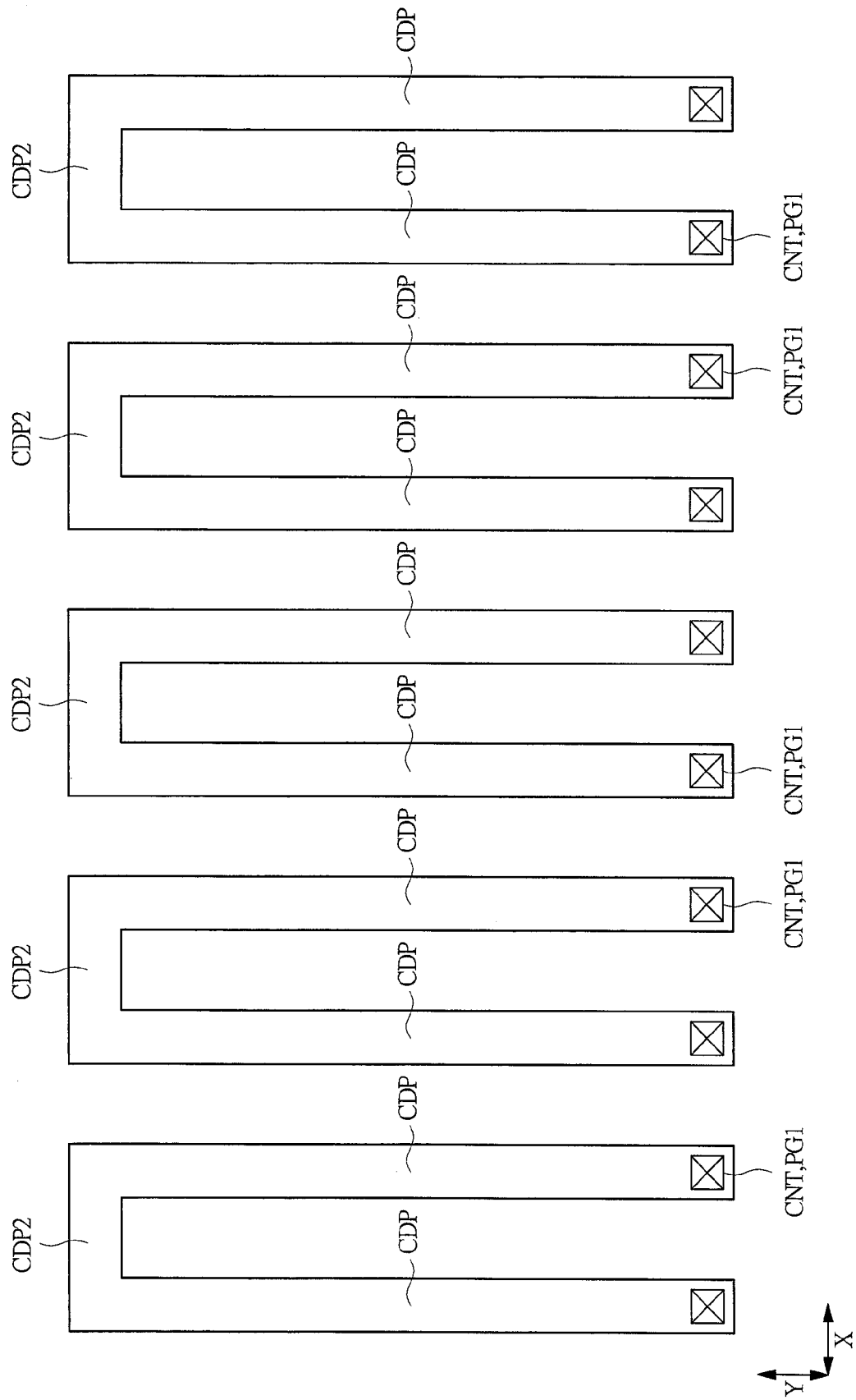
FIG. 28 is a plan view of a principal part of the second modification example of the semiconductor chip of the embodiment of the present invention.
Figure 29:
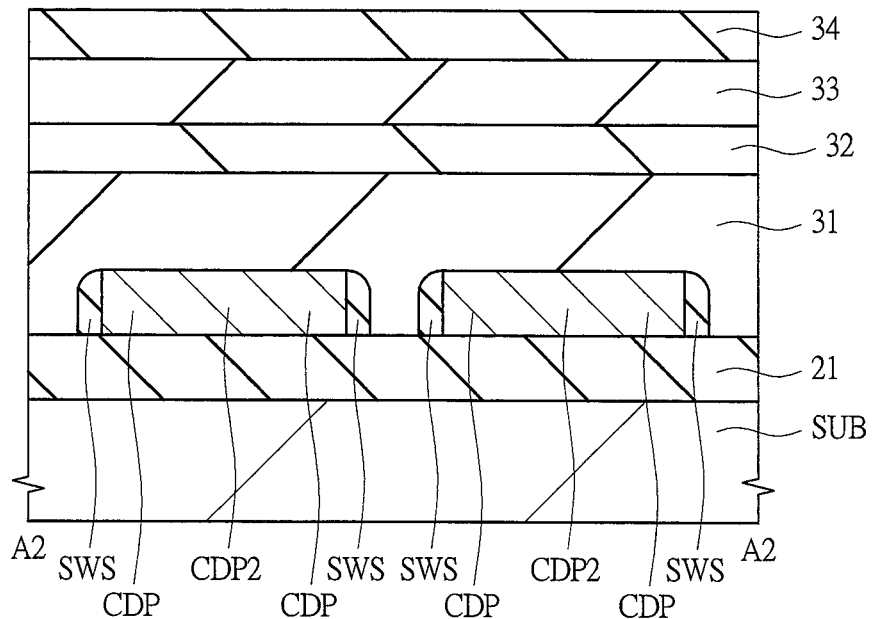
FIG. 29 is a cross-sectional view of a principal part of the second modification example of the semiconductor chip of the embodiment of the present invention.
Figure 30:
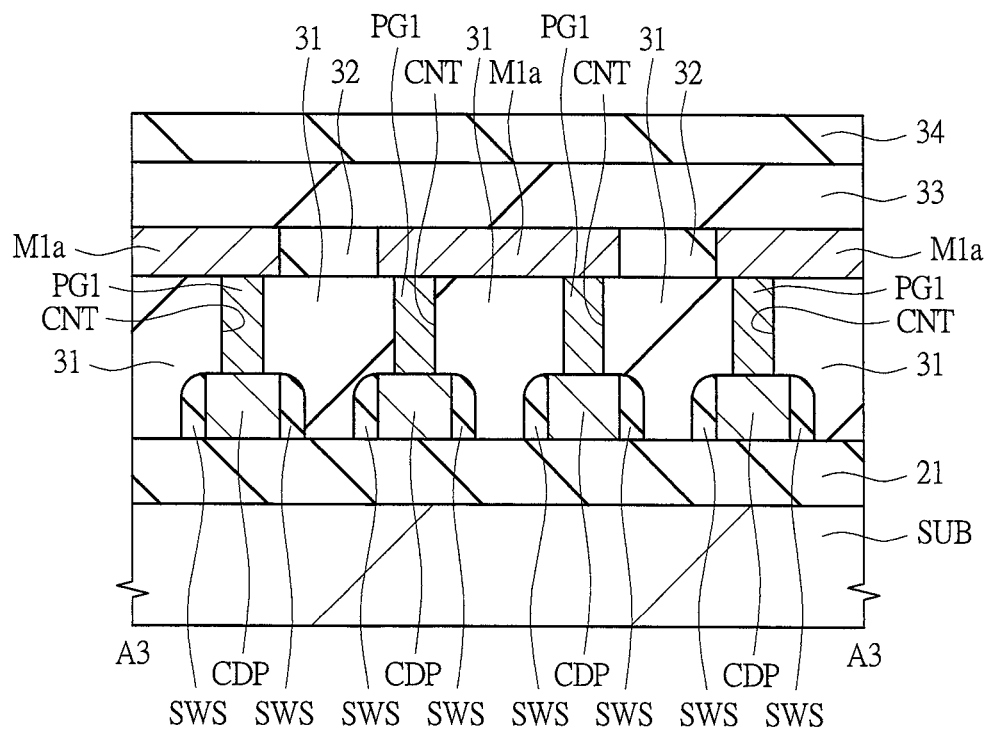
FIG. 30 is a cross-sectional view of a principal part of the second modification example of the semiconductor chip of the embodiment of the present invention.

FIGS. 27 and 28 are plan views of principal parts of a semiconductor device (semiconductor chip CP1) of the second modification example of the present embodiment, and illustrate the same region as those of FIGS. 15 to 17 described above (the region corresponding to the above-described reference-resistor formation region 1B). FIG. 27 corresponds to FIG. 15 described above, and illustrates a plan layout of the electrical-conductor pattern CDP, the contact hole CNT, the plug PG1, and the wiring M1 so that illustration of other configuration is omitted. FIG. 28 corresponds to FIG. 16 described above, and illustrates a plan layout of the electrical-conductor pattern CDP, the contact hole CNT, and the plug PG1 so that illustration of other configuration is omitted. Also, FIG. 29 is a cross-sectional view taken along a line A2-A2 of FIG. 27 and corresponds to FIG. 18 described above, and FIG. 30 is a cross-sectional view taken along a line A3-A3 of FIG. 27 and corresponds to FIG. 19 described above.

Cases of FIGS. 27 to 30 (the second modification example) correspond to a combination of the cases of FIGS. 15 to 19 described above and the case of FIG. 26 (the first modification example). That is, the plurality of electrical-conductor patterns CDP extending in the Y direction are aligned at predetermined intervals in the X direction so that the cases of FIGS. 27 to 30 (the second modification example) are mixture of a case (location) that the electrical-conductor patterns CDP adjacent to each other in the X direction are connected (electrically connected) to each other by the wiring M1a and a case (location) that the electrical-conductor patterns are connected (electrically connected) to each other by the connecting portion CDP2 which is integrally formed with the electrical-conductor patterns CDP (in the same layer as those of the electrical-conductor patterns CDP).

For example, FIGS. 27 and 28 are explained in more detail as follows.

In FIG. 27, ten electrical-conductor patterns CDP are illustrated. It is assumed that, in an order from a right side of the drawing, the patterns are referred to as a first electrical-conductor pattern CDP, a second electrical-conductor pattern CDP, a third electrical-conductor pattern CDP, . . . , and a tenth electrical-conductor pattern CDP.

An end portion (an upper end portion in FIG. 27) of the first electrical-conductor pattern CDP and an end portion (an upper end portion in FIG. 27) of the second electrical-conductor pattern CDP adjacent to the end portion of the first electrical-conductor pattern in the X direction are electrically connected so as to be continued to each other by a connecting portion CDP2 integrally formed with the first and second electrical-conductor patterns CDP. The other end portion (a lower end portion in FIG. 27) of the second electrical-conductor pattern CDP and an end portion (a lower end portion in FIG. 27) of the third electrical-conductor pattern CDP adjacent to the other end portion of the second electrical-conductor pattern in the X direction are electrically connected to each other via a plug PG1 buried in a contact hole CNT (contact hole CNT formed on the end portions) and a wiring M1a. The other end portion (an upper end portion in FIG. 27) of the third electrical-conductor pattern CDP and an end portion (an upper end portion in FIG. 27) of the fourth electrical-conductor pattern CDP adjacent to the other end portion of the third electrical-conductor pattern in the X direction are electrically connected so as to be continued to each other by a connecting portion CDP2 integrally formed with the third and fourth electrical-conductor patterns CDP. The other end portion (a lower end portion in FIG. 27) of the fourth electrical-conductor pattern CDP and an end portion (a lower end portion in FIG. 27) of the fifth electrical-conductor pattern CDP adjacent to the other end portion of the fourth electrical-conductor pattern in the X direction are electrically connected to each other via a plug PG1 buried in a contact hole CNT (contact hole CNT formed on the end portions) and a wiring M1a. A similar connection relation is repeated to reach the tenth electrical-conductor pattern CDP, and the similar connection relation is further repeated for eleventh and subsequent electrical-conductor patterns CDP although illustrations thereof are omitted. The configurations of the connecting portion CDP2 and the wiring M1a have already been described above, and therefore, explanation thereof is omitted here.

The cases of FIGS. 15 to 19 described above, the case of FIG. 26 (the first modification example), and the cases of FIGS. 27 to 30 (the second modification example) are common to each other in that the plurality of electrical-conductor patterns CDP extending in the Y direction are aligned at the predetermined intervals in the X direction so as to be connected (more specifically, connected in series) to each other to form the reference resistor Rst. However, in the cases of FIGS. 27 to 30 (the second modification example), the electrical-conductor patterns CDP extending in the Y direction are connected (electrically connected) in series to each other by the wiring M1a which is the electrical-conductor pattern in a different layer from those of the electrical-conductor patterns CDP and the connecting portion CDP2 which is the electrical-conductor pattern in the same layer as those of the electrical-conductor patterns CDP. Also in such a case, by developing the arrangement of the reference resistor Rst and the direction (the extending direction of the electrical-conductor patterns CDP) as described above, the variation in the resistance value of the reference resistor Rst due to the stress can be suppressed or prevented.

Second Embodiment

Figure 31:
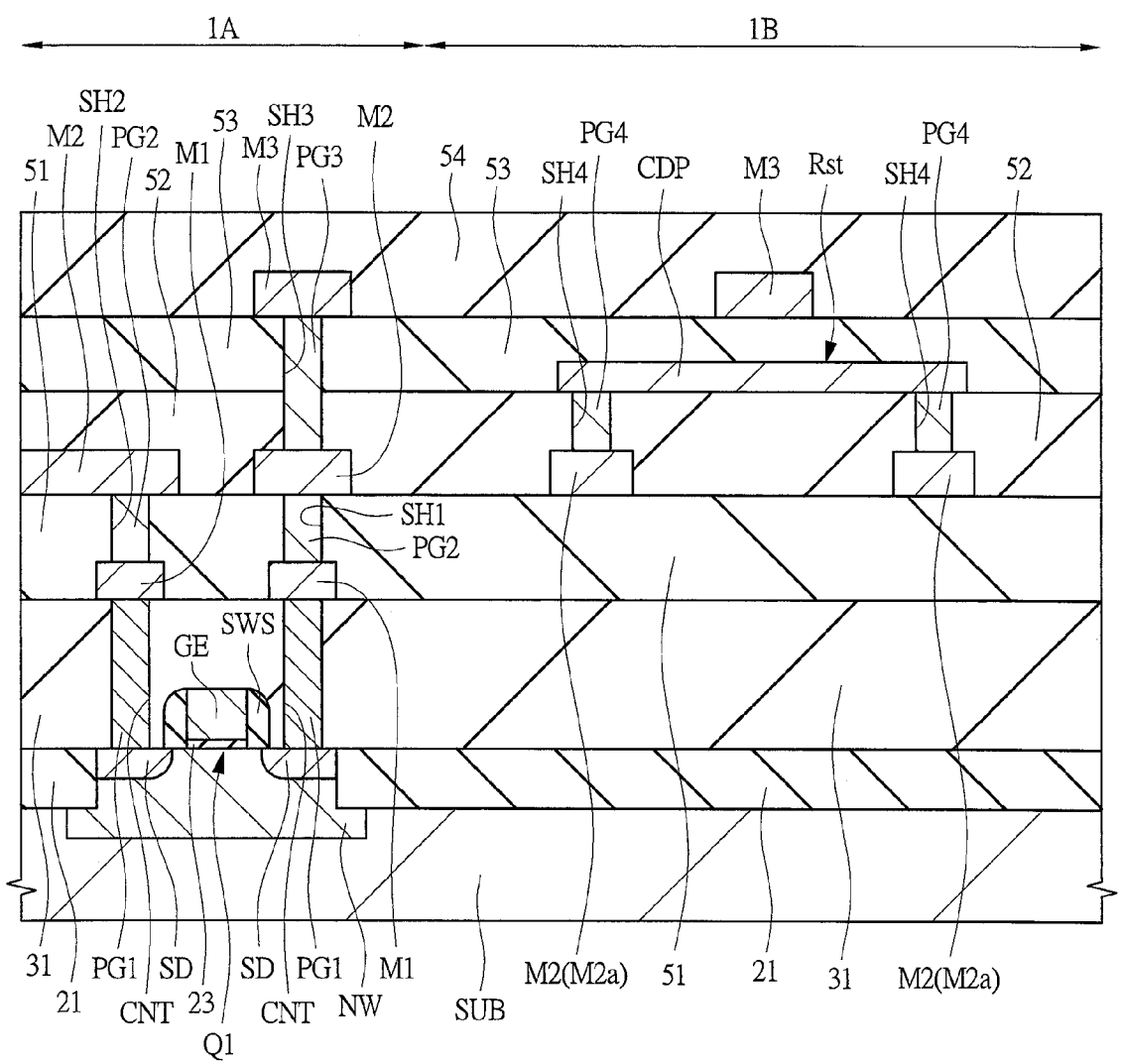
FIG. 31 is a cross-sectional view of a principal part of a semiconductor chip of another embodiment of the present invention.

FIG. 31 is a cross-sectional view of a principal part of a semiconductor chip CP1 of the present embodiment, and corresponds to above-described FIG. 8 of the above-described first embodiment.

A main different point between the present second embodiment and the above-described first embodiment is the materials of the electrical-conductor patterns CDP configuring the reference resistor Rst and the layer in which the electrical-conductor patterns CDP are formed. That is, while the electrical-conductor patterns CDP configuring the reference resistor Rst are the silicon film patterns (more specifically, polycrystalline silicon film patterns) in the above-described first embodiment, the electrical-conductor patterns CDP configuring the reference resistor Rst are metal film patterns in the present embodiment. While the electrical-conductor patterns CDP are formed in the same layer as that of the gate electrode GE in the above-described first embodiment, the electrical-conductor patterns CDP are formed between the second wiring layer (the layer in which the wiring M2 is formed) and a third wiring layer (a layer in which a wiring M3 is formed) in the present embodiment. Hereinafter, the different point from the above-described first embodiment is mainly explained.

In the present embodiment, the electrical-conductor patterns CDP configuring the reference resistor Rst are formed as not the silicon film patterns (patterned silicon film) but metal film patterns (patterned metal film). Therefore, as illustrated in FIG. 31, in the reference-resistor formation region 1B, the electrical conductor pattern CDP is not formed in the same layer as that of the gate electrode GE, and, as a result of this, the plugs PG1 and the wiring M1a connected to the electrical-conductor pattern CDP (silicon film pattern) of FIG. 8 described above are not formed, either. A lower configuration than the insulating film 31 of FIG. 31 (including the insulating film 31, and the contact hole CNT and the plug PG1 formed in the insulating film 31) except for that is similar to that of the above-described first embodiment. Therefore, explanation thereof is omitted here, and an upper-layer structure than the insulating film 31 is explained.

As illustrated in FIG. 31, the wiring (wiring layer, first wiring layer) M1 serving as the first layer wiring is formed on the insulating film 31 in which the plug PG1 is buried. FIG. 31 illustrates a case that the wiring M1 is formed by forming an electrical-conductor film for the wiring M1 on the insulating film 31 in which the plug PG1 is buried, and then, patterning this electrical-conductor film by using a photolithography technique and a dry etching technique. Therefore, in FIG. 31, the wiring M1 is formed of a patterned electrical-conductor film such as a tungsten wiring or an aluminum wiring. As another type, the wiring M1 may be a damascene wiring as similar to the above-described first embodiment.

An insulating film (interlayer insulating film) 51 formed of, for example, a silicon oxide film is formed on the insulating film 31 so as to cover the wiring M1, and a wiring (a second wiring layer) M2 is formed on the insulating film 51. FIG. 31 illustrates a case that the wiring M2 is formed by forming an electrical-conductor film for the wiring M2 on the insulating film 51, and then, patterning this electrical-conductor film by using a photolithography technique and a dry etching technique. Therefore, in FIG. 31, the wiring M2 is formed of a patterned electrical-conductor film such as an aluminum wiring. As another type, the wiring M2 may be a damascene wiring as similar to the above-described first embodiment.

An insulating film (interlayer insulating film) 52 formed of, for example, a silicon oxide film is formed on the insulating film 51 so as to cover the wiring M2, and the electrical conductor pattern CDP is formed on the insulating film 52. The electrical-conductor pattern CDP can be formed by forming an electrical-conductor film for the electrical-conductor pattern CDP on the insulating film 52, and then, patterning this electrical-conductor film by using a photolithography technique and a dry etching technique. The electrical-conductor pattern CDP is formed in the reference-resistor formation region 1B.

Also, in the above-described first embodiment, the sidewall spacer SWS is formed on the side walls of the electrical-conductor pattern CDP by forming the electrical-conductor pattern CDP in the same layer as that of the gate electrode GE. However, in the present embodiment, the electrical-conductor pattern CDP is formed in a layer upper than that of the gate electrode GE (more specifically, a layer between the wiring M2 and the wiring M3), and therefore, the sidewall spacer SWS is not formed on the side walls of the electrical-conductor pattern CDP.

An insulating film (interlayer insulating film) 53 formed of, for example, a silicon oxide film is formed on the insulating film 52 so as to cover the electrical-conductor pattern CDP, and a wiring (a third wiring layer) M3 is formed on the insulating film 53. FIG. 31 illustrates a case that the wiring M3 is formed by forming an electrical-conductor film for the wiring M3 on the insulating film 53, and then, patterning this electrical-conductor film by using a photolithography technique and a dry etching technique. Therefore, in FIG. 31, the wiring M3 is formed of a patterned electrical conductor film such as an aluminum wiring. As another type, the wiring M3 can be a damascene wiring.

A via hole (opening portion, penetrating-through hole, connecting hole, through hole) SH2 is formed in the insulating film 51 between the wirings M1 and M2, and an electrically-conductive plug (connecting conductor, electrically-conductive plug) PG2 is formed (buried) inside the via hole SH2. The plug PG2 can be formed by a similar method to that of the above-described plug PG1. An upper portion of the plug PG2 is in contact with the wiring M2, a lower portion of the plug PG2 is in contact with the wiring M1, and the wiring M2 above the plug PG2 and the wiring M1 below the plug PG2 can be electrically connected to each other by this plug PG2.

A via hole (opening portion, penetrating-through hole, connecting hole, through hole) SH3 penetrating through the insulating films 52 and 53 is formed in the insulating films 52 and 53 between the wirings M3 and M2, and an electrically-conductive plug (connecting conductor, electrically-conductive plug) PG3 is formed (buried) inside the via hole SH3. The plug PG3 can be formed by a similar method to those of the above-described plugs PG1 and PG2. An upper portion of the plug PG3 is in contact with the wiring M3, a lower portion of the plug PG3 is in contact with the wiring M2, and the wiring M3 above the plug PG3 and the wiring M2 below the plug PG3 can be electrically connected to each other by this plug PG3.

A via hole (opening portion, penetrating-through hole, connecting hole, through hole) SH4 penetrating through the insulating film 52 is formed in the insulating film 52 between the electrical-conductor pattern CDP and the wiring M2 (more specifically, wiring M2a), and an electrically-conductive plug (connecting conductor, electrically-conductive plug) PG4 is formed (buried) inside the via hole SH4. The plug PG4 can be formed by a similar method to those of the above-described plugs PG, PG1, PG2, and PG3. An upper portion of the plug PG4 is in contact with the electrical-conductor pattern CDP, a lower portion of the plug PG4 is in contact with the wiring M2, and the electrical-conductor pattern CDP above the plug PG4 and the wiring M2 below the plug PG4 can be electrically connected to each other by this plug PG4.

On the insulating film 53, an insulating film (interlayer insulating film) 54 formed of, for example, a silicon oxide film is formed so as to cover the wiring M3. While a wiring and an insulating film in a further upper layer are formed on the insulating film 54, illustration and explanation thereof are omitted here.

A difference of the present embodiment from the above-described first embodiment is the material of the electrical-conductor patterns CDP configuring the reference resistor Rst. That is, while the electrical-conductor patterns CDP configuring the reference resistor Rst are the silicon film patterns in the above-described first embodiment, the electrical-conductor patterns CDP configuring the reference resistor Rst are the metal film patterns formed of a metal film (patterned metal film) in the present embodiment.

In the present application, note that a metal or a metal film refers to an electrical conductor or an electrical-conductor film exhibiting metal conductivity, and includes not only a single metal (pure metal) or alloy but also a metal compound exhibiting metal conductivity (such as metal nitride or metal carbide). Therefore, the electrical-conductor patterns CDP in the present embodiment are electrical-conductor patterns exhibiting the metal conductivity.

A high-melting-point metal (also referred to as refractory metal) is preferred as the electrical-conductor patterns CDP of the present embodiment. Note that the high-melting-point metal described here also includes a high-melting-point metal compound. When a metal material which can be preferably used as the electrical-conductor patterns CDP is specifically cited, Mo (molybdenum), MoN (molybdenum nitride), MoC (molybdenum carbide), MoNC (molybdenum carbonitride), MoSi (molybdenum silicide), Ti (titanium), TiN (titanium nitride), TiC (titanium carbide), TiNC (titanium carbonitride), and TiSi (titanium silicide) can be cited. Further, when another metal material which can be preferably used as the electrical-conductor patterns CDP is specifically cited, W (tungsten), WN (tungsten nitride), WC (tungsten carbide), WNC (tungsten carbonitride), WSi (tungsten silicide), Ta (tantalum), TaN (tantalum nitride), TaC (tantalum carbide), TaNC (tantalum carbonitride), and TaSi (tantalum silicide) can be cited. Still further, when still another metal material which can be preferably used as the electrical-conductor patterns CDP is specifically cited, Ru (ruthenium), RuN (ruthenium nitride), RuC (ruthenium carbide), RuNC (ruthenium carbonitride), RuSi (ruthenium silicide), Co (cobalt), CoSi (cobalt silicide), Ni (nickel), NiSi (nickel silicide), and NiPtSi (nickel platinum silicide) can be cited. Among them, tungsten (W), titanium nitride (TiN), or tantalum nitride (TaN) is particularly preferred as the metal material used as the electrical-conductor patterns CDP. When they are used as the material of the electrical-conductor pattern CDP, they are good in terms of characteristics of the reference resistor Rst, and besides, they are the materials used in manufacturing a semiconductor device, and therefore, limitation in applying them is low, and a new investment cost for a manufacturing apparatus or others is low, so that they are easy to be employed.

In the present embodiment, the electrical-conductor patterns CDP can have a single-layer structure (a structure formed of one-layer metal film) or a stacked structure (a structure obtained by stacking a plurality of metal films). Also, when tungsten (W) is used as the electrical-conductor patterns CDP, a titanium nitride (TiN) film is preferably formed as a peel-off preventing film between the tungsten (W) film and an interlayer insulating film since the tungsten (W) film has low adherence property with respect to the interlayer insulating film. In this case, the electrical-conductor patterns CDP are formed of a stacked film of a titanium nitride (TiN) film and a tungsten (W) film on the titanium nitride (TiN) film.

Figure 32:
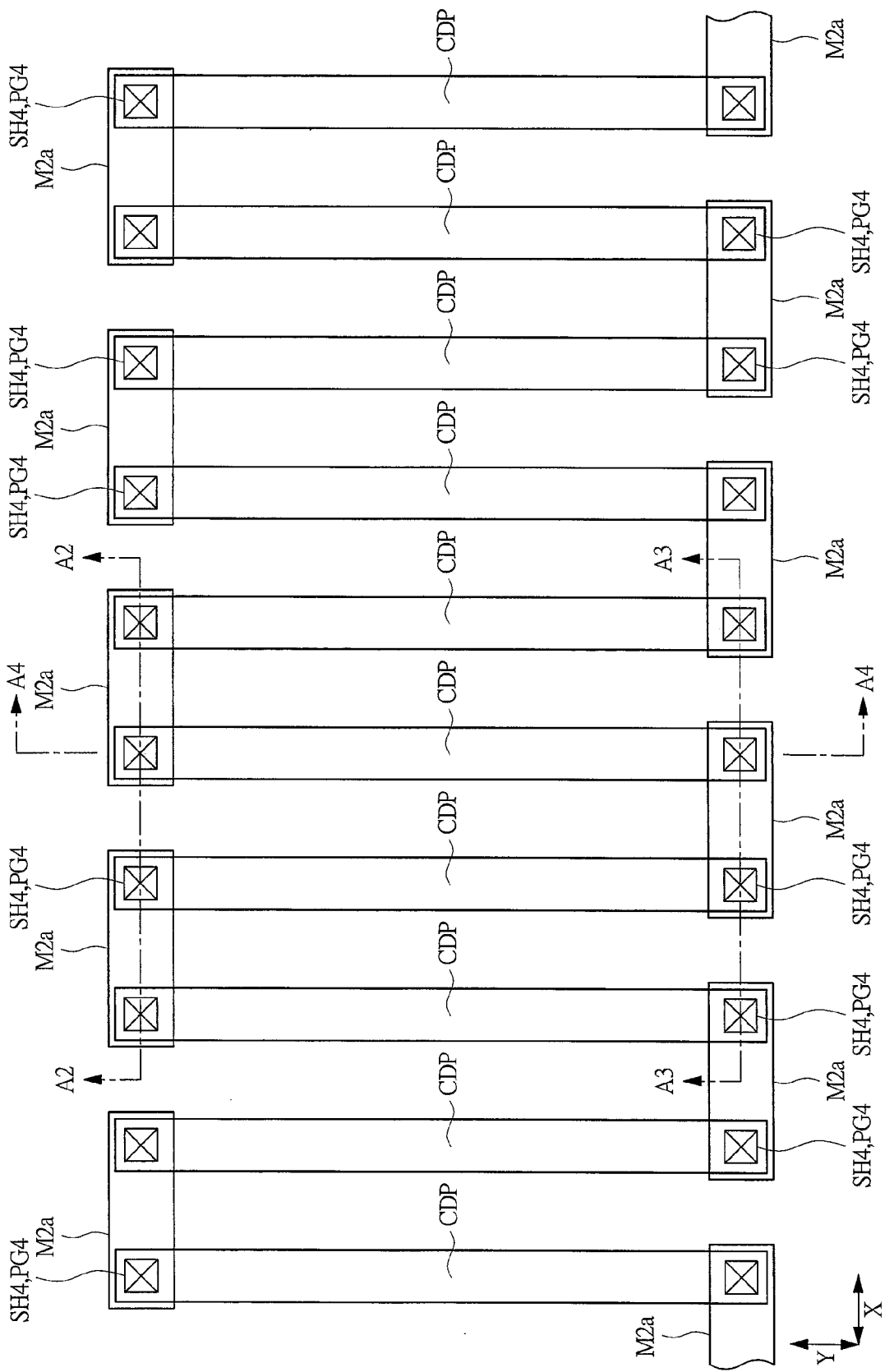
FIG. 32 is a plan view of a principal part of the semiconductor chip of another embodiment of the present invention.
Figure 33:
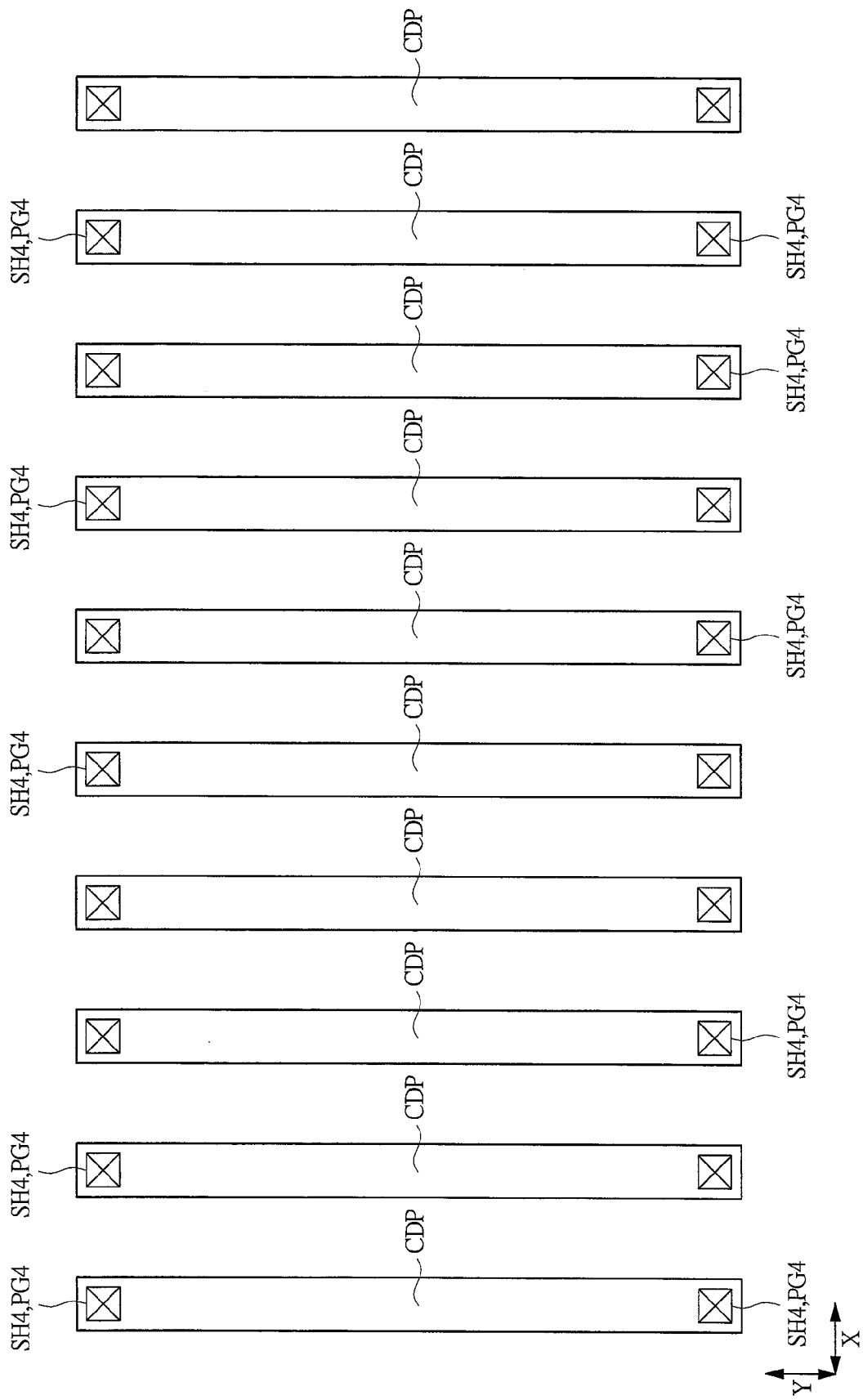
FIG. 33 is a plan view of a principal part of the semiconductor chip of another embodiment of the present invention.
Figure 34:
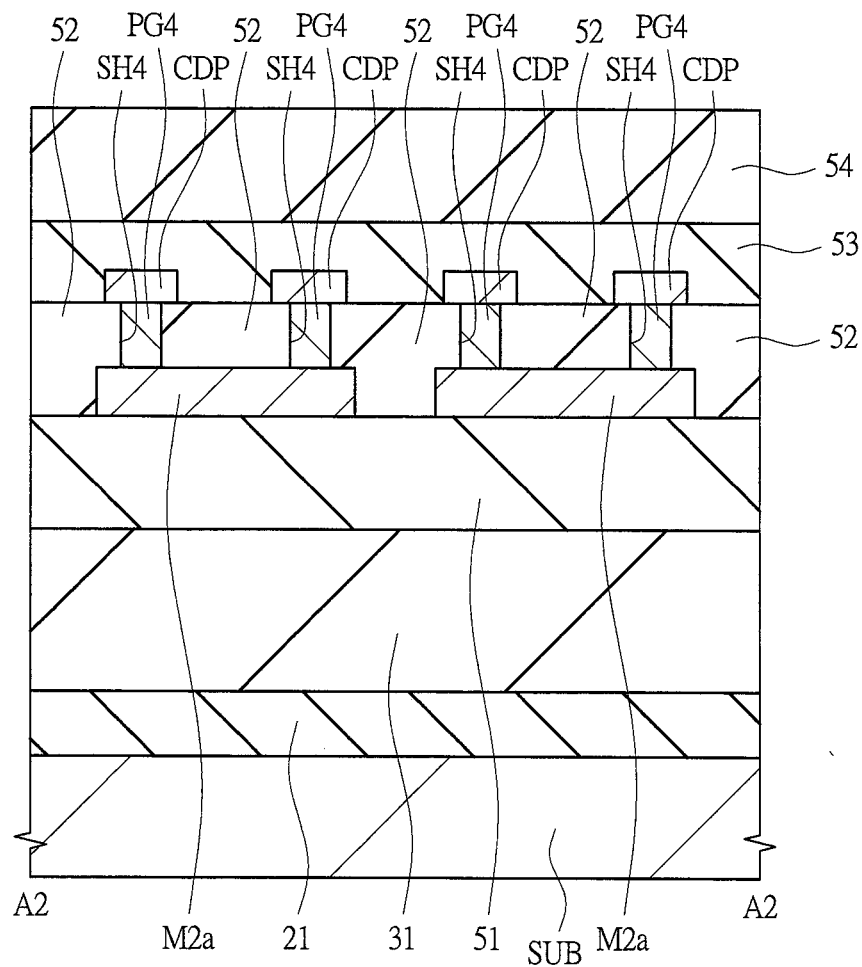
FIG. 34 is a cross-sectional view of a principal part of the semiconductor chip of another embodiment of the present invention.
Figure 35:
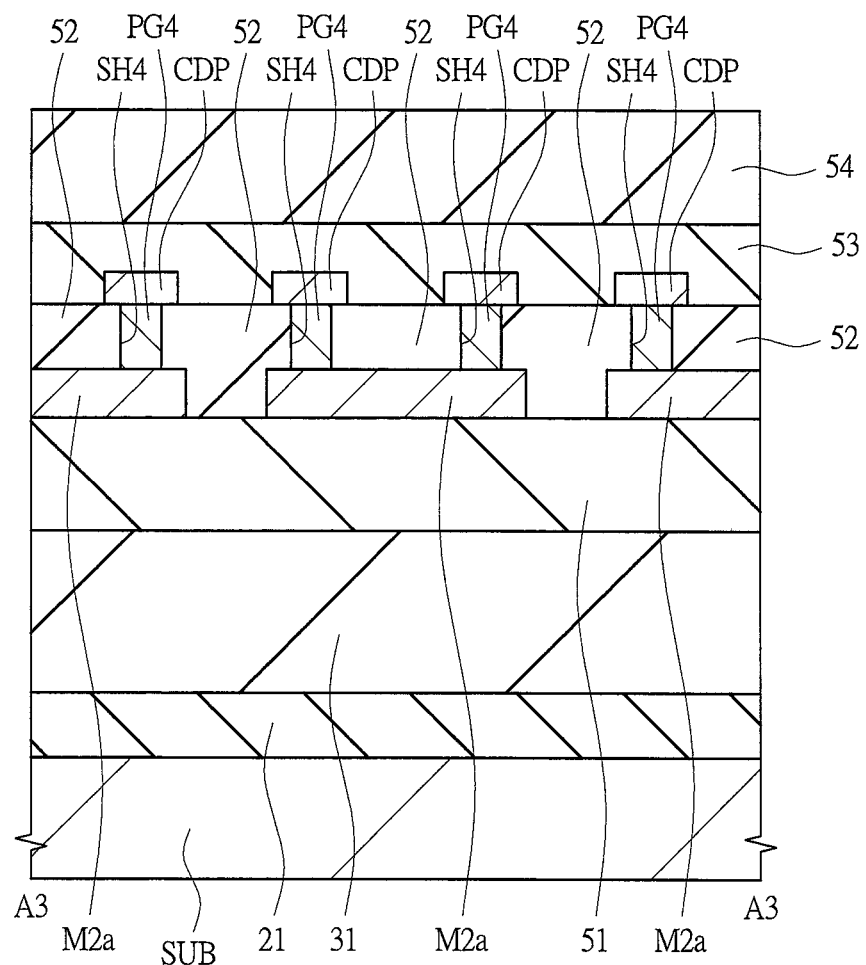
FIG. 35 is a cross-sectional view of a principal part of the semiconductor chip of another embodiment of the present invention.

FIGS. 32 and 33 are plan views of principal parts of the semiconductor chip CP1 of the present embodiment, and illustrate the same region as the reference-resistor formation region 1B. Among them, FIG. 32 corresponds to FIG. 15 of the above-described first embodiment, and illustrates a plan layout of the electrical-conductor pattern CDP, the via hole SH4, the plug PG4, and the wiring M2 so that illustration of other configuration is omitted. FIG. 33 corresponds to FIG. 16 of the above-described first embodiment, and illustrates a plan layout of the electrical-conductor pattern CDP, the via hole SH4, and the plug PG4 so that illustration of other configuration is omitted. Also, FIGS. 34 and 35 are cross-sectional views of principal parts of the semiconductor chip CP1 of the present embodiment, and illustrate cross-sectional views of the reference-resistor formation region 1B. Among them, FIG. 34 corresponds to a cross-sectional surface taken along a line A2-A2 of FIG. 32, and FIG. 35 corresponds to a cross-sectional surface taken along a line A3-A3 of FIG. 32. Note that the cross-sectional view of the reference-resistor formation region 1B illustrated in FIG. 31 described above is a cross-sectional view almost corresponding to a cross-sectional surface taken along a line A4-A4 of FIG. 32.

As seen from comparison between FIG. 32 and FIG. 15 described above and comparison between FIG. 33 and FIG. 16 described above, the planar shapes and positional relation of the electrical-conductor patterns CDP are similar between the above-described first embodiment and the present embodiment. That is, as illustrated in FIGS. 32 and 33 and others, in the reference-resistor formation region 1B, the plurality of (plurality of lines of) electrical-conductor patterns CDP extending in the Y direction are aligned at predetermined intervals (preferably, equal intervals) in the X direction, and the plurality of electrical-conductor patterns CDP are independent patterns from each other.

However, while the electrical-conductor patterns CDP adjacent to each other in the X direction in the above-described first embodiment are connected (electrically connected) to each other by the plug PG1 and the wiring M1a, the electrical-conductor patterns CDP adjacent to each other in the X direction in the present embodiment are connected (electrically connected) to each other by the plug PG4 and the wiring M2a as illustrated in FIGS. 32 to 35. That is, the plug PG4 connected to the electrical-conductor pattern CDP is used in the present embodiment instead of the plug PG1 connected to the electrical-conductor pattern CDP in the above-described first embodiment, and the wiring M2a is used in the present embodiment instead of the wiring M1a of the above-described first embodiment. Here, the wiring M2a of the wiring M2 is a wiring for connecting between the electrical-conductor patterns CDP.

In specific explanation, as illustrated in FIGS. 32 to 35, the above-described via hole SH4 is formed below both ends of each of the electrical-conductor patterns CDP extending in the Y direction, and the plug PG4 buried in the via hole SH4 is electrically connected to the wiring M2a of the above-described wiring M2. That is, the end portion of each of the electrical-conductor patterns CDP is electrically connected to the wiring M2a via the electrically-conductive plug PG4 filling the via hole SH4. The wiring M2a is a wiring for connecting the plurality of electrical-conductor patterns CDP in series to each other, which extend in the Y direction and align in the X direction, and extend in the X direction so as to bridge between the end portions of the two electrical-conductor patterns CDP adjacent to each other in the X direction. The plurality of electrical-conductor patterns CDP extending in the Y direction are connected in series to each other via the plug PG4 buried in the via hole SH4 and the wiring M2a.

As described above, in the present embodiment, the plurality of electrical-conductor patterns CDP extending in the Y direction are connected in series to each other via the plug PG4 buried in the via hole SH4 and the wiring M2a to form the reference resistor Rst. That is, the reference resistor Rst is formed by connecting the plurality of independent electrical-conductor patterns CDP in series to each other via the plug PG4 buried in the via hole SH4 and the wiring (wiring layer) M2 (more specifically, the wiring M2a).

Except for the connection (more specifically, series connection) of the plurality of electrical-conductor patterns CDP by the plug PG4 and the wiring M2a instead of the plug PG1 and the wiring M1a, the connection relation of the plurality of electrical-conductor patterns CDP configuring the reference resistor Rst is basically similar between the above-described first embodiment and the present embodiment, and therefore, further explanation thereof is omitted here. A specific connection relation thereof can be obtained by reading the contact hole CNT, the plug PG1, and the wiring M1a in the explanation of the above-described first embodiment (FIGS. 15 to 19 described above) as the via hole SH4, the plug PG4, and the wiring M2a.

In the present embodiment, note that the wiring M2a positioned in the lower layer than those of the electrical-conductor patterns CDP is used as the wiring for electrically connecting between the electrical-conductor patterns CDP adjacent to each other in the X direction. However, as another type, the wiring M3 positioned in the upper layer than those of the electrical-conductor patterns CDP can be used as the wiring for electrically connecting between the electrical-conductor patterns CDP adjacent to each other in the X direction. In this case, the via hole SH4 and the plug PG4 filling this may be provided not below the end portions of the electrical-conductor patterns CDP but above the end portions of the electrical-conductor patterns CDP, and the wiring (instead of the wiring M2a) which is provided in the same layer as that of the wiring M3 and which has the planar pattern similar to that of the wiring M2a may be connected to the plug PG4.

Also in the present embodiment, the arrangement of the reference resistor Rst in the semiconductor chip CP1 and the extending direction of the electrical-conductor patterns CDP are developed as similar to those of the above-described first embodiment, so that the variation in the resistance value of the reference resistor Rst due to the stress can be suppressed or prevented. However, in the present embodiment, the material of the electrical-conductor patterns CDP configuring the reference resistor Rst is further developed.

FIG. 36 is an explanatory diagram of variation in the resistance value of the electrical-conductor pattern CDP due to the stress.

FIG. 36 illustrates the electrical conductor pattern CDP configuring the reference resistor Rst, and a variation ratio "$\Delta R/R$" of the resistance of the electrical-conductor pattern CDP is approximately expressed by an expression (1) shown in FIG. 36 in assumption of a conductor length "L" as a dimension of the electrical-conductor pattern CDP in the extending direction (corresponding to the above-described Y direction), of a conductor cross-sectional area "A" as a cross-sectional area of the electrical-conductor pattern CDP in the direction perpendicular to the extending direction thereof, of a resistivity "$\rho$" as the resistivity of the electrical-conductor pattern CDP, and of a resistance value "R" as the resistance value of the electrical-conductor pattern CDP. That is, the variation ratio $\Delta R/R$ of the resistance of the electrical-conductor pattern CDP due to the stress is defined by a variation ratio "$\Delta A/A$" of the electrical-conductor cross-sectional area A due to the stress and a variation ratio "$\Delta \rho/\rho$" of the resistivity $\rho$ due to the stress. As described in the above-described first embodiment, by developing the arrangement of the reference resistor Rst in the semiconductor chip CP1 and the extending direction of the electrical-conductor pattern CDP, a deformation ratio of the electrical-conductor pattern CDP due to the stress (a deformation ratio due to the variations in the conductor length L and the cross-sectional area A) can be reduced, so that the variation ratio $\Delta R/R$ of the resistance of the electrical-conductor pattern CDP can be suppressed. However, as seen from the expression (1) of FIG. 36, even if the deformation of the electrical-conductor pattern CDP due to the stress can be suppressed, the variation ratio $\Delta R/R$ of the resistance of the electrical-conductor pattern CDP is increased by the variation in the resistivity $\rho$ due to the stress in accordance with the variation. Therefore, in order to suppress or prevent the variation in the resistance value of the reference resistor Rst due to the stress, it is also important to reduce the variation ratio $\Delta \rho/\rho$ of the resistivity $\rho$ due to the stress.

The variation in the resistivity $\rho$ due to the stress is because of the piezo resistance effect. The piezo resistance effect is extremely small in the case of the metal film pattern while the piezo resistance effect is relatively large in the case of the silicon film pattern. Accordingly, in the present embodiment, by using the metal film patterns formed of the metal film as the electrical-conductor patterns CDP configuring the reference resistor Rst, the variation in the resistivity $\rho$ of the electrical-conductor pattern CDP due to the stress can be suppressed or prevented.

That is, in the present embodiment, since the metal film patterns are used as the electrical-conductor patterns CDP configuring the reference resistor Rst, the effect of suppressing (preventing) the variation in the resistance value of the reference resistor Rst due to the stress can be further enhanced than that of the above-described first embodiment because the variation in the resistivity of the electrical-conductor patterns CDP due to the stress can be suppressed or prevented. In this manner, the performance of the semiconductor device (corresponding to the above-described semiconductor device PKG) in which the semiconductor chip CP1 having the oscillation circuit is sealed with the resin can be further improved.

Also, in a point of view of the suppression of the variation in the resistance value of the reference resistor Rst due to the stress as much as possible, the electrical-conductor patterns CDP are preferably made of a material whose deformation due to stress is difficult to occur. From this point of view, the electrical-conductor patterns CDP are preferably made of a metal (or a metal compound) having a high Young's modulus. The metal materials which can be preferably used as the electrical-conductor patterns CDP are exemplified as described above, and these metal materials can be preferably used also from this point of view.

Further, in the present embodiment, the case in which the electrical-conductor patterns CDP are formed between the second wiring layer (the layer in which the wiring M2 is formed) and the third wiring layer (the layer in which the wiring M3 is formed) has been explained. As another type, the electrical-conductor patterns CDP can be provided between the first wiring layer (the layer in which the wiring M1 is formed) and the second wiring layer (the layer in which the wiring M2 is formed). Alternatively, the electrical-conductor patterns CDP can be provided between the third wiring layer (the layer in which the wiring M3 is formed) and a fourth wiring layer (a layer immediately upper than that of the wiring M3 in which a wiring is formed).

That is, the present embodiment corresponds to a case that a multilayer wiring structure having a plurality of wiring layers is formed on the main surface of the semiconductor substrate SUB configuring the semiconductor chip CP1 so that the electrical-conductor patterns CDP are provided between the wiring layer and the wiring layer (between layers). Therefore, in the present embodiment, the electrical-conductor patterns CDP are provided separately (in another layer, different layer) from the wirings. Therefore, while a metal material suitable for the electrical-conductor patterns CDP configuring the reference resistor Rst can be selected as the metal material forming the electrical-conductor patterns CDP, a metal material suitable for the wirings can be selected as the metal material forming the wirings (the wirings M1, M2, M3, and others). Therefore, the reference resistor Rst and the wiring can be easily designed. Also, they are also advantageous in a point of view of the improvement of electrical characteristics. Further, in the present embodiment, since the electrical-conductor patterns CDP are provided separately from the wirings (in another layer, different layer), the thickness of the electrical-conductor pattern CDP can be different from each thickness of the wirings (wirings M1, M2, M3, and others). For example, each thickness of the wirings (wirings M1, M2, M3, and others) is set to be sufficiently thick to enable reduction of the wiring resistance, and the thickness of the electrical-conductor pattern CDP is set to be thinner than each thickness of the wirings (wirings M1, M2, M3, and others), so that a total extending distance of the plurality of electrical-conductor patterns CDP configuring the reference resistor Rst can be reduced. Therefore, an area of the arrangement region of the reference resistor Rst is reduced, so that an area of the semiconductor chip CP1 can be reduced, and, as a result, the semiconductor device PKG can be downsized.

Further, the resistivity of the wiring M2a for connecting between the electrical-conductor patterns CDP is preferably lower than those of the electrical-conductor patterns CDP (that is, the specific resistances of the electrical-conductor patterns CDP is smaller than the specific resistance of the wiring M2a). This is because, when the wiring M2a has a lower resistivity than those of the electrical-conductor patterns CDP, the contribution of the wiring M2a with respect to the resistance value of the reference resistor Rst tends to be reduced, and therefore, the resistance value of the reference resistor Rst is difficult to be affected even if the resistance value of the wiring M2a extending in the X direction is varied due to the influence of the above-described stress σx, and the variation in the resistance value of the reference resistor Rst caused by the stress can be further accurately suppressed or prevented. As explained also in the above-described first embodiment, the resistance (resistance value) of one wiring M2a for connecting between two electrical-conductor patterns CDP adjacent to each other in the X direction is preferably equal to or lower than one-tenth the resistance (resistance value) of one electrical-conductor pattern CDP.

Next, a modification example of the present second embodiment is explained.

Figure 37:
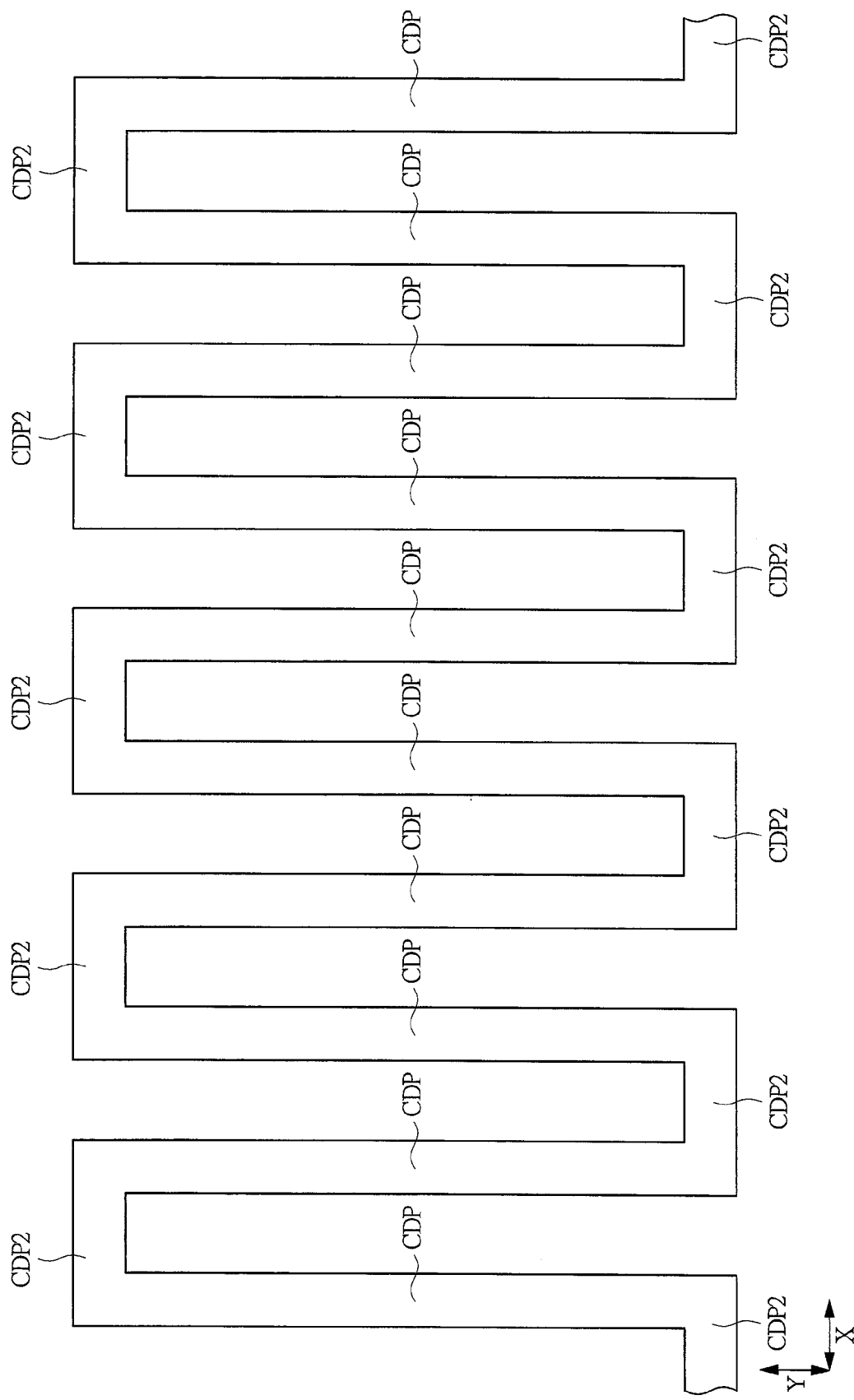
FIG. 37 is a plan view of a principal part of a third modification example of a semiconductor chip of another embodiment of the present invention.

FIG. 37 is a plan view of a principal part of a semiconductor device (semiconductor chip CP1) of the modification example (third modification example) of the present embodiment, and corresponds to FIG. 32 described above. Here, a case of FIG. 37 is referred to as the third modification example. The third modification example of FIG. 37 is obtained by applying the first modification example (FIG. 26 described above) explained in the above-described first embodiment to the present embodiment.

The cases of FIGS. 32 to 35 described above and the case of FIG. 37 (third modification example) are different from each other in the following point.

That is, in the cases of FIGS. 32 to 35 described above, the electrical-conductor patterns CDP extending in the Y direction are aligned at the predetermined intervals in the X direction, the electrical-conductor patterns CDP adjacent to each other in the X direction are the independent patterns (isolated patterns) separated from each other, and the electrical-conductor patterns CDP adjacent to each other in the X direction are electrically connected to each other by the wiring M2a. On the other hand, in the case of FIG. 37 (third modification example), while the plurality of electrical-conductor patterns CDP extending in the Y direction are aligned at predetermined intervals in the X direction, the electrical-conductor patterns CDP adjacent to each other in the X direction are not independent patterns (isolated patterns) separated from each other. And, the electrical-conductor patterns CDP adjacent to each other in the X direction are electrically connected to each other so as to be continued in series to each other by the connecting portion CDP2 which is formed integrally with the electrical-conductor patterns CDP (in the same layer as those of the electrical-conductor patterns CDP).

That is, the cases of FIG. 32 to FIG. 35 described above and the case of FIG. 37 (third modification example) are common to each other in that the plurality of electrical-conductor patterns CDP extending in the Y direction are aligned at the predetermined intervals in the X direction so as to be connected (more specifically, connected in series) to each other to form the reference resistor Rst. However, in the cases of FIGS. 32 to 35 described above, the electrical-conductor patterns CDP extending in the Y direction are connected (electrically connected) to each other by the wiring M2a which is the electrical-conductor pattern in the layer different from those of the electrical-conductor patterns CDP. On the other hand, in the case of FIG. 37 (third modification example), the electrical-conductor patterns CDP extending in the Y direction are connected (electrically connected) to each other by the connecting portion CDP2 which is the electrical-conductor pattern in the same layer as those of the electrical-conductor patterns CDP. They (the cases of FIGS. 32 to 35 and the case of FIG. 37) are different from each other in this point.

Therefore, an overall pattern of combination of the electrical-conductor patterns CDP and the connecting portion CDP2 is basically the same between the case of FIG. 37 (third modification example) and the case of the first modification example (FIG. 26 described above) explained in the above-described first embodiment.

As explained also in the first modification example of the above-described first embodiment, note that the resistance (resistance value) of one connecting portion CDP2 for connecting between two electrical-conductor patterns CDP adjacent to each other in the X direction is preferably equal to or less than one-tenth the resistance (resistance value) of one electrical-conductor pattern CDP.

Also in the case of FIG. 37 (third modification example), basically, the same effects can be obtained as those of the cases of FIGS. 32 to 35 described above. However, in the case of FIG. 37 (third modification example) and the cases of FIGS. 32 to 35 described above, the following respective unique effects can be obtained.

That is, in the cases of FIGS. 32 to 35 described above, the plurality of electrical-conductor patterns CDP extending in the Y direction are connected to each other by the wiring M2a, and therefore, the resistance value of the wiring M2a extending in the X direction can be easily smaller than the resistance value of the electrical-conductor pattern CDP. Therefore, the resistance component of the wiring M2a which occupies in the reference resistor Rst can be easily reduced, and therefore, it is more advantageous to suppress or prevent the variation in the resistance value of the reference resistor Rst due to the stress.

On the other hand, in the case of FIG. 37 (the third modification example), the plurality of electrical-conductor patterns CDP extending in the Y direction are connected to each other by the connecting portion CDP2 in the same layer as those of the electrical-conductor patterns CDP, and therefore, the wiring M2 other than the wiring M2a can easily pass through below or above the electrical-conductor patterns CDP. Therefore, the degree of freedom of the wiring design can be enhanced.

The cases of FIGS. 32 to 35 described above and the case of FIG. 37 (the third modification example) can be combined with each other, and this combination is explained as another modification example (fourth modification example) of the present second embodiment.

Figure 38:
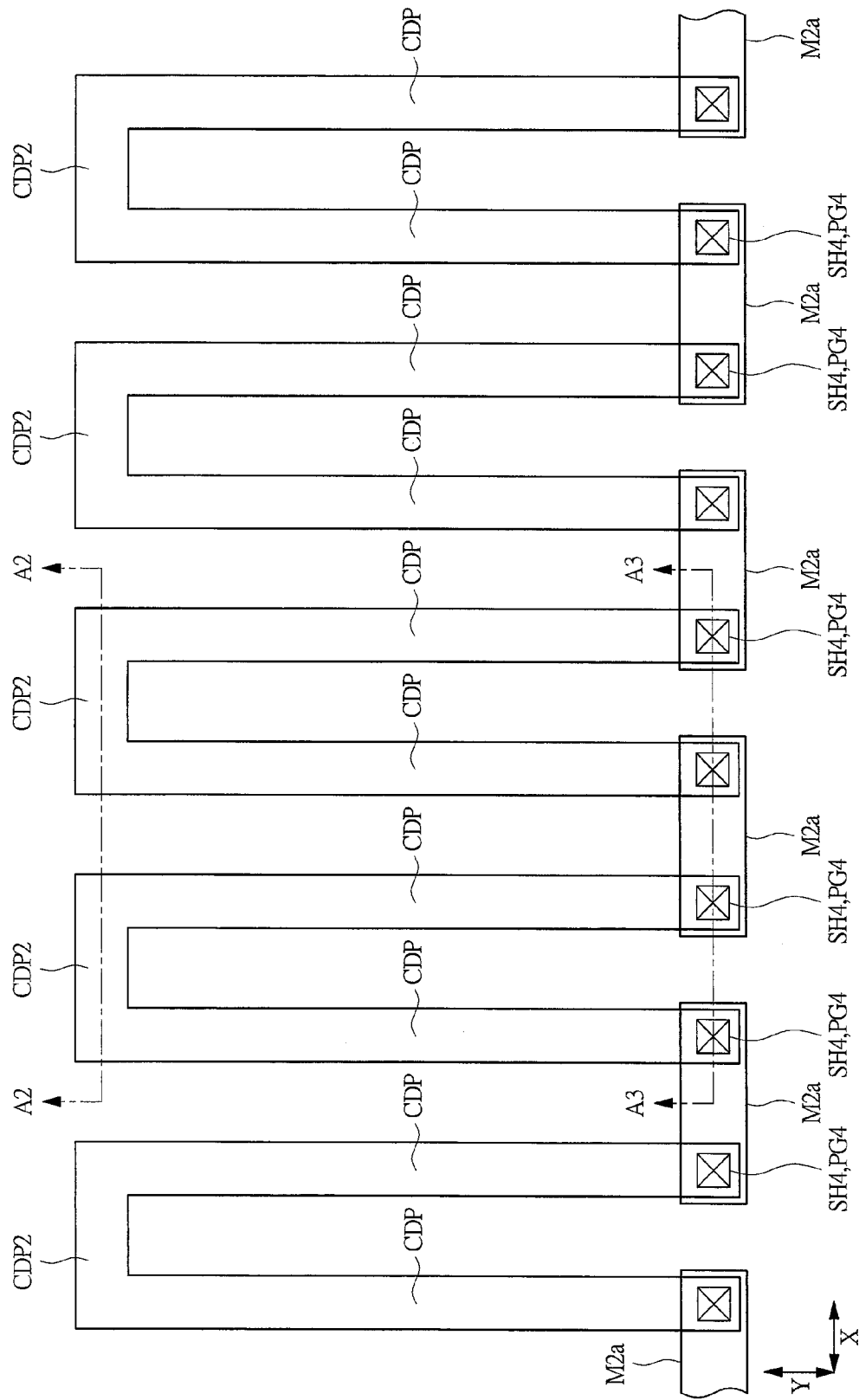
FIG. 38 is a plan view of a principal part of a fourth modification example of a semiconductor chip of another embodiment of the present invention.
Figure 39:
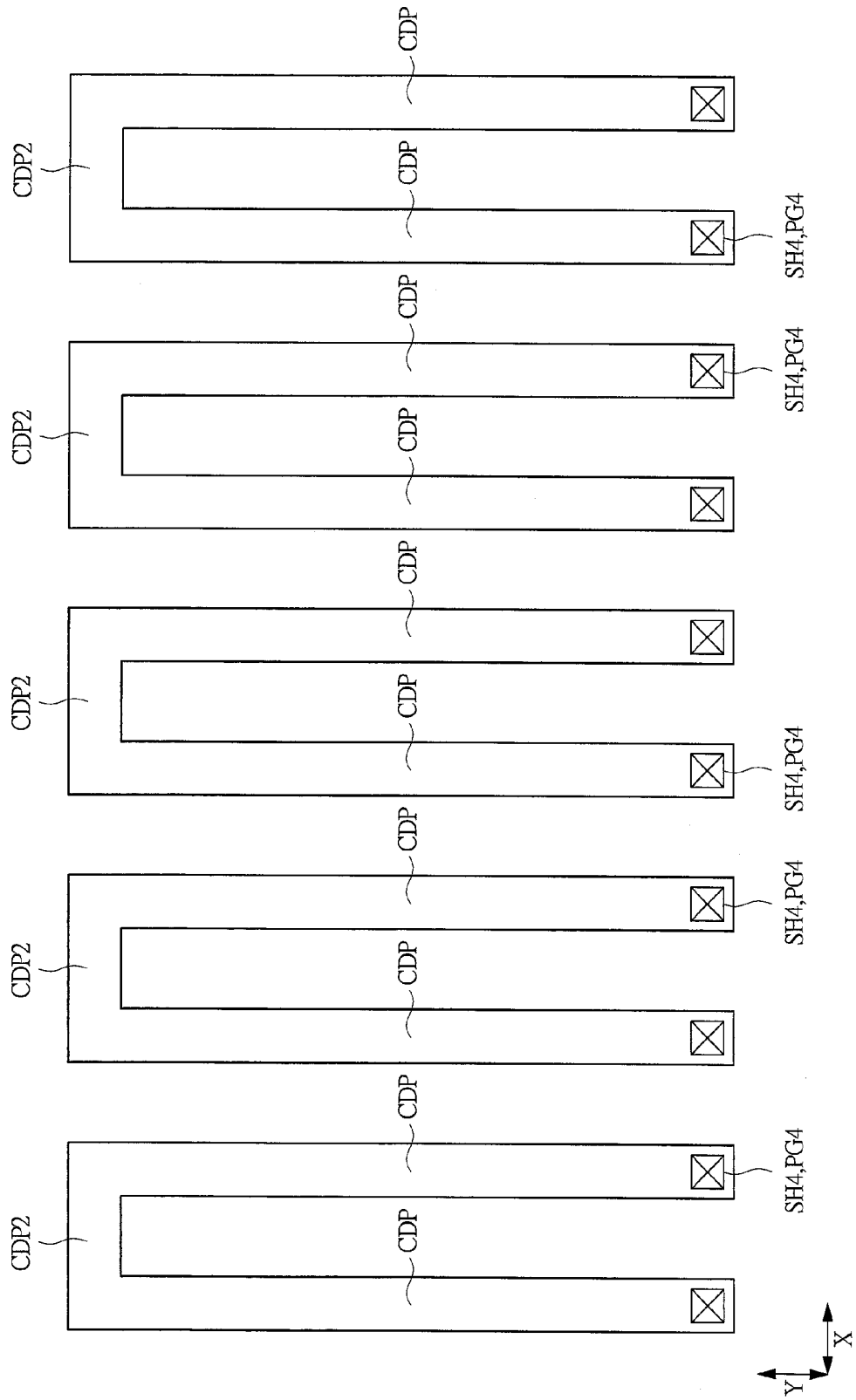
FIG. 39 is a plan view of a principal part of the fourth modification example of the semiconductor chip of another embodiment of the present invention.
Figure 40:
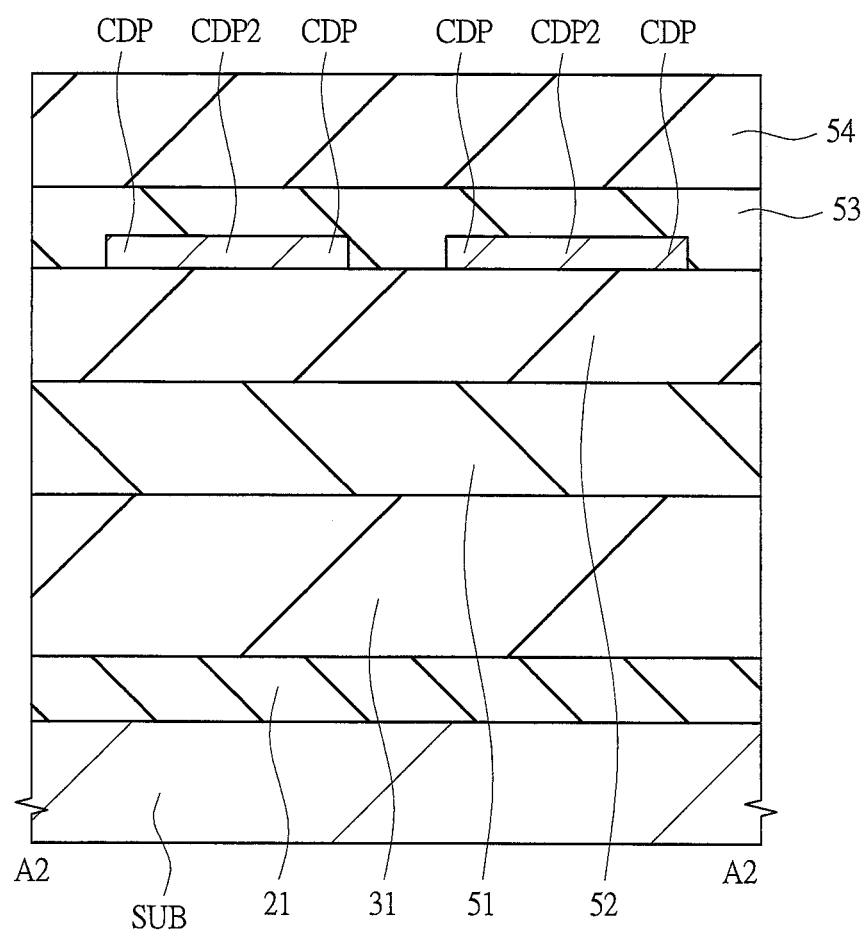
FIG. 40 is a cross-sectional view of a principal part of the fourth modification example of the semiconductor chip of another embodiment of the present invention.
Figure 41:
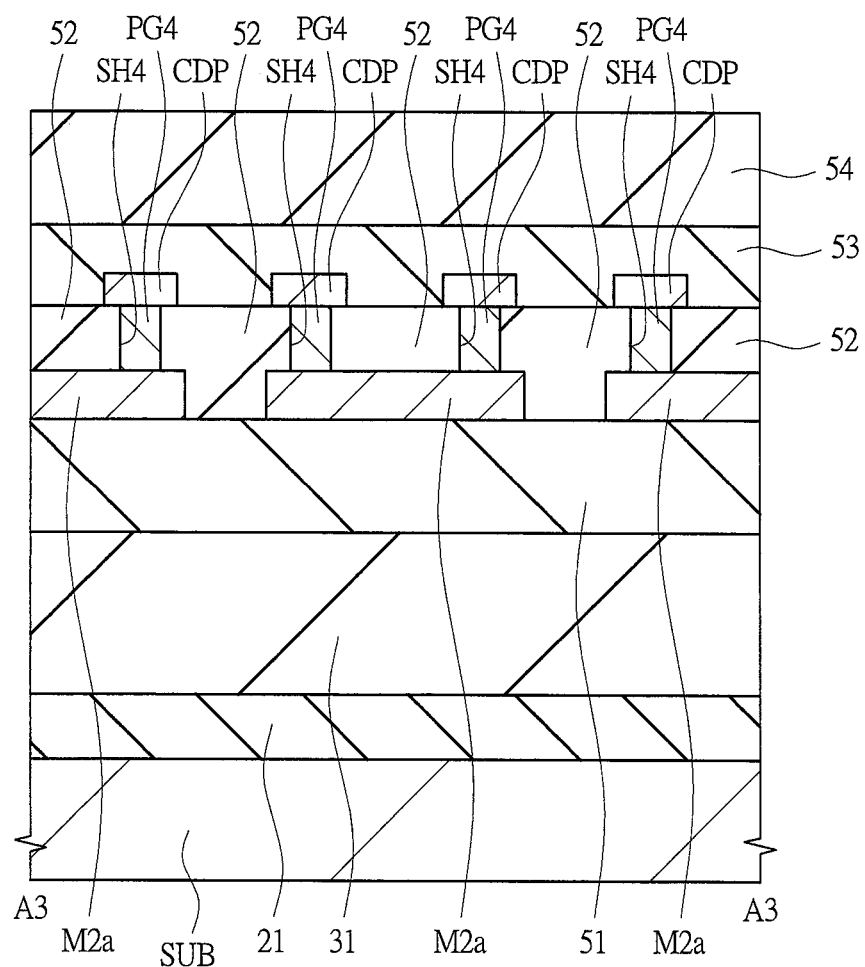
FIG. 41 is a cross-sectional view of a principal part of the fourth modification example of the semiconductor chip of another embodiment of the present invention.

FIGS. 38 and 39 are plan views of principal parts of a semiconductor device (semiconductor chip CP1) of another modification example (fourth modification example) of the present embodiment, and illustrate the same regions as those of FIGS. 32 and 33 described above (the regions corresponding to the above-described reference-resistor formation region 1B). FIG. 38 corresponds to FIG. 32 described above, and illustrates a plan layout of the electrical-conductor pattern CDP, the via hole SH4, the plug PG4, and the wiring M2 so that illustration of other configuration is omitted. Also, FIG. 39 corresponds to FIG. 33 described above, and illustrates a plan layout of the electrical-conductor pattern CDP, the via hole SH4, and the plug PG4 so that illustration of other configuration is omitted. Here, the cases of FIGS. 38 to 41 are referred to as the fourth modification example. Note that the fourth modification example of FIGS. 38 to 41 is obtained by applying the second modification example (FIGS. 27 to 30 described above) explained in the above-described first embodiment to the present embodiment.

The cases of FIGS. 38 to 41 (the fourth modification example) correspond to the combination of the case of FIGS. 32 to 35 described above and the case of FIG. 37 (the third modification example). That is, the plurality of electrical-conductor patterns CDP extending in the Y direction are aligned at predetermined intervals in the X direction so that the cases of FIGS. 38 to 41 (the fourth modification example) are mixture of a case (location) that the electrical-conductor patterns CDP adjacent to each other in the X direction are connected (electrically connected) to each other by the wiring M2a and a case (location) that the electrical-conductor patterns are connected (electrically connected) to each other by the connecting portion CDP2 which is integrally formed with the electrical-conductor patterns CDP (in the same layer as those of the electrical-conductor patterns CDP). A specific connection relation can be read by replacing the contact hole CNT, the plug PG1, and the wiring M1a in the explanation of the above-described second modification example of the above-described first embodiment (FIGS. 27 to 30 described above) with the via hole SH4, the plug PG4, and the wiring M2a, respectively.

The cases of FIGS. 32 to 35 described above, the case of FIG. 37 (the third modification example), and the cases of FIGS. 38 to 41 (the fourth modification example) are common to each other in that the plurality of electrical-conductor patterns CDP extending in the Y direction are aligned at predetermined intervals in the X direction so as to be connected (more specifically, connected in series) to each other to form the reference resistor Rst. However, in the cases of FIGS. 38 to 41 (the fourth modification example), the electrical-conductor patterns CDP extending in the Y direction are connected (electrically connected) in series to each other by the wiring M2a which is the electrical-conductor pattern in the layer different from those of the electrical-conductor patterns CDP, and by the connecting portion CDP2 which is the electrical-conductor pattern in the same layer as those of the electrical-conductor patterns CDP. Also in this case, by developing the arrangement of the reference resistor Rst and the direction (the extending direction of the electrical-conductor patterns CDP) as described above, the variation in the resistance value of the reference resistor Rst due to the stress can be suppressed or prevented.

Further, the metal materials which can be preferably used as the electrical-conductor patterns CDP have been already exemplified above. However, when the metal silicide is used for the electrical-conductor pattern CDP, the metal silicide can be used so that the electrical-conductor pattern CDP of the above-described first embodiment or the present second embodiment has a stacked structure of a polysilicon (polycrystalline silicon) film and a metal silicide film (metal silicide layer) on the polysilicon film. In this case, there is a method of forming the electrical-conductor pattern CDP from a stacked film of a polysilicon film and a metal silicide film thereon by forming the metal silicide film (such as a molybdenum silicide film or a tungsten silicide film) on the polysilicon film, and then, patterning the stacked film of the polysilicon film and the metal silicide film. Also, there is a method of forming the electrical-conductor pattern CDP formed of a stacked film of a polysilicon film and a metal silicide layer (such as titanium silicide, cobalt silicide, nickel silicide, or nickel platinum silicide) thereon by a salicide (Salicide: Self Aligned Silicide) method. The salicide method is a method of forming a metal silicide film (a metal silicide film which is a reactive layer of a polysilicon film with a metal film) on an upper layer portion of the polysilicon film by forming a metal film (a metal film for forming metal silicide) on the polysilicon film, and then, reacting the polysilicon film and the metal film with each other by thermal treatment. Note that, in the usage of the metal silicide for the electrical-conductor pattern CDP, when a Ni-based metal silicide (nickel silicide or nickel platinum silicide) is used, it is preferred to use a metal silicide of a metal mono-silicide phase having an atom ratio of a metal element and Si of 1:1. Still further, in the usage of the metal silicide for the electrical-conductor pattern CDP, when a metal silicide (such as molybdenum silicide, tungsten silicide, titanium silicide, or cobalt silicide) other than the Ni-based metal silicide is used, it is preferred to use a metal silicide of a metal di-silicide phase (such as a phase which can be expressed by $CoSi_2$ in the case of cobalt silicide) having an atom ratio of a metal element and Si of 1:2.

Third Embodiment

Figure 42:
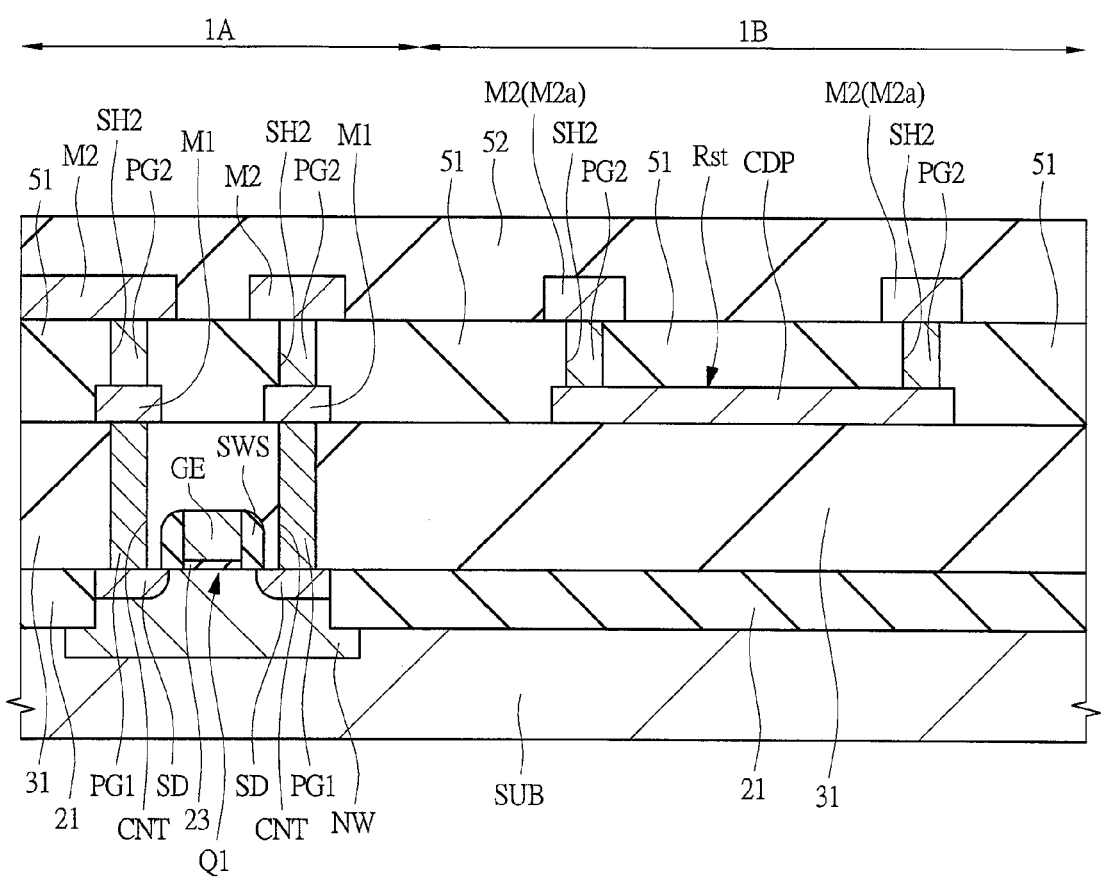
FIG. 42 is a cross-sectional view of a principal part of a semiconductor chip of another embodiment of the present invention.

FIG. 42 is a cross-sectional view of a principal part of a semiconductor chip CP1 of the present embodiment and corresponds to above-described FIG. 31 of the above-described second embodiment.

A main different point between the present third embodiment and the above-described second embodiment is the layer in which the electrical-conductor patterns CDP are formed. That is, in the above-described second embodiment, the multilayer structure having the plurality of wiring layers is formed on the main surface of the semiconductor substrate SUB configuring the semiconductor chip CP1, and the electrical-conductor patterns CDP are provided between one wiring layer and another wiring layer (between layers). However, in the present embodiment, the electrical-conductor patterns CDP are provided in the same layer as any wiring layer (the wiring M1 in the case of FIG. 42) of the multilayer wiring layers. Hereinafter, a different point from the above-described second embodiment is mainly explained.

A lower configuration than the insulating film 31 of FIG. 42 (including the insulating film 31 and the contact hole CNT and the plug PG1 formed in the insulating film 31) is similar to that of the above-described second embodiment, and therefore, explanation thereof is omitted here, and a structure in an upper layer than the insulating film 31 is explained.

As illustrated in FIG. 42, on the insulating film 31 in which the plug PG1 is buried, the wiring (wiring layer, first wiring layer) M1 serving as the first layer wiring and the electrical-conductor pattern CDP are formed. The electrical-conductor pattern CDP is formed in the reference-resistor formation region 1B. The wiring M1 and the electrical-conductor pattern CDP can be formed by forming an electrical-conductor film for both of the wiring M1 and the electrical-conductor pattern CDP on the insulating film 31 in which the plug PG1 is buried, and then, patterning this electrical-conductor film by using a photolithography technique and a dry etching technique. Therefore, the wiring M1 and the electrical-conductor pattern CDP are formed of the patterned electrical-conductor film, are formed in the same layer as each other, and are made of the same material (metal material) as each other.

An insulating film (interlayer insulating film) 51 formed of, for example, a silicon oxide film or others is formed on the insulating film 31 so as to cover the wiring M1, and a wiring (second wiring layer) M2 is formed on the insulating film 51. In FIG. 42, the wiring M2 is illustrated so as to be formed by forming an electrical-conductor film for the wiring M2 on the insulating film 51, and then, patterning this electrical-conductor film by using a photolithography technique and a dry etching technique. Therefore, in FIG. 42, the wiring M2 is formed of the patterned electrical-conductor film such as an aluminum wiring. As another type, the wiring M2 can be a damascene wiring as similar to the above-described first embodiment.

The via hole (opening portion, penetrating-through hole, connecting hole, through hole) SH2 is formed in the insulating film 51 between the wiring M1 and the wiring M2, and the electrically-conductive plug (connecting conductor, electrical-conductor plug) PG2 is formed (buried) inside the via hole SH2. Also, the via hole SH2 penetrating through the insulating film 51 is formed also in the insulating film 51 between the electrical-conductor pattern CDP and the wiring M2 (more specifically, the wiring M2a), and the electrically-conductive plug PG2 is formed (buried) inside the via hole SH2. The plug PG2 can be formed by a method similar to that of the above-described plug PG1. An upper portion of the plug PG2 arranged between the wiring M1 and the wiring M2 is in contact with the wiring M2, a lower portion thereof is in contact with the wiring M1, and the wiring M2 above the plug PG2 and the wiring M1 below the plug PG2 can be electrically connected to each other by this plug PG2. Further, the upper portion of the plug PG2 arranged between the electrical-conductor pattern CDP and the wiring M2 (more specifically, the wiring M2a) is in contact with the wiring M2 (more specifically, the wiring M2a), the lower portion thereof is in contact with the electrical-conductor pattern CDP, and the wiring M2 (more specifically, the wiring M2a) above the plug PG2 and the electrical-conductor pattern CDP below the plug PG2 can be electrically connected to each other by this plug PG2.

On the insulating film 51, the insulating film (interlayer insulating film) 52 formed of, for example, a silicon oxide film or others is formed so as to cover the wiring M2. While a wiring and an insulating film in a further upper layer are formed on the insulating film 52, illustration and explanation thereof are omitted here.

Figure 43:
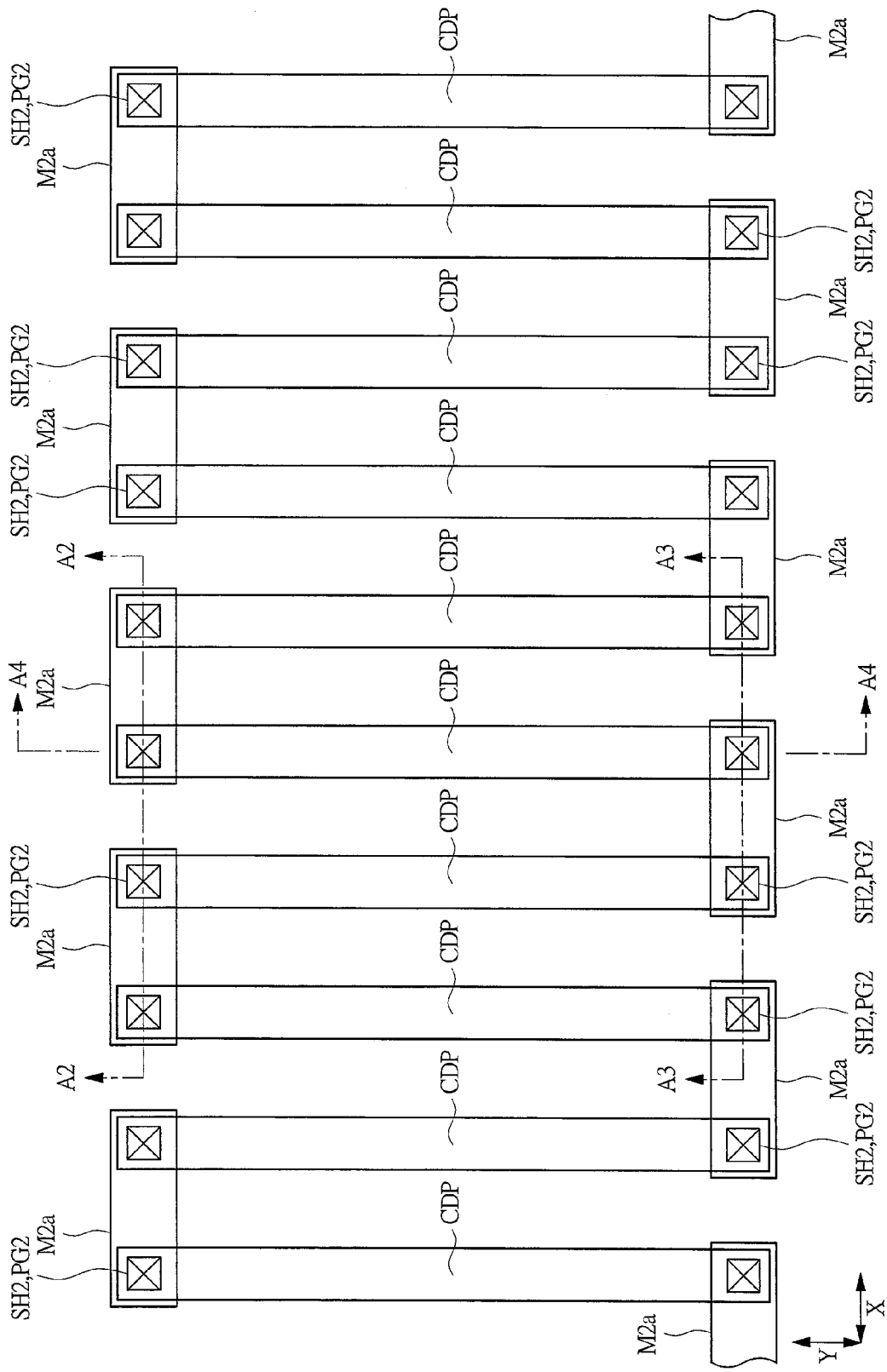
FIG. 43 is a plan view of a principal part of the semiconductor chip of another embodiment of the present invention.
Figure 44:
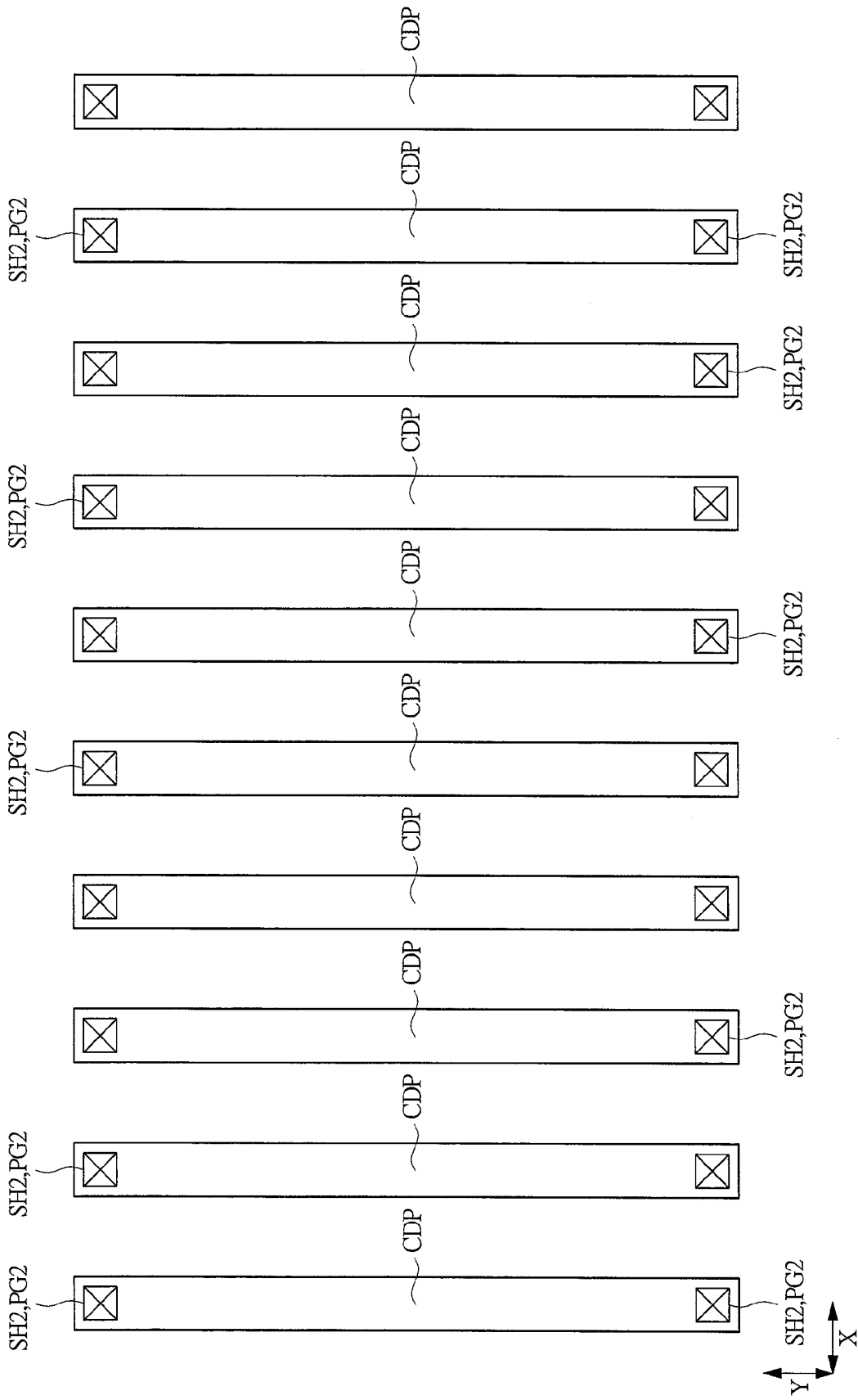
FIG. 44 is a plan view of a principal part of the semiconductor chip of another embodiment of the present invention.
Figure 45:
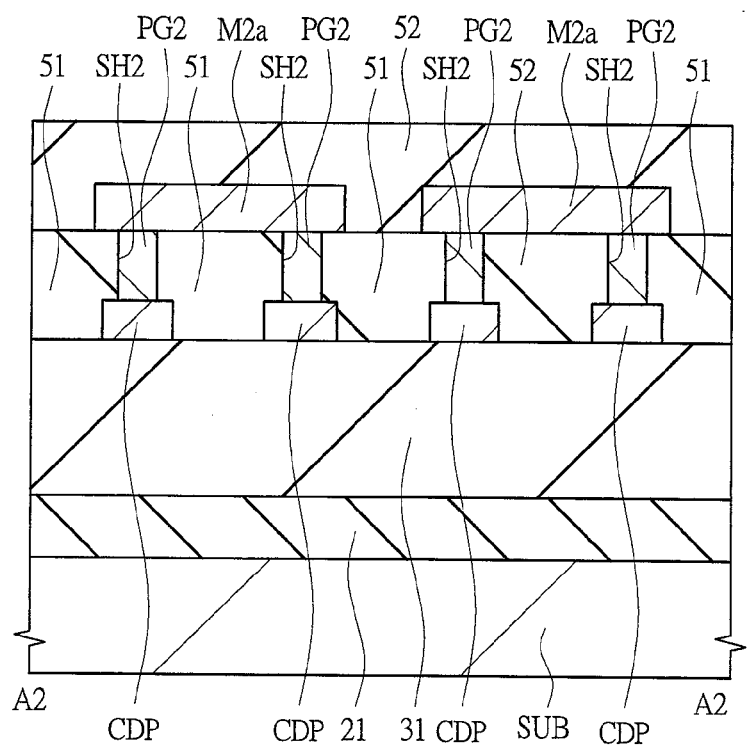
FIG. 45 is a cross-sectional view of a principal part of the semiconductor chip of another embodiment of the present invention.
Figure 46:
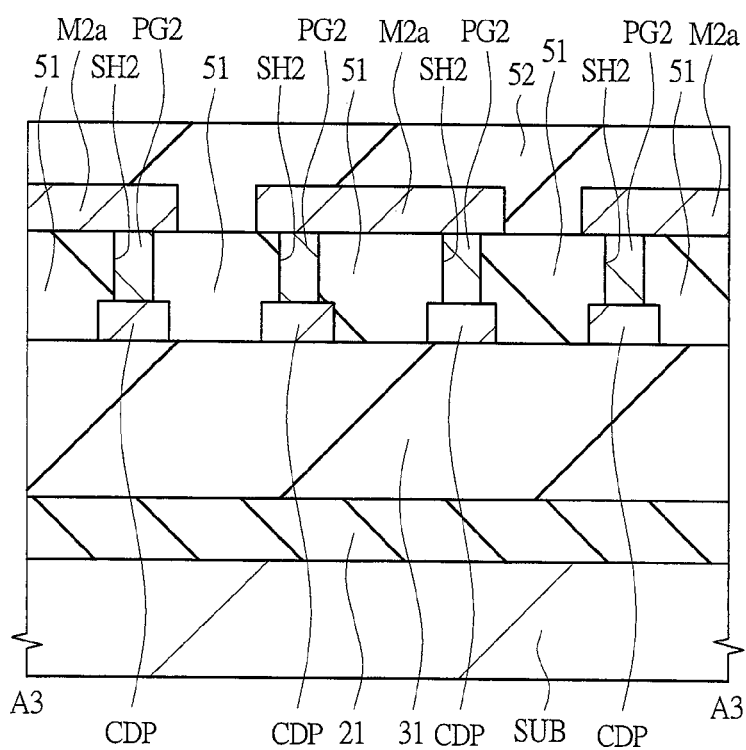
FIG. 46 is a cross-sectional view of a principal part of the semiconductor chip of another embodiment of the present invention.

FIGS. 43 and 44 are plan views of principal parts of the semiconductor chip CP1 of the present embodiment, and illustrate the same region as the reference-resistor formation region 1B. Among them, FIG. 43 corresponds to above-described FIG. 32 of the above-described second embodiment, and illustrates a plan layout of the electrical-conductor pattern CDP, the via hole SH2, the plug PG2, and the wiring M2 so that illustration of other configuration is omitted. FIG. 44 corresponds to above-described FIG. 33 of the above-described second embodiment, and illustrates a plan layout of the electrical-conductor pattern CDP, the via hole SH2, and the plug PG2 so that illustration of other configuration is omitted. Also, FIGS. 45 and 46 are cross-sectional views of principal parts of the semiconductor chip CP1 of the present embodiment, and illustrate cross-sectional views of the reference-resistor formation region 1B. Among them, FIG. 45 corresponds to a cross-sectional surface taken along a line A2-A2 of FIG. 43, and FIG. 46 corresponds to a cross-sectional surface taken along a line A3-A3 of FIG. 43. Note that the cross-sectional view of the reference-resistor formation region 1B illustrated in FIG. 42 described above almost corresponds to a cross-sectional surface taken along a line A4-A4 of FIG. 43.

As seen from comparison between FIG. 43 and FIG. 32 described above and comparison between FIG. 44 and FIG. 33 described above, the planar shapes and positional relations of the electrical-conductor patterns CDP are similar between the above-described second embodiment and the present embodiment. That is, as illustrated in FIGS. 43 and 44, in the reference-resistor formation region 1B, the plurality of (plurality of lines of) electrical-conductor patterns CDP extending in the Y direction are aligned at predetermined intervals (preferably, equal intervals) in the X direction, and the plurality of electrical-conductor patterns CDP are independent patterns from each other.

However, in the above-described second embodiment, the electrical-conductor patterns CDP adjacent to each other in the X direction are connected (electrically connected) to each other by the plug PG4 and the wiring M1a. However, in the present embodiment, as illustrated in FIGS. 43 to 46, the electrical-conductor patterns CDP adjacent to each other in the X direction are connected (electrically connected) to each other by the plug PG2 and the wiring M2a. That is, the plug PG2 connected to the electrical-conductor patterns CDP is used in the present embodiment instead of the plug PG4 connected to the electrical-conductor patterns CDP in the above-described second embodiment. That is, in the present embodiment, the plurality of electrical-conductor patterns CDP extending in the Y direction are connected in series to each other via the plug PG2 buried in the via hole SH2 and the wiring M2a to form the reference resistor Rst.

Except for the formation of the electrical conductor patterns CDP configuring the reference resistor Rst in the same layer as that of the wiring M1, the configuration of the plurality of electrical-conductor patterns CDP configuring the reference resistor Rst is similar to that of the above-described second embodiment, and therefore, repetitive explanation thereof is omitted here. Also, except for the connection (more specifically, series connection) of the plurality of electrical-conductor patterns CDP to each other by the plug PG2 and the wiring M2a instead of the plug PG4 and the wiring M2a, the connection relation of the plurality of electrical-conductor patterns CDP configuring the reference resistor Rst is basically similar between the above-described second embodiment and the present embodiment, and therefore, further explanation thereof is omitted here. A specific connection relation can be read by replacing the via hole SH4 and the plug PG4 in the explanation of the above-described second embodiment (FIGS. 32 to 35 described above) with the via hole SH2 and the plug PG2, respectively.

Also, in the present embodiment, the case that the electrical-conductor patterns CDP are formed in the same layer as that of the wiring M1 has been explained. However, as another type, the electrical-conductor patterns can be provided in the same layer as a wiring layer other than that of the wiring M1.

That is, the present embodiment corresponds to a case that a multilayer wiring structure having a plurality of wiring layers is formed on the main surface of the semiconductor substrate SUB configuring the semiconductor chip CP1 so that the electrical-conductor patterns CDP are provided in the same layer as any wiring layer of the multilayer wiring structure. In the present embodiment, the electrical-conductor patterns CDP are formed in the same layer as that of the wiring, and therefore, a total number of layers (or thickness) of the multilayer wiring structure can be suppressed. Further, the electrical-conductor patterns CDP are formed in the same layer as that of the wiring, and therefore, the electrical-conductor patterns CDP can be formed in the same step as that of the wiring, and the number of steps of manufacturing the semiconductor device can be suppressed.

Still further, also in the present embodiment, as the material of the electrical-conductor patterns CDP, the material (metal material) similar to that of the above-described second embodiment can be used. In this manner, as similar to the above-described second embodiment, the metal film patterns are used as the electrical-conductor patterns CDP configuring the reference resistor Rst also in the present embodiment, so that the variation in the resistance value of the electrical-conductor pattern CDP due to the stress can be suppressed (prevented) further than that of the above-described first embodiment, and therefore, the effect of suppressing (preventing) the variation in the resistance value of the reference resistor Rst due to the stress can be further enhanced.

However, in the present embodiment, since the same electrical-conductor layer is used for the wiring and the electrical-conductor pattern CDP, and therefore, it is preferred to form the electrical-conductor pattern CDP and the wiring (in the case of FIG. 42, the wiring M1) in the same layer thereof by a material (metal material) suitable for both of the wiring and the electrical-conductor pattern CDP. From this point of view, in the present embodiment, it is more preferred to form the electrical-conductor pattern CDP and the wiring (in the case of FIG. 42, the wiring M1) in the same layer as that by the tungsten film so that the electrical-conductor patterns CDP are the tungsten film patterns and the wiring (in the case of FIG. 42, the wiring M1) in the same layer as those of the electrical-conductor patterns CDP is the tungsten wiring. This is because tungsten (W) is preferred as both of the material of the electrical-conductor patterns CDP and the material of the wiring. Still further, the tungsten wiring is applicable easier to the lower-layer wiring than the upper-layer wiring, and therefore, it is further preferred to form the electrical-conductor patterns CDP in the same layer as that of the wiring M1 so that the electrical-conductor patterns CDP and the wiring M1 are formed of the tungsten film as illustrated in FIG. 42 described above.

Still further, when tungsten (W) is used for the electrical-conductor pattern CDP and the wiring (in the case of FIG. 42, the wiring M1) in the same layer as that, a tungsten (W) film has a low adhesion property with respect to an interlayer insulating film, and therefore, it is more preferred to form a titanium nitride (TiN) film as a peel-off preventing film between the tungsten (W) film and the interlayer insulating film. In this case, the electrical-conductor pattern CDP and the wiring (in the case of FIG. 42, the wiring M1) in the same layer as that are formed of a stacked film of the titanium nitride (TiN) film and the tungsten (W) film on the titanium nitride (TiN) film. Also, as the tungsten wiring, the structure of the damascene wiring described in the above-described first embodiment may be used (that is, when tungsten is used for the electrical-conductor pattern CDP and the wiring in the same layer as that, the damascene structure may be used for the electrical-conductor pattern CDP and the wiring in the same layer as that). In this case, the damascene wiring (damascene structure) may be formed by using, for example, a titanium nitride film or a stacked film of a titanium film and a titanium nitride film as an electrically-conductive barrier film, forming a main electrical-conductor film made of tungsten which is formed on the electrically-conductive barrier film so as to fill an inside of the wiring trench, and then, removing the unnecessary main electrical-conductor film and electrically-conductive barrier film by a CMP method.

Still further, also to the present embodiment, the third modification example of the above-described second embodiment (FIG. 37 described above) is applicable. In this case, the electrically-conductive patterns CDP and the connecting portion CDP2 illustrated in FIG. 37 described above are formed in the same layer as any wiring layer (in the case of FIG. 42, the wiring M1) of the multilayer wiring structure.

Still further, also to the present embodiment, the fourth modification example of the above-described second embodiment (FIG. 38 to FIG. 41 described above) is applicable. In this case, the electrical-conductor patterns CDP and the connecting portion CDP2 illustrated in FIGS. 38 to 41 described above are formed in the same layer as any wiring layer (in the case of FIG. 42, the wiring M1) of the multilayer wiring structure.

Fourth Embodiment

In the present embodiment, an arrangement example of the oscillation circuit region OS1 and the reference resistor Rst in the semiconductor chip CP1 is explained.

Figure 47:
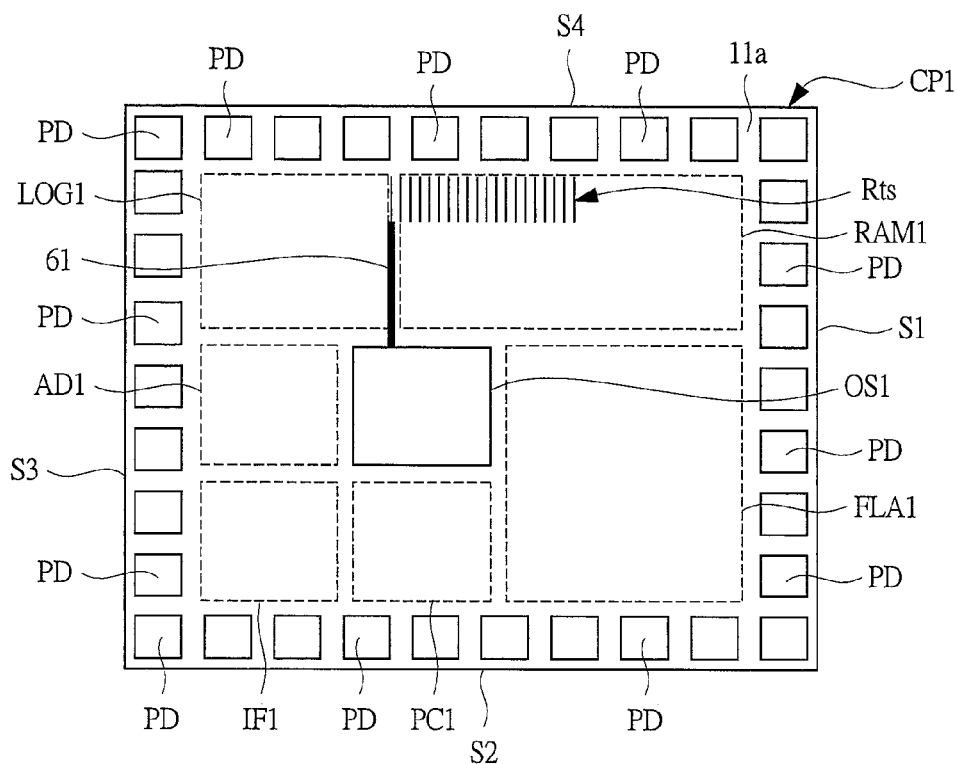
FIG. 47 is a plan layout view of the semiconductor chip of another embodiment of the present invention.

FIG. 47 is a plan layout view of the semiconductor chip (semiconductor device) CP1, corresponds to a view obtained by adding a layout to which a layout of the reference resistor Rst and a wiring (internal wiring) 61 for connecting between the reference resistor Rst and the oscillation circuit region OS1 to FIG. 1 described above, and illustrates an example of the arrangement of the oscillation circuit region OS1 and the reference resistor Rst in the semiconductor chip CP1. The oscillation circuit region OS1 is illustrated by a solid line in both of above-described FIG. 1 and FIG. 49. However, while FIG. 1 described above illustrates the circuit blocks (circuit regions) other than the oscillation circuit region OS1, such as the RAM region RAM1, the logic circuit region LOG1, the flash memory region FLA1, the AD/DA region AD1, the I/F circuit region IF1, and the power-supply circuit region PC1 with using a solid line, FIG. 47 illustrates them by a dotted line in order to easily see the drawing. Also, in FIG. 47, the reference resistor Rst is schematically illustrated as a group of a plurality of linear patterns. However, the plurality of linear patterns configuring the reference resistor Rst in FIG. 47 correspond to the above-described electrical-conductor patterns CDP, respectively.

In FIG. 47, the above-described oscillation circuit OS except for the reference resistor Rst is formed in the oscillation circuit region OS1, and this oscillation circuit region OS1 is arranged in the vicinity of the center of the main surface 11a of the semiconductor chip CP1. On the other hand, the reference resistor Rst is arranged in the above-described region RG7 illustrated in above-described FIG. 25. The reason why the reference resistor Rst is arranged in the above-described region RG7 has already been described in the above-described first embodiment, and therefore, the explanation thereof is omitted here. When the oscillation circuit region OS1 is arranged in the vicinity of the center of the main surface 11a of the semiconductor chip CP1, and besides, when the reference resistor Rst is arranged in the above-described region RG7, the reference resistor Rst is arranged on the main surface 11a of the semiconductor chip CP1 so as to be separated away from the oscillation circuit region OS1. Therefore, the wiring 61 for connecting (electrically connecting) the reference resistor Rst to the above-described oscillation circuit OS inside the oscillation circuit region OS1 is relatively long. Therefore, it is required to set the resistance value of the wiring 61 to be lower than that of the reference resistor Rst in order to prevent an effect of the resistance value of the wiring 61 onto the reference resistor Rst. This setting can be achieved by using a wiring made of a material having the low resistance (a lower resistivity than the resistivity of the electrical-conductor patterns CDP) such as an aluminum wiring or a copper wiring as the wiring 61 or by increasing (thickening) a wiring width of the wiring 61 to be larger than a width (corresponding to the above-described dimension L2) of the wiring (electrical-conductor pattern CDP) of the reference resistor Rst. The wiring 61 is formed of any wiring of the multilayer wiring structure (for example, the multilayer wiring structure including the above-described wiring M1, wiring M2, and wiring M3) formed on the above-described semiconductor substrate SUB.

When the oscillation circuit region OS1 is arranged in the vicinity of the center of the main surface 11a of the semiconductor chip CP1 as illustrated in FIG. 47, distances between the oscillation circuit region OS1 and other circuit blocks (circuit blocks other than the oscillation circuit region OS1 formed in the semiconductor chip CP1) can be easily equalized, and therefore, the oscillation signal generated in the oscillation circuit region OS1 is easily supplied to the other circuit blocks (the circuit blocks other than the oscillation circuit region OS1 formed in the semiconductor chip CP1). Also, reliability of the oscillation signal transmitted from the oscillation circuit region OS1 to the other circuit blocks (the circuit blocks excluding the oscillation circuit region OS1 formed in the semiconductor chip CP1) can be further accurately improved.

Further, as described above, it is preferred to arrange the reference resistor Rst so as to avoid the above-described region RG5 (see FIG. 24 described above). Therefore, as illustrated in FIG. 47, it is preferred to arrange the reference resistor Rst on the main surface 11a of the semiconductor device CP1 so as not to be overlapped with the pad electrode PD (the region where the plurality of pad electrodes are arranged) in a plane.

Figure 48:
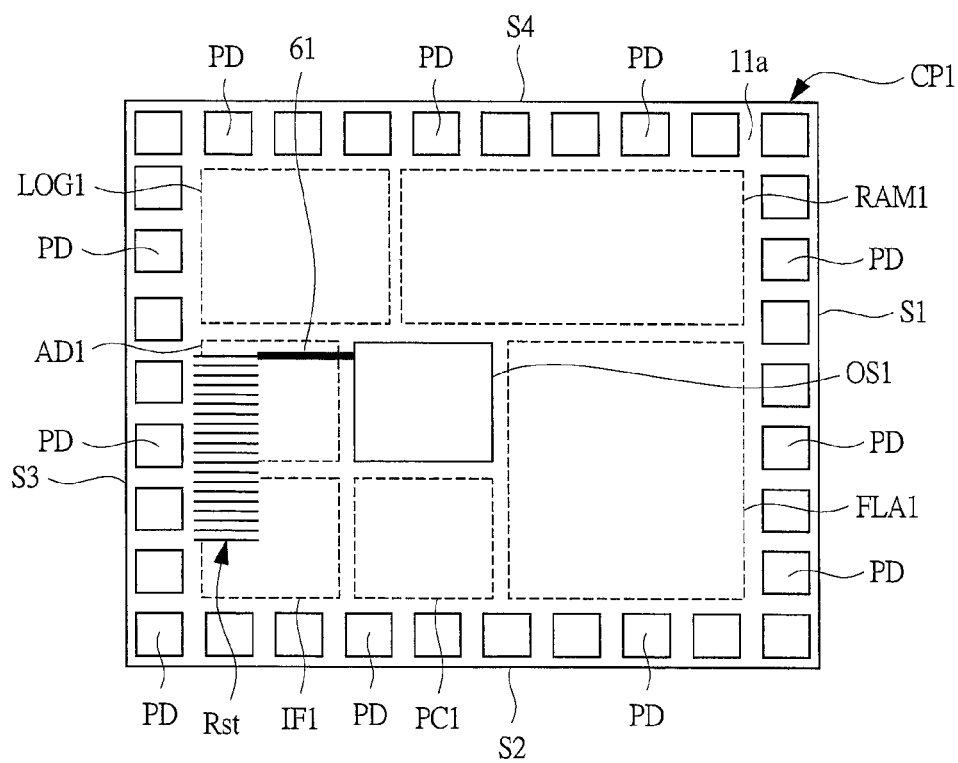
FIG. 48 is a plan layout view of the semiconductor chip of another embodiment of the present invention.

FIG. 48 is a plan layout view of the semiconductor chip (semiconductor device) CP1, which illustrates another example of the arrangement of the oscillation circuit region OS1 and the reference resistor Rst in the semiconductor chip CP1, and corresponds to FIG. 47 described above. While the reference resistor Rst is arranged on a side of the side S4 (the above-described region RG4) in the case of FIG. 47 described above, the reference resistor Rst is arranged on a side of the side S3 (the above-described region RG3) in the case of FIG. 48. Also, the reference resistor Rst can be arranged on a side of the side S2 (the above-described region RG2) or a side of the side S1 (the above-described region RG1).

Figure 49:
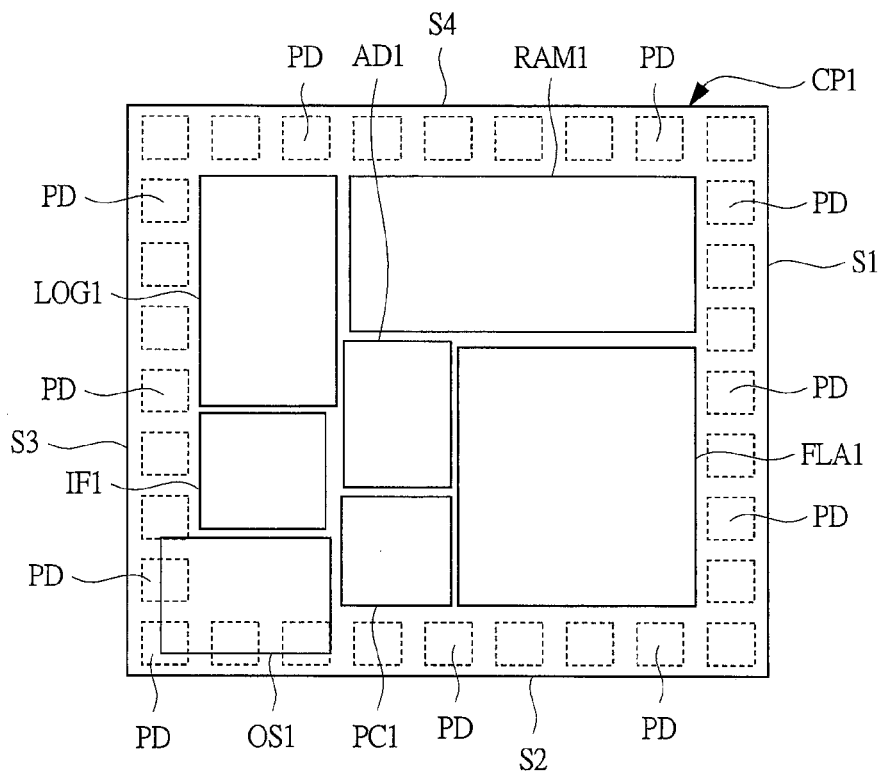
FIG. 49 is a plan layout view of the semiconductor chip of another embodiment of the present invention.
Figure 50:
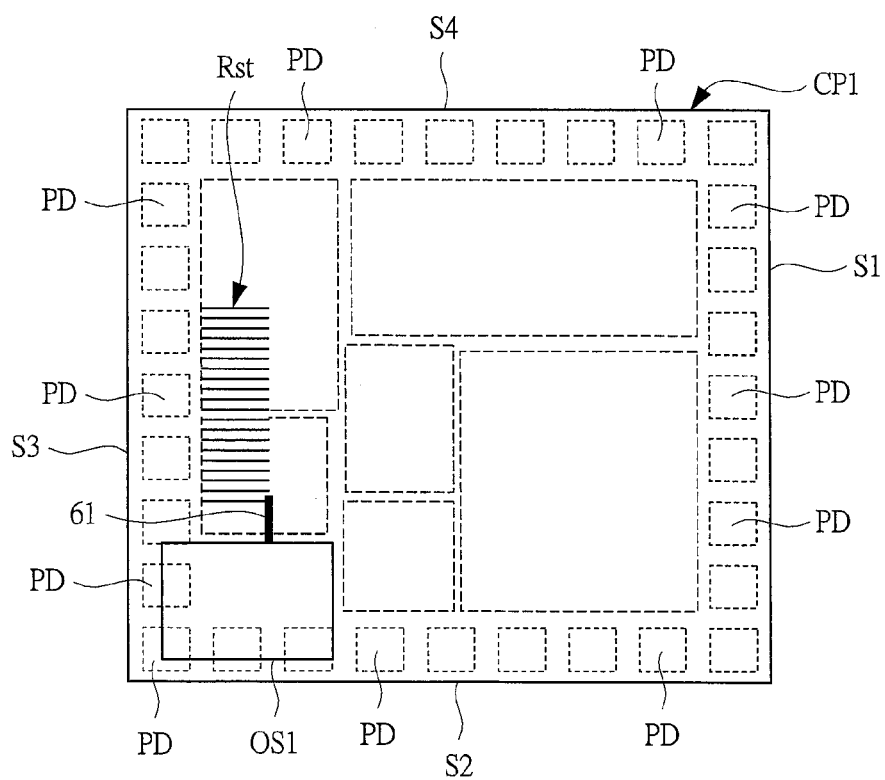
FIG. 50 is a plan layout view of the semiconductor chip of another embodiment of the present invention.

FIGS. 49 and 50 are plan layout views of the semiconductor chip (semiconductor device) CP1, which illustrate still another examples of the arrangement of the oscillation circuit region OS1 and the reference resistor Rst in the semiconductor chip CP1, FIG. 49 corresponds to the above-described first embodiment, and FIG. 50 corresponds to FIG. 47 described above. Therefore, FIG. 50 corresponds to a view obtained by adding layouts of the reference resistor Rst and the wiring (internal wiring) 61 for connecting between the reference resistor Rst and the oscillation circuit region OS1 to FIG. 49.

Also in the cases of FIGS. 49 and 50, the circuit blocks formed in the semiconductor chip CP1 are similar to the above-described cases of FIGS. 1 and 47. For example, the oscillation circuit region OS1, the RAM region RAM1, the logic circuit region LOG1, the flash memory region FLA1, the AD/DA region AD1, the I/F circuit region IF1, the power-supply circuit region PC1, and others are formed therein. However, between the cases of FIGS. 49 and 50 and the above-described cases of FIGS. 1 and 47, an arranging position of each of the circuit blocks is different from each other. That is, while the oscillation circuit region OS1 is arranged in the vicinity of the center of the main surface 11a of the semiconductor chip CP1 in the above-described cases of FIGS. 1 and 47, the oscillation circuit region OS1 is arranged in a periphery of the main surface 11a of the semiconductor chip CP1 in the cases of FIGS. 49 and 50.

Further in the cases of FIGS. 49 and 50, the above-described oscillation circuit OS other than the reference resistor Rst is formed in the oscillation circuit region OS1. This oscillation circuit region OS1 is arranged in the periphery of the main surface 11a of the semiconductor chip CP1. Still further, the plurality of pad electrodes PD are also formed in the periphery of the main surface 11a of the semiconductor chip CP1. Therefore, in the cases of FIG. 49 and FIG. 50, the oscillation circuit region OS1 is arranged at a position overlapped in a plane with at least one or more of the plurality of pad electrodes PD formed in the semiconductor chip CP1. In this manner, a size (area) of the semiconductor chip CP1 can be reduced. Still further, the number of the semiconductor chips CP1, which can be obtained from one semiconductor wafer, can be increased, so that cost reduction can be achieved.

Still further, in the cases of FIGS. 49 and 50, the reference resistor Rst is arranged inner than the periphery of the main surface 11a of the semiconductor chip CP1 in which the plurality of pad electrodes PD are formed (the inner side is assumed as a closer side to the above-described center CT1). That is, the reference resistor Rst is arranged at a position not overlapped in the plane with the plurality of pad electrodes PD formed in the semiconductor chip CP1. This is because it is preferred to arrange the reference resistor Rst so as to avoid the above-described region RG5 (see FIG. 24 described above) as described above.

Still further, in the cases of FIGS. 49 and 50, if the conditions that the oscillation circuit region OS1 is arranged in the periphery of the main surface 11a of the semiconductor chip CP1 (that is, at the position overlapped in the plane with the pad electrodes PD) and that the reference resistor Rst is arranged at the position where it avoids the above-described region RG5 are satisfied, it is preferred to reduce a distance between the oscillation circuit region OS1 and the reference resistor Rst (that is, preferred to arrange the reference resistor Rst to be close to the oscillation circuit region OS1). In this manner, the wiring 61 for connecting (electrically connecting) the reference resistor Rst to the above-described oscillation circuit OS inside the oscillation circuit region OS1 can be shortened.

In the foregoing, the invention made by the present inventors has been concretely described based on the embodiments. However, it is needless to say that the present invention is not limited to the foregoing embodiments and various modifications and alterations can be made within the scope of the present invention.

INDUSTRIAL APPLICABILITY

The present invention is effectively applied to a semiconductor device.

SYMBOL EXPLANATION

1A MISFET formation region
1B reference-resistor formation region
2 voltage-current converting unit
3 voltage generating unit
4 oscillation unit
5 current mirror circuit
7 switch control signal
8 VCO
11a main surface
11b rear surface
12 adhesive
21 element isolation region
21a element isolation trench
23 gate insulating film
24 polycrystalline silicon film
31, 32, 33, and 34 insulating film
51, 52, 53, and 54 insulating film
61 wiring
AD1 AD/DA region
BW bonding wire
C1 capacitor
CDP conductor pattern
CDP2 connecting portion
CNT contact hole
CP1 semiconductor chip
CT1 center
DP die pad
FLA1 flash memory region
GE gate electrode
IF1 I/F circuit region
Iref reference current
LD lead
LOG1 logic circuit region
M1, M1a, M2, M2a, and M3 wiring
MR sealing resin portion
NW n-type well
OP1 and OP2 operation amplifier OS oscillation circuit
OS1 oscillation circuit region
PC1 power-supply circuit region
PD pad electrode
PG1, PG2, PG3, and PG4 plug
PKG semiconductor device
Q1 MISFET
RAM1 RAM region
RG1, RG2, RG3, RG4, RG5, RG6, RG7, and RG8 region
Rst reference resistor
S1, S2, S3, and S4 side
SD p-type semiconductor region
SH2, SH3, and SH4 via hole
SUB semiconductor substrate
SW1, SW2, and SW3 switch
SWS side-wall spacer
Va reference voltage
Vb voltage
Vc voltage
Vref reference voltage

The invention claimed is:

1. A semiconductor device provided with a semiconductor chip sealed with a resin,
the semiconductor chip having an oscillation circuit,
the oscillation circuit having:
a voltage-current converting unit which converts a voltage into a current by utilizing a reference resistor;
a voltage generating unit which generates a voltage in accordance with an input current from the voltage-current converting unit and an oscillation frequency of an oscillation unit; and
the oscillation unit which oscillates at a frequency in accordance with an input voltage from the voltage generating unit, and
in the voltage-current converting unit, a reference current being generated by applying a reference voltage to the reference resistor, and a current in accordance with the reference current being inputted to the voltage generating unit as the input current,
wherein, on a main surface of the semiconductor chip, the reference resistor is formed by connecting a plurality of resistors in series with each other inside a first region surrounded by a first line, a second line, and a first side of the main surface of the semiconductor chip, the first line connecting between one end of the first side and a center of the main surface of the semiconductor chip, and the second line connecting between the other end of the first side and the center of the main surface of the semiconductor chip,
wherein each of the plurality of resistors has a length in a first direction orthogonal to the first side that is greater than a respective width thereof in a second direction orthogonal to the first direction, and
wherein the reference resistor is formed at a position that is at least 0.1 mm away from the first side in the first region and is arranged closer to the first side than a third line connecting a center of the first line and a center of the second line in the first region.

2. The semiconductor device according to claim 1,
wherein each of the plurality of resistors is formed of a first conductor pattern extending in the first direction.

3. The semiconductor device according to claim 2,
wherein the plurality of resistors are connected in series to each other by a second conductor pattern in the same layer as or a different layer from a layer of the first conductor pattern, the second conductor pattern extending in the second direction.

4. The semiconductor device according to claim 3,
wherein the second direction is a direction parallel to the first side.

5. The semiconductor device according to claim 4,
wherein the plurality of resistors are arranged so as to be aligned with respect to each other as viewed in the second direction.

6. The semiconductor device according to claim 2,
wherein the first conductor pattern is made of metal.

7. The semiconductor device according to claim 6, wherein the first conductor pattern is made of metal with a high melting point.

8. The semiconductor device according to claim 7, wherein the first conductor pattern is made of tungsten, titanium nitride, or tantalum nitride.

9. The semiconductor device according to claim 2, wherein the first conductor pattern is made of polycrystalline silicon.

10. The semiconductor device according to claim 1, wherein an oscillation-circuit formation region, where the oscillation circuit other than the reference resistor is formed, is arranged in vicinity of a center of the main surface of the semiconductor chip.

11. The semiconductor device according to claim 10, wherein the reference resistor is arranged away from the oscillation-circuit formation region on the main surface of the semiconductor chip.

12. The semiconductor device according to claim 1, wherein a plurality of pad electrodes are formed in periphery of the main surface of the semiconductor chip, and an oscillation-circuit formation region, where the oscillation circuit other than the reference resistor is formed, is arranged at a position overlapping with at least one or more of the plurality of pad electrodes in a plan view.

13. The semiconductor device according to claim 1, wherein the reference resistor is arranged inward from a periphery of the main surface of the semiconductor chip where a plurality of pad electrodes are formed.

14. A semiconductor device comprising:
a semiconductor chip having an oscillation circuit, the oscillation circuit comprising:
   a voltage-current converting unit that converts a reference voltage into an input current using a reference resistor;
   a voltage generating unit that generates an input voltage based on at least the input current; and
   an oscillation unit that oscillates at a frequency based on the input voltage; and
a resin that seals the semiconductor chip,
wherein the reference resistor comprises a plurality of elongated resistor elements connected together in series,
each of the resistor elements is disposed in a region of the semiconductor chip bounded by a first line, a second line, and an edge of the semiconductor chip,
each of the first and second lines connect a respective end of said edge of the semiconductor chip to a center of the semiconductor chip,
each of the resistor elements is elongated in a first direction perpendicular to said edge of the semiconductor chip,
each of the resistor elements is disposed at least 0.1 mm from said edge of the semiconductor chip, and
each of the resistor elements is disposed closer to said edge of the semiconductor chip than a third line that connects a center of the first line to a center of the second line.

15. The semiconductor device of claim 14, wherein the oscillation unit provides a feedback signal based on the frequency to the voltage generating unit, and the voltage generating unit adjusts the input voltage based on the feedback signal and the input current.

16. The semiconductor device of claim 14, wherein the voltage-current converting unit generates a reference current by applying the reference voltage to the reference resistor, and the input current is a multiple of the reference current.

* * * * *